(12) United States Patent
Ye et al.

(10) Patent No.: US 10,470,345 B2
(45) Date of Patent: Nov. 5, 2019

(54) ELECTRONIC DEVICE INCLUDING SHIELD STRUCTURE

(71) Applicant: SAMSUNG ELECTRONICS CO., LTD., Suwon-si, Gyeonggi-do (KR)

(72) Inventors: Jae-Heung Ye, Suwon-si (KR); Jung-Je Bang, Suwon-si (KR); Jeong-Ung Kim, Suwon-si (KR); Ki-Youn Jang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/377,012

(22) Filed: Dec. 13, 2016

(65) Prior Publication Data
US 2017/0172020 A1      Jun. 15, 2017

(30) Foreign Application Priority Data
Dec. 15, 2015   (KR) .................. 10-2015-0179564

(51) Int. Cl.
*H05K 9/00*           (2006.01)
(52) U.S. Cl.
CPC ......... *H05K 9/0081* (2013.01); *H05K 9/0024* (2013.01); *H05K 9/0033* (2013.01); *H05K 9/0084* (2013.01); *H05K 2201/10371* (2013.01)
(58) Field of Classification Search
CPC .. H05K 9/0081; H05K 9/0024; H05K 9/0033; H05K 9/0084; H05K 2201/10371
(Continued)

(56) References Cited

U.S. PATENT DOCUMENTS 5,676,812 A * 10/1997 Kadokura .............. C25D 13/12
                                                                174/350
5,880,403 A *  3/1999 Czajkowski .......... H01L 23/055
                                                                174/387
(Continued)

FOREIGN PATENT DOCUMENTS

CN             1195265 A        10/1998
CN             1658747 A         8/2005
(Continued)

OTHER PUBLICATIONS

Search Report and Written Opinion dated Mar. 10, 2017 in counterpart International Patent Application No. PCT/KR2016/014677.
(Continued)

*Primary Examiner* — Hung S. Bui
(74) *Attorney, Agent, or Firm* — Nixon & Vanderhye P.C.

(57) ABSTRACT

Disclosed are various embodiments relating to an electronic device that includes a shield structure. According to an example embodiment, the electronic device may include: a housing that includes a first surface directed in a first direction and a second surface directed in a second direction that is opposite to the first direction; a printed circuit board included in the housing, wherein the printed circuit board includes a first surface directed in the first direction and a second surface directed in the second direction; at least one electronic component disposed on the first surface of the printed circuit board; and at least one shield structure configured to electro-magnetically shield the at least one electronic component, and the shield structure may include: a flexible sheet that includes a first sheet that covers the at least one electronic component and a second sheet that at least partially covers the space between the first sheet and the first surface of the printed circuit board, when viewed from above the first surface of the printed circuit board; and
(Continued)

at least one frame structure that supports the first and second sheets.

19 Claims, 37 Drawing Sheets

(58) Field of Classification Search
USPC .......................................... 361/816, 818, 799
See application file for complete search history.

(56) References Cited

U.S. PATENT DOCUMENTS

| | | | |
|---|---|---|---|
| 6,501,016 B1 | 12/2002 | Sosnowski | |
| 6,674,652 B2* | 1/2004 | Forte | H05K 5/0269 |
| | | | 174/363 |
| 7,880,096 B2* | 2/2011 | Lei | H05K 9/0032 |
| | | | 174/382 |
| 8,102,661 B2* | 1/2012 | Nakao | H04M 1/0277 |
| | | | 361/730 |
| 8,766,429 B2 | 7/2014 | Kim | |
| 8,879,269 B2* | 11/2014 | Hill | H05K 9/0032 |
| | | | 361/719 |
| 9,059,514 B2* | 6/2015 | Sanford | H01Q 1/243 |
| 2005/0162841 A1* | 7/2005 | Ogatsu | H05K 3/284 |
| | | | 361/816 |
| 2005/0162842 A1 | 7/2005 | Muramatsu et al. | |
| 2008/0302687 A1* | 12/2008 | Sirichai | A45F 5/02 |
| | | | 206/320 |
| 2009/0283319 A1 | 11/2009 | Hsieh | |
| 2011/0013368 A1* | 1/2011 | Nagaike | H05K 3/284 |
| | | | 361/728 |
| 2014/0071634 A1 | 3/2014 | Pakula et al. | |
| 2015/0282387 A1 | 10/2015 | Yoo et al. | |
| 2016/0057897 A1* | 2/2016 | Malek | H05K 9/0024 |
| | | | 361/752 |
| 2017/0142823 A1* | 5/2017 | Shim | H04M 1/0277 |
| 2017/0318713 A1* | 11/2017 | Bang | H05K 9/0083 |

FOREIGN PATENT DOCUMENTS

| | | |
|---|---|---|
| CN | 101588709 A | 11/2009 |
| FR | 2 994 369 | 2/2014 |
| JP | H08-008571 | 1/1996 |
| JP | 2004-311642 | 11/2004 |
| JP | 2008-028342 | 2/2008 |
| JP | 2009-199816 | 9/2009 |
| KR | 10-1381114 | 3/2014 |
| WO | 2008/005591 | 1/2008 |
| WO | 2010/093100 | 8/2010 |

OTHER PUBLICATIONS

Extended Search Report dated May 4, 2017 in counterpart European Application No. 16204189.1.
CN Office Action dated Jun. 24, 2019 for CN Application No. 201611164099.4.

* cited by examiner

ELECTRONIC DEVICE INCLUDING SHIELD STRUCTURE

CROSS-REFERENCE TO RELATED APPLICATION

This application is based on and claims priority under 35 U.S.C. § 119 to Korean Application Serial No. 10-2015-0179564, which was filed in the Korean Intellectual Property Office on Dec. 15, 2015, the disclosure of which is incorporated by reference herein in its entirety.

TECHNICAL FIELD

The present disclosure relates generally to a shield structure used for an electronic device.

BACKGROUND

An electronic device is equipped with a printed circuit board, which is one of the key components thereof, and various types of components mounted on the printed circuit board. These circuit components are sensitive to Electro-Magnetic Interference (EMI) caused by interference sources inside or outside the electronic device so that the electronic device is likely to malfunction on account of electro-magnetic waves.

The electro-magnetic waves may refer, for example, to a phenomenon in which energy moves in a sinusoidal form while an electric field and a magnetic field operate in conjunction with each other. The electro-magnetic waves are useful for electronic devices, such as wireless communication devices, radars, etc., whereas the electro-magnetic waves may not only cause malfunctions of electronic and communication devices, but may also have harmful effects on human bodies. The electric field is generated by a voltage. The electric field is inversely proportional to distance and is easily shielded by obstacles (such as wood, etc.). In contrast, the magnetic field is generated by a current, but is not easily shielded although the magnetic field is inversely proportional to distance.

A shield can covers electronic components mounted on a printed circuit board within an electronic device to shield Electro-Magnetic Interference (EMI) generated from interference sources, thereby preventing and/or reducing the EMI from affecting the electronic device and other electronic devices adjacent thereto. However, since the shield can is assembled by welding a separately manufactured finger part on a side wall of the shield can, the part costs may be high, and due to the side wall of the shield can, there may be a limitation in mounting components in the electronic device, and the mounting space may increase.

Furthermore, it may be difficult to manage the parts, and the process of welding the finger part on the shield part may be cumbersome. In addition, the manufacturing cost may increase, and the productivity may be degraded on account of a high failure rate of working.

SUMMARY

Accordingly, various example embodiments of the present disclosure provide a shield structure that surrounds a frame structure for electro-magnetically shielding electronic components of an electronic device and a side surface of a printed circuit board.

According to various example embodiments, an electronic device may include: a housing that includes a first surface directed in a first direction and a second surface directed in a second direction that is opposite to the first direction; a printed circuit board included in the housing, wherein the printed circuit board includes a first surface directed in the first direction and a second surface directed in the second direction; at least one electronic component disposed on each of the first and second surfaces of the printed circuit board; and a shield structure configured to electro-magnetically shield the at least one electronic component, and the shield structure may include: a flexible sheet that includes a first sheet that covers the at least one electronic component and a second sheet that at least partially surrounds a space between the first sheet and the first and second surfaces of the printed circuit board, when viewed from above the first surface of the printed circuit board; and at least one frame structure that supports the first and second sheets.

According to the various example embodiments of the present disclosure, the shield structure is configured to surround or cover a side surface of the printed circuit board and parts of the frame structures in which the electronic components of the electronic device are embedded, thereby reducing the mounting space for the electronic components and thus making the electronic device smaller and slimmer.

According to the various example embodiments of the present disclosure, it is possible to eliminate the need for a finger part (not illustrated) that is welded on a side wall of a frame structure (e.g., a shield can), thereby reducing the manufacturing cost.

BRIEF DESCRIPTION OF THE DRAWINGS

The above and other aspects, features, and advantages of the present disclosure will be more apparent from the following detailed description, taken in conjunction with the accompanying drawings, in which like reference numerals refer to like elements, and wherein.

DETAILED DESCRIPTION

Figure 1:
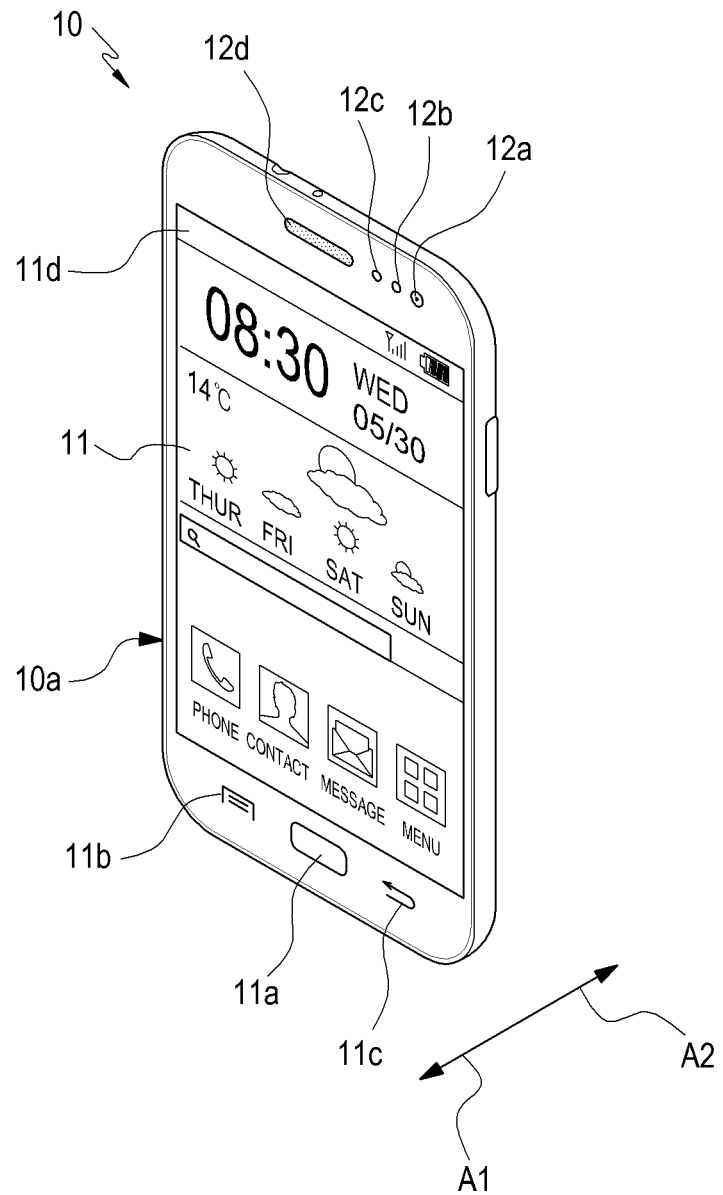
FIG. 1 is a front perspective view illustrating an example electronic device according to various example embodiments of the present disclosure.

Hereinafter, various example embodiments of the present disclosure will be described with reference to the accompanying drawings. However, it should be understood that there is no intent to limit the present disclosure to the particular forms of the various example embodiments disclosed herein; rather, the present disclosure should be construed to cover various modifications, equivalents, and/or alternatives of embodiments of the present disclosure. In describing the drawings, similar reference numerals may be used to designate similar constituent elements.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various example embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. On the other hand, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may refer, for example, to a situation in which the device, together with other devices or components, "is able to". For example, the phrase "processor adapted (or configured) to perform A, B, and C" may refer, for example, to a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing various example embodiments and are not intended to limit the scope of other embodiments. A singular expression may include a plural expression unless they are definitely different in a context. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure may not be interpreted to exclude embodiments of the present disclosure.

An electronic device according to various example embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device, or the like, but is not limited thereto. According to various example embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit), or the like, but is not limited thereto.

According to some example embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame, or the like, but is not limited thereto.

According to another example embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.), or the like, but is not limited thereto.

According to some example embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter), or the like, but is not limited thereto. In various example embodiments, the electronic device may be a combination of one or more of the aforementioned various devices. According to some example embodiments, the electronic device may also be a flexible device. Further, the electronic device according to an example embodiment of the present disclosure is not limited to the aforementioned devices, and may include a new electronic device according to the development of technology.

Hereinafter, an electronic device according to various example embodiments will be described in greater detail with reference to the accompanying drawings. In the present disclosure, the term "user" may indicate a person using an electronic device or a device (e.g., an artificial intelligence electronic device) using an electronic device.

Figure 2:
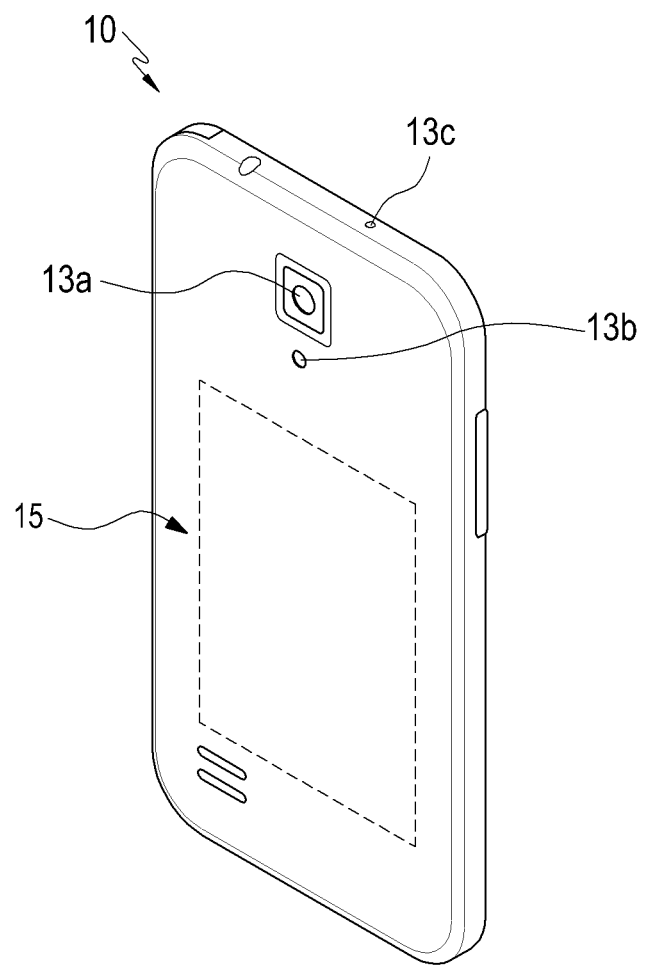
FIG. 2 is a rear perspective view illustrating an example electronic device according to the various example embodiments of the present disclosure.

FIG. 1 is a front perspective view of an example electronic device according to various example embodiments of the present disclosure. FIG. 2 is a rear perspective view of the example electronic device according to the various example embodiments of the present disclosure. The electronic device 10 may, for example, and without limitation, be a smart phone or a wearable device. Hereinafter, constituent components of the electronic device, such as a smart phone, will be described with reference to FIGS. 1 and 2.

As illustrated in FIG. 1, the electronic device 10 may have a touch screen 11 disposed in the center of the front surface thereof. The touch screen 11 may cover most of the front surface of the electronic device 10. FIG. 1 illustrates an example in which the main home screen is displayed on the touch screen 11. The main home screen is the first screen displayed on the touch screen 11 when the electronic device 10 is turned on. In another example embodiment, when the electronic device 10 has several pages of different home screens, the main home screen may be the first of the several pages of home screens. Short-cut icons for executing frequently used applications, a main menu switching key, time, weather, and the like may be displayed on the home screen. The main menu switching key may be used to display a menu screen on the touch screen 11. In another example embodiment, a status bar 11*d* for displaying statuses, such as a battery charging status, the strength of a received signal, and the current time, may be formed on the upper side of the touch screen 11. A home key 11*a*, a menu button 11*b*, and a back button 11*c* may be formed on the lower side of the touch screen 11.

The home key 11*a* may be used to display the main home screen on the touch screen 11. For example, when the home key 11*a* is touched while any home screen different from the main home screen, or the menu screen, is displayed, the main home screen may be displayed on the touch screen 11. In another example embodiment, when the home key 11*a* is touched while applications are being executed on the touch screen 11, the main home screen may be displayed on the touch screen 11. In yet another example embodiment, the home key 11*a* may also be used to display recently used applications or a task manager on the touch screen 11. The menu button 11*b* may be used to provide a connectivity menu that may be used on the touch screen 11. The connectivity menu may include a widget addition menu, a background image switching menu, a search menu, an editing menu, an environment setting menu, etc. The back button 11*c* may be used to display the screen executed just before the currently executed screen, or may be used to end the most recently used application.

According to various example embodiments of the present disclosure, the electronic device 10 may include a first camera 12*a*, an illuminance sensor 12*b*, a proximity sensor 12*c*, and/or a speaker 12*d* on the upper front side thereof, as illustrated in FIG. 1 mentioned above.

As illustrated in FIG. 2, the electronic device 10 may include a second camera 13*a*, a flash 13*b*, or a speaker 13*c* on the rear surface thereof. If the electronic device 10 is configured such that a battery pack is detachable, the rear surface of the electronic device 10 may be a detachable battery cover 15.

The electronic device 10 within a network environment 100, according to various example embodiments, will be described with reference to FIG. 3. The electronic device 10 may include a bus 110, a processor 120, a memory 130, an input/output interface (e.g., including input/output interface circuitry) 150, a display 160, and a communication module (e.g., including communication circuitry) 170. In some example embodiments, the electronic device 10 may omit at least one of the elements, or may further include other elements.

The bus 110 may include, for example, a circuit that connects the elements 110 to 170 with each other and transmits communication (e.g., control messages and/or data) between the elements.

The processor 120 may include one or more of a Central Processing Unit (CPU), an Application Processor (AP), and a Communication Processor (CP). The processor 120 may, for example, carry out operations or data processing relating to the control and/or communication of at least one other element of the electronic device 10.

The memory 130 may include a volatile and/or non-volatile memory. The memory 130 may store, for example, commands or data relating to at least one other element of the electronic device 10. According to an embodiment, the memory 130 may store software and/or a program 140. The program 140 may include, for example, a kernel 141, middleware 143, an Application Programming Interface (API) 145, and/or application programs (or "applications") 147. At least some of the kernel 141, the middleware 143, and the API 145 may be referred to as an Operating System (OS).

The kernel 141 may, for example, control or manage system resources (e.g., the bus 110, the processor 120, the memory 130, etc.) that are used to execute operations or functions implemented in the other programs (e.g., the middleware 143, the API 145, and the application programs 147). In another embodiment, the kernel 141 may provide an interface by which the middleware 143, the API 145, or the application programs 147 may access the individual elements of the electronic device 10 to control or manage the system resources.

The middleware 143 may function as, for example, an intermediary for allowing the API 145 or the application programs 147 to communicate with the kernel 141 to exchange data therewith.

Furthermore, the middleware 143 may process one or more task requests, which are received from the application programs 147, according to the priorities thereof. For example, the middleware 143 may assign priorities for using the system resources (e.g., the bus 110, the processor 120, the memory 130, etc.) of the electronic device 10 to one or more of the application programs 147. For example, the middleware 143A may perform scheduling or load balancing on the one or more task requests by processing the one or more task requests according to the priorities assigned to the one or more application programs.

The API 145 may be, for example, an interface by which the applications 147 control functions provided from the kernel 141 or the middleware 143, and may include, for example, at least one interface or function (e.g., command) for file control, window control, image processing, text control, etc.

The input/output interface 150 may include various input/output interface circuitry that function as, for example, an interface that may forward commands or data, which are input from a user or a different external device, to the other element(s) of the electronic device 10. In another example embodiment, the input/output interface 150 may output commands or data, which are received from the other element(s) of the electronic device 10, to the user or the different external device.

Examples of the display 160 may include, for example, a Liquid Crystal Display (LCD), a Light-Emitting Diode (LED) display, an Organic Light-Emitting Diode (OLED) display, a MicroElectroMechanical Systems (MEMS) display, and an electronic paper display, or the like, but is not limited thereto. The display 160 may display, for example, various types of content (e.g., text, images, videos, icons, symbols, etc.) for a user. The display 160 may include a touch screen and may receive, for example, a touch, gesture, proximity, or hovering input using an electronic pen or a part of a user's body.

The communication module 170 may, for example, include various communication circuitry configured to provide communication between the electronic device 10 and an external device (e.g., a first external electronic device 102, a second external electronic device 104, or a server 106). For example, the communication module 170 may be connected to a network 162 through wireless or wired communication to communicate with the external device (e.g., the second external electronic device 104 or the server 106).

The wireless communication may use, for example, at least one of Long Term Evolution (LTE), LTE-Advance (LTE-A), Code Division Multiple Access (CDMA), Wideband CDMA (WCDMA), Universal Mobile Telecommunications System (UNITS), WiBro (Wireless Broadband), Global System for Mobile Communications (GSM), and the like as a cellular communication protocol. In another embodiment, the wireless communication may include, for example, short range communication 164. The short range communication 164 may include, for example, at least one of WiFi, Bluetooth, Near Field Communication (NFC), Global Navigation Satellite System (GNSS), etc. The GNSS may include, for example, at least one of a Global Positioning System (GPS), a Global Navigation Satellite System (Glonass), a Beidou Navigation Satellite System (hereinafter referred to as "Beidou"), and a European Global Satellite-based Navigation System (Galileo) according to a service area, a bandwidth, or the like. Hereinafter, the "GPS" may be interchangeably used with the "GNSS" in the present disclosure. The wired communication may include, for example, at least one of a Universal Serial Bus (USB), a High Definition Multimedia Interface (HDMI), Recommended Standard 232 (RS-232), a Plain Old Telephone Service (POTS), etc. The network 162 may include a telecommunication network, which may be, for example, at least one of a communication network (e.g., LAN or WAN), the Internet, and a telephone network.

Each of the first and second external electronic devices 102 and 104 may be a device that is the same as, or different from, the electronic device 10. According to an example embodiment, the server 106 may include a group of one or more servers. According to various example embodiments, all or some of the operations executed in the electronic device 10 may be executed in another or multiple electronic devices (e.g., the electronic devices 102 and 104 or the server 106). According to an example embodiment, when the electronic device has to perform some functions or services automatically or in response to a request, the electronic device 10 may request another device (e.g., the electronic device 102 or 104 or the server 106) to perform at least some functions relating thereto instead of, or in addition to, performing the functions or services by itself. The other electronic device (e.g., the electronic device 102 or 104 or the server 106) may perform the requested functions or the additional functions and may transfer the execution result to the electronic device 10. The electronic device may provide the requested functions or services by processing the received result as it is or additionally. To this end, for example, a cloud computing, distributed computing, or client-server computing technology may be used.

According to various example embodiments of the present disclosure, a controller provided in the electronic device may include the processor 120 and the memory 130 for storing information required by the processor 120. The controller, as a central processing device, may control the overall operations of the electronic device 10, and may perform an operation of supplying electric power to an antenna for wireless communication as will be described below according to an embodiment of the present disclosure.

In another example embodiment, the electronic device 10 may have a housing 10a that includes a first surface directed in a first direction A1 and a second surface directed in a second direction A2 that is opposite to the first direction A1, according to various embodiments of the present disclosure as illustrated in FIG. 1 mentioned above.

A more detailed description of the configuration of an example shield structure 200 used in the electronic device 10, according to various example embodiments of the present disclosure, will be provided below.

Figure 4:
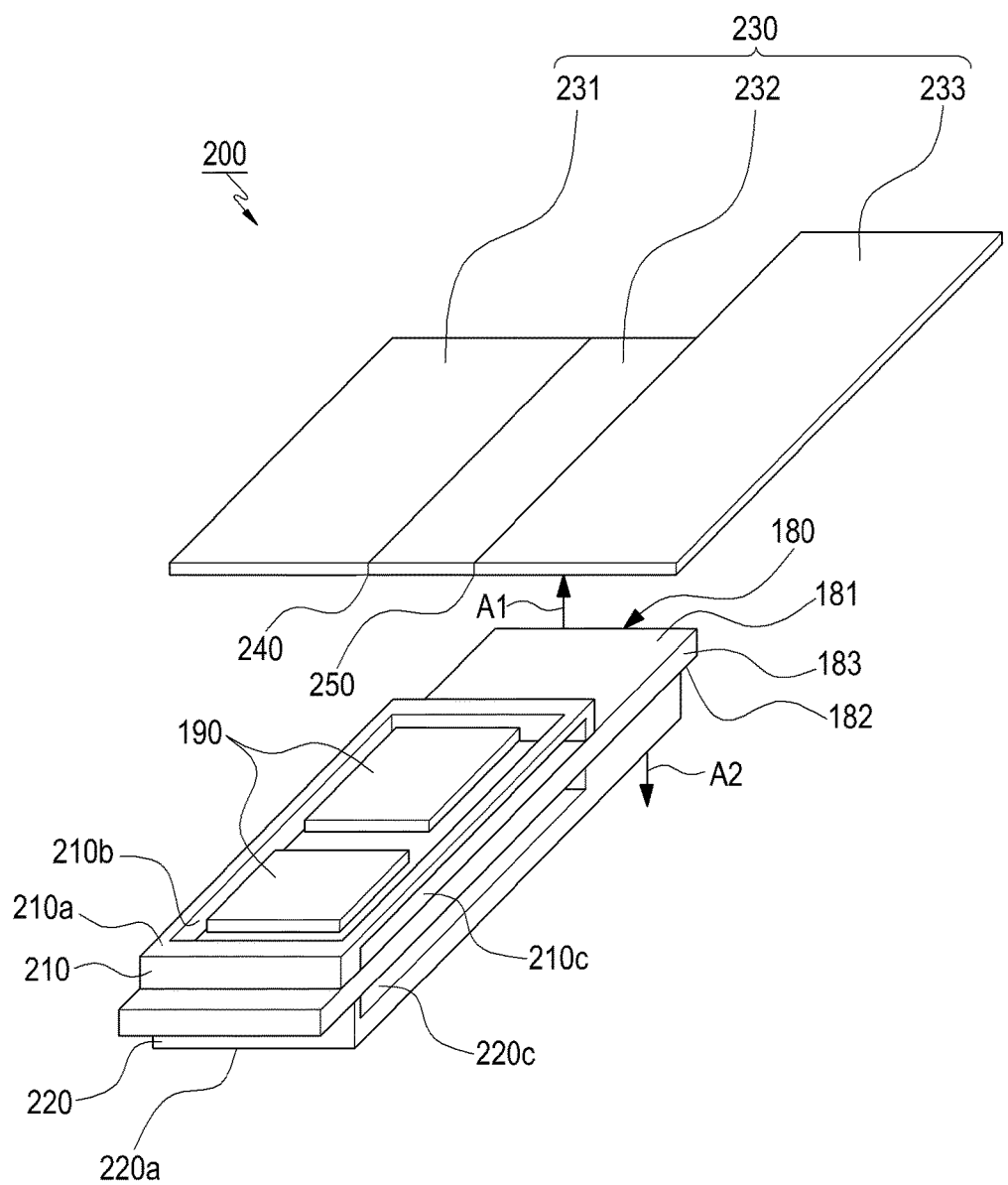
FIG. 4 is an exploded perspective view illustrating an example configuration of a shield structure according to various example embodiments of the present disclosure.

FIG. 4 is a perspective view illustrating the configuration of an example shield structure 200 according to various example embodiments of the present disclosure.

Referring to FIG. 4, for example, the electronic device 10 may include the housing 10a (illustrated in FIG. 14) of the electronic device 10, a printed circuit board 180, and at least one shield structure 200.

The housing 10a may include: a first surface 10b (illustrated in FIG. 14) directed in a first direction A1; and a second surface 10c (illustrated in FIG. 14) directed in a second direction A2 that is opposite to the first direction A1.

The printed circuit board 180 may include: a first surface 181 directed in the first direction A1 with one or more electronic components 190 mounted thereon; a second surface 182 formed to be opposite to the first surface 181 and directed in the second direction A2 with one or more electronic components 190 mounted thereon; and side surfaces substantially perpendicular to the first or second surface 181 or 182.

The shield structure 200 may be provided within the housing 10a of the electronic device 10 to electro-magnetically shield the one or more electronic components 190 disposed on the first and second surfaces 181 and 182 of the printed circuit board 180.

The shield structure 200 may include at least one frame structure and a flexible sheet 230. The frame structure may be provided by first and second frame structures 210 and 220.

The first frame structure 210 may be provided on the first surface 181 of the printed circuit board 180 to surround at least some of the electronic components 190. The first frame structure 210 may include: a first surface 210a directed in the first direction A1; and a side surface that at least partially surrounds the space between the first surface 210a of the first frame structure 210 and the first surface 181 of the printed circuit board 180.

The second frame structure 220 may be provided on the second surface 182 of the printed circuit board 180 to surround at least some of the electronic components 190. The second frame structure 220 may include: a first surface 220a directed in the second direction A2; and a side surface that at least partially surrounds the space between the first surface 220a of the second frame structure 220 and the second surface 182 of the printed circuit board 180.

The flexible sheet 230 is configured to cover the first surfaces 210a and 220a and side surfaces of the first and second frame structures 210 and 220 and the side surface 183 of the printed circuit board 180 in order to prevent and/or reduce Electro-Magnetic Interference (EMI) of the individual electronic components 190.

One or more openings 210b, 210c, and 220c may be formed in at least a part of the first surface 210a of the first frame structure 210, in at least a part of the first surface 220a of the second frame structure 220, and/or in the side surfaces of the first and second frame structures 210 and 220. The openings 210b, 210c, and 220c may form mounting spaces for mounting the electronic components 190.

According to an example embodiment, the flexible sheet 230 may be bent to cover the openings 210b, 210c, and 220c of the first and second frame structures 210 and 220 and the side surface 183 of the printed circuit board 180, which makes it possible to enhance the shielding function between the individual electronic components 190 and to prevent and/or reduce Electro-Magnetic Interference (EMI) between the electronic components 190. Furthermore, it is possible to remove a side wall formed on a side surface of an existing frame structure (e.g., a shield can) and to simultaneously reduce as much mounting space of the electronic components 190 as the removed space, thereby making the electronic device 10 smaller and slimmer. In addition, it is possible to mount the electronic components 190 in the space where the side wall is removed, thereby effectively utilizing the space of the product. The flexible sheet 230 may replace an existing shield can (not illustrated) since the flexible sheet 230 surrounds the first and second frame structures 210 and 220 and the printed circuit board 180.

Figure 5:
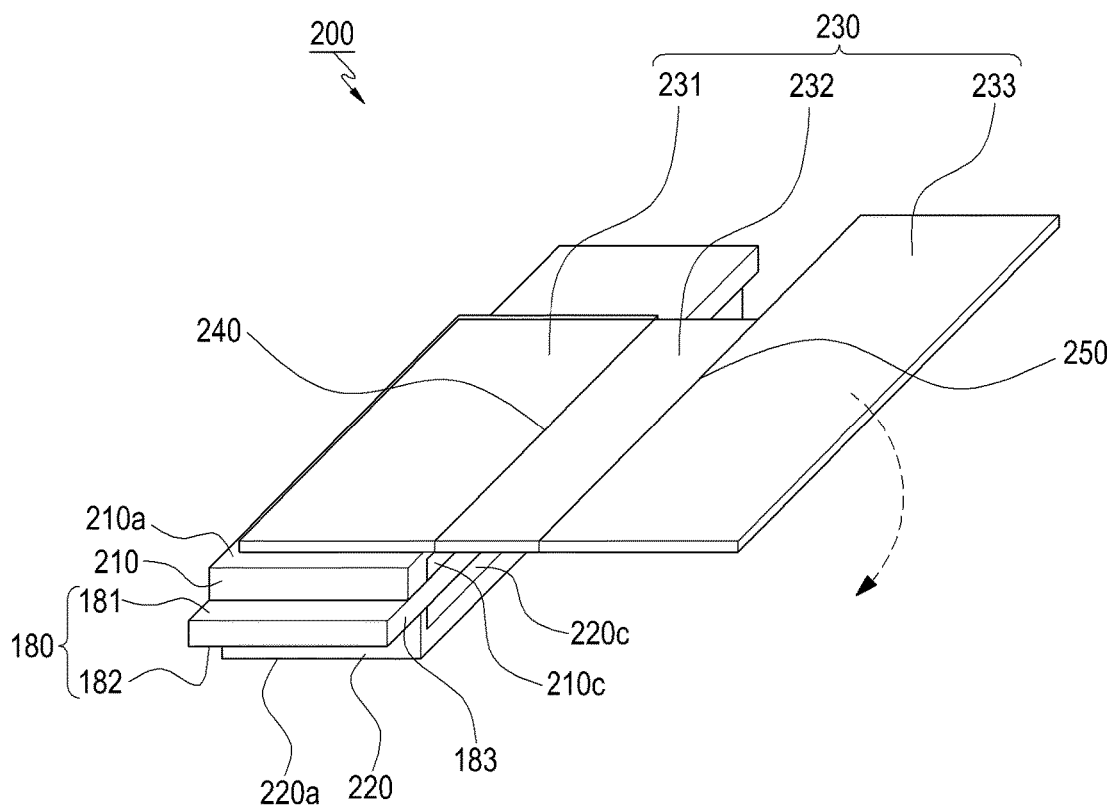
FIG. 5 is a perspective view illustrating a state in which a first surface of a first frame structure is covered with the example shield structure according to various example embodiments of the present disclosure.
Figure 6:
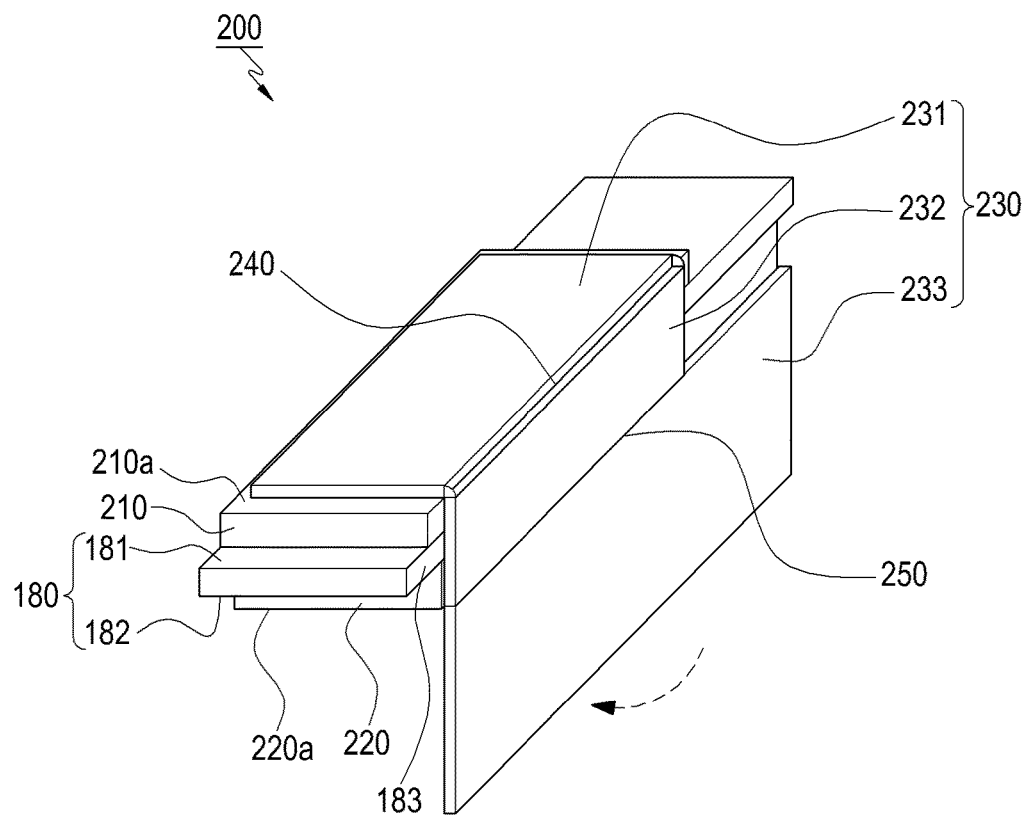
FIG. 6 is a perspective view illustrating a state in which the first surface and a side surface of the first frame structure and a side surface of a printed circuit board are covered with the example shield structure according to various example embodiments of the present disclosure.
Figure 7:
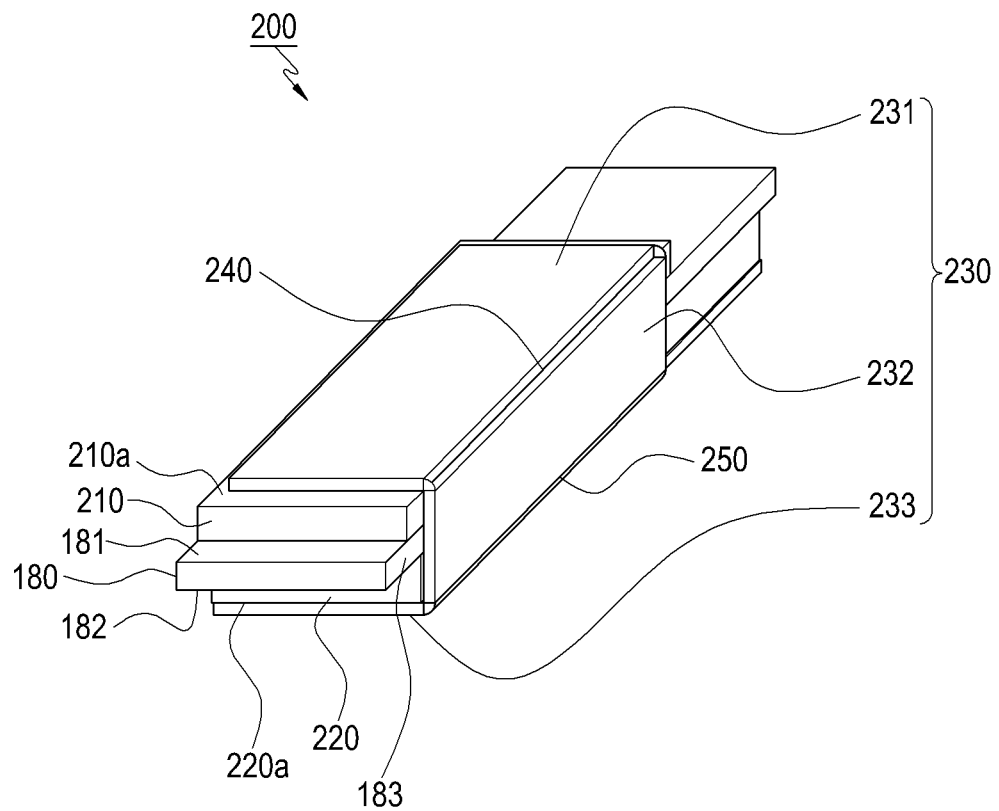
FIG. 7 is a perspective view illustrating a state in which the first surface and side surface of the first frame structure, a first surface and a side surface of a second frame structure, and the side surface of the printed circuit board are covered with the example shield structure according to various example embodiments of the present disclosure.

The flexible sheet 230 will be described below in greater detail. FIG. 5 is a perspective view illustrating a state in which the first surface of the first frame structure 210 is covered with the shield structure 200 according to various example embodiments of the present disclosure. FIG. 6 is a perspective view illustrating a state in which the first surface and side surface of the first frame structure 210 and the side surface of the printed circuit board 180 are covered with the shield structure 200 according to various example embodiments of the present disclosure. FIG. 7 is a perspective view illustrating a state in which the first surfaces and side surfaces of the first and second frame structures 210 and 220 and the side surface of the printed circuit board 180 are covered with the shield structure 200 according to various example embodiments of the present disclosure.

Referring to FIGS. 5 to 7, for example, the flexible sheet 230 may include first, second, and third sheets 231, 232, and 233.

The first sheet 231 is configured to cover the opening 210b formed in the first surface 201a of the first frame structure 210.

The second sheet 232 may extend from an edge of the first sheet 231 and may be bent to cover the side surface 183 of the printed circuit board 180 and the openings 210c and 220c formed in the side surfaces of the first and second frame structures 210 and 220.

The third sheet 233 may extend from an edge of the second sheet 232 and may be bent to cover the opening (not illustrated) that is formed in the first surface 220a of the second frame structure 220.

The second sheet 232 may extend from the edge of the first sheet 231.

For example, as illustrated in FIG. 5, the first sheet 231 covers the opening 210b of the first frame structure 210, and the second sheet 232 is bent by a first bending portion 240 formed between the first and second sheets 231 and 232, which will be described below. In this example, as illustrated in FIG. 6, the second sheet 232 covers the side surface 183 of the printed circuit board 180 and the openings 210c and 220c formed in the side surfaces of the first and second frame structures 210 and 220. Further, as illustrated in FIG. 7, the third sheet 233 is bent by a second bending portion 250 formed between the second and third sheets 232 and 233, which will be described below, to cover the opening (not illustrated) formed in the first surface 220a of the second frame structure 220.

Figure 8:
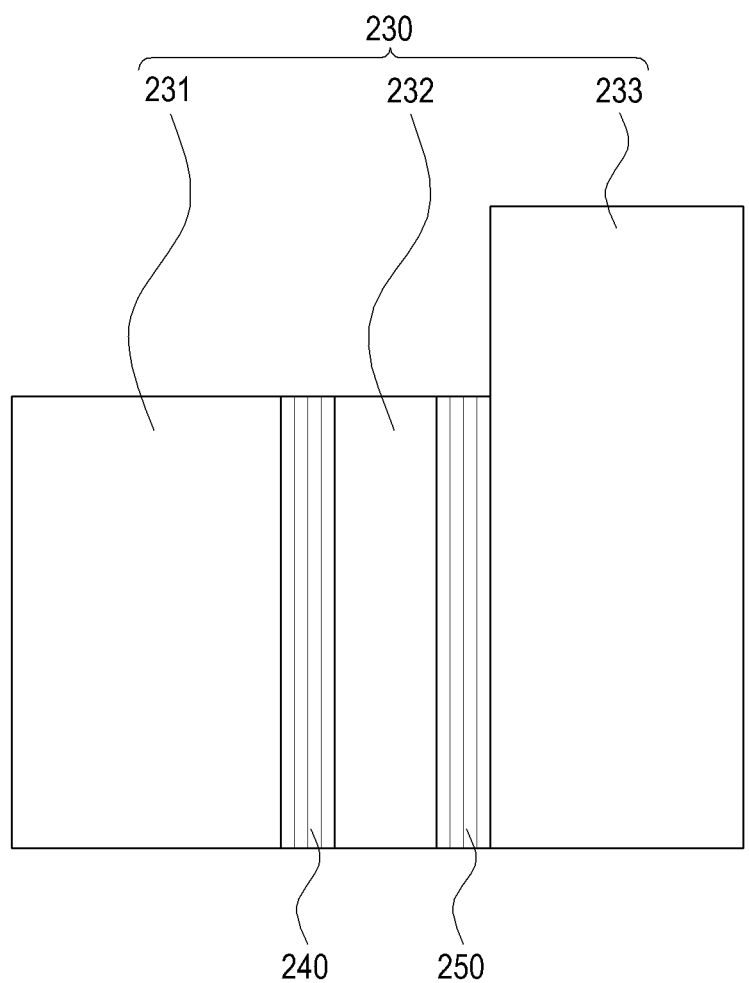
FIG. 8 is a plan view illustrating first and second bending portions among the elements of the example shield structure according to various example embodiments of the present disclosure.

The first and second bending portions 240 and 250 will be described below in greater detail with reference to FIG. 8. FIG. 8 is a plan view illustrating the first and second bending portions 240 and 250 among the elements of the shield structure 200 according to various example embodiments of the present disclosure.

Referring to FIG. 8, the first bending portion 240 may be formed between the first and second sheets 231 and 232 in order to bend the second sheet 232 and simultaneously cover the side surfaces of the first and second frame structures 210 and 220 and the side surface 183 of the printed circuit board 180.

The second bending portion 250 may be formed between the second and third flexible sheets 232 and 233 in order to bend the third sheet 233 and simultaneously cover the opening (not illustrated) formed in the first surface 220a of the second frame structure 220.

In another example embodiment, as illustrated in FIG. 8, the first and second bending portions 240 and 250 may include a plurality of wrinkles formed therein for facilitating the bending of the second and third sheets 232 and 233.

Figure 9:
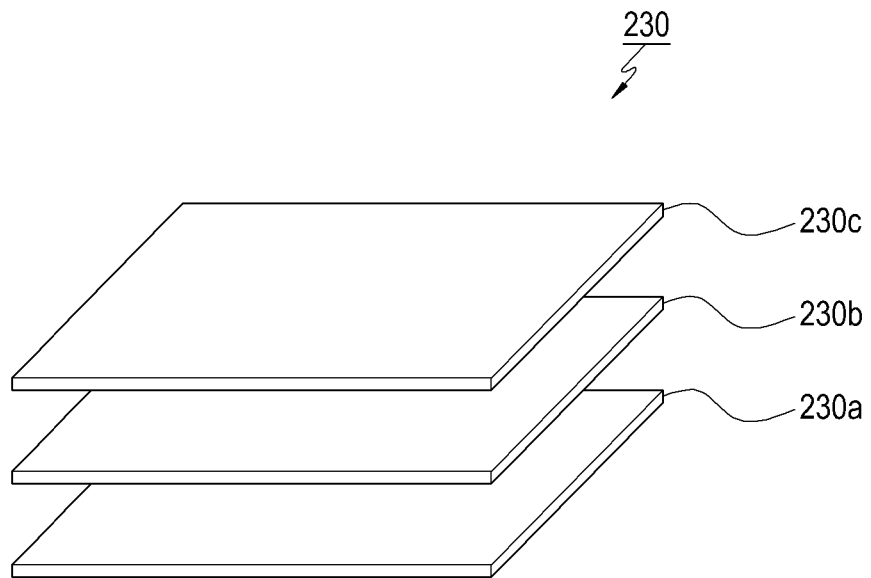
FIG. 9 is a perspective view illustrating the internal configuration of first, second, and third flexible sheets among the elements of the example shield structure according to various example embodiments of the present disclosure.
Figure 10:
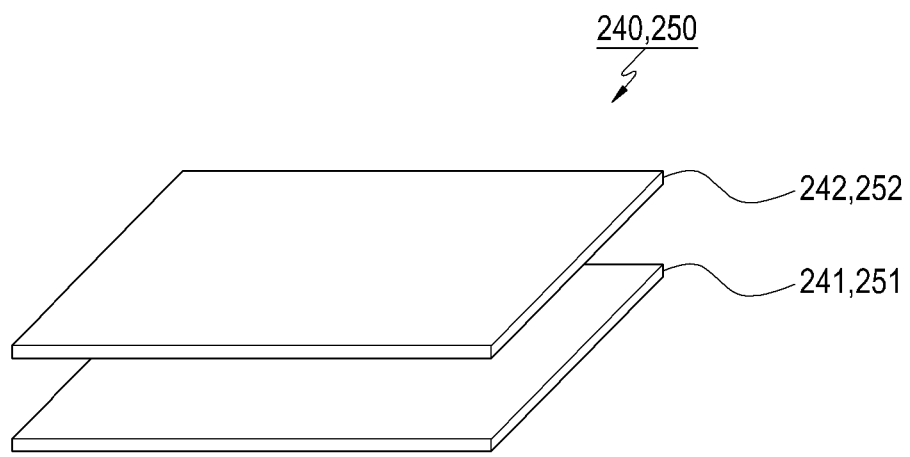
FIG. 10 is a perspective view illustrating the internal configuration of the first and second bending portions among the elements of the example shield structure according to various example embodiments of the present disclosure.

The first, second, and third sheets 231, 232, and 233 may, for example, be formed of a shielding film. The configuration of the shielding film will be described in greater detail with reference to FIGS. 9 and 10. FIG. 9 is a perspective view illustrating an internal configuration of the first, second, and third sheets 231, 232, and 233 among the elements of the shield structure 200 according to various example embodiments of the present disclosure, and FIG. 10 is a perspective view illustrating an internal configuration of the first and second bending portions 240 and 250 among the elements of the shield structure 200 according to various example embodiments of the present disclosure.

As illustrated in FIG. 9, each of the first, second, and third sheets 231, 232, and 233 may include an adhesive layer 230a, at least one metal layer 230b, and an insulation layer 230c.

The adhesive layer 230a may make contact with at least a part of at least one of the frame structures 210 and 220. For example, the adhesive layer 230a may be attached to the first surface 210a of the first frame structure 210 that has the opening 210b formed therein.

The insulation layer 230c may be at least partially spaced apart from the adhesive layer 230a and may be disposed above the adhesive layer 230a for electrical insulation between the electronic components 190. The metal layer 230b may be disposed between the adhesive layer 230a and the insulation layer 230c in order to shield electro-magnetic waves.

The metal layer 230b may, for example, be formed of a copper (Cu) layer. While the copper (Cu) layer is an example of the metal layer 230b in this embodiment, the metal layer 230b is not limited thereto. For example, a different metal layer 230b having an electro-magnetic wave shielding function may be employed for the metal layer 230b. For example, the metal layer 230b may contain one or more of tin (Sn), aluminum (Al), nickel (Ni), titanium (Ti), chrome (Cr), and indium (In).

According to an example embodiment, the flexible sheet may have a thickness ranging from 0.01 mm to 0.09 mm, and may have a thickness of substantially about 0.05 mm. The adhesive layer may have a thickness ranging from 0.010 mm to 0.030 mm, and may have a thickness of substantially about 0.020 mm. The metal layer may have a thickness ranging from 0.005 mm to 0.025 mm, and may have a thickness of substantially about 0.018 mm. The insulation layer may have a thickness ranging from 0.005 mm to 0.020 mm, and may have a thickness of substantially 0.012 mm. It will be understood that the foregoing thicknesses and thickness ranges are merely provided by way of example, and are not limited thereto.

In yet another example embodiment, as illustrated in FIG. 10, the first and second bending portions 240 and 250 may include, for example, metal layers 241 and 251 and insulation layers 242 and 252.

The metal layers 241 and 251 may be provided on the insulation layer 230c to shield electro-magnetic waves.

The insulation layers 242 and 252 may be disposed on the metal layers 241 and 251 for electrical insulation between the electronic components 190.

Since the first and second bending portions 240 and 250 have no adhesive layer 230a in this example, the first and second bending portions 240 and 250 may be made thinner and may be more easily bent.

According to an example embodiment, the metal layer may have a thickness ranging from 0.005 mm to 0.025 mm, and may have a thickness of substantially about 0.018 mm.

According to an embodiment, the insulation layer may have a thickness ranging from 0.005 mm to 0.020 mm, and may have a thickness of substantially about 0.012 mm. However, as set forth above, the foregoing thicknesses and thickness ranges are merely provided by way of example, and are not limited thereto.

Figure 11:
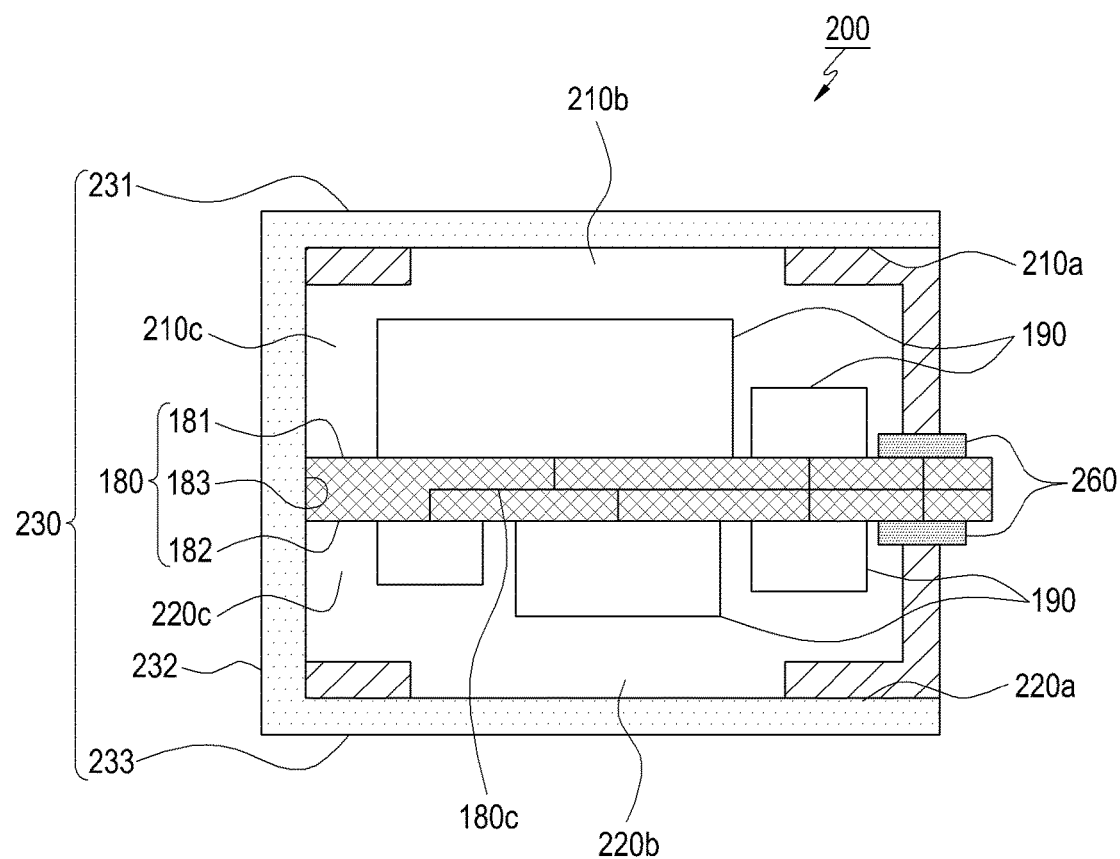
FIG. 11 is a side sectional view illustrating the operating state of the example shield structure according to various example embodiments of the present disclosure.

In another example embodiment, as illustrated in FIG. 11, the printed circuit board 180 may include at least one ground plane (not illustrated), and the electronic components 190 and the first and second frame structures 210 and 220 may include a plurality of conductive pads 260 so as to be electrically connected with the ground plane.

According to an example embodiment, the printed circuit board may be provided by an FPCB and may have a metal trace 180c or metal pattern formed thereon for electrically connecting the electronic components 190 and the conductive pads 260.

In another example embodiment, at least one of the frame structures 210 and 220 may have a fixing structure for fixing at least a part of the flexible sheet 230. The fixing structure will be described below in greater detail.

Figure 12:
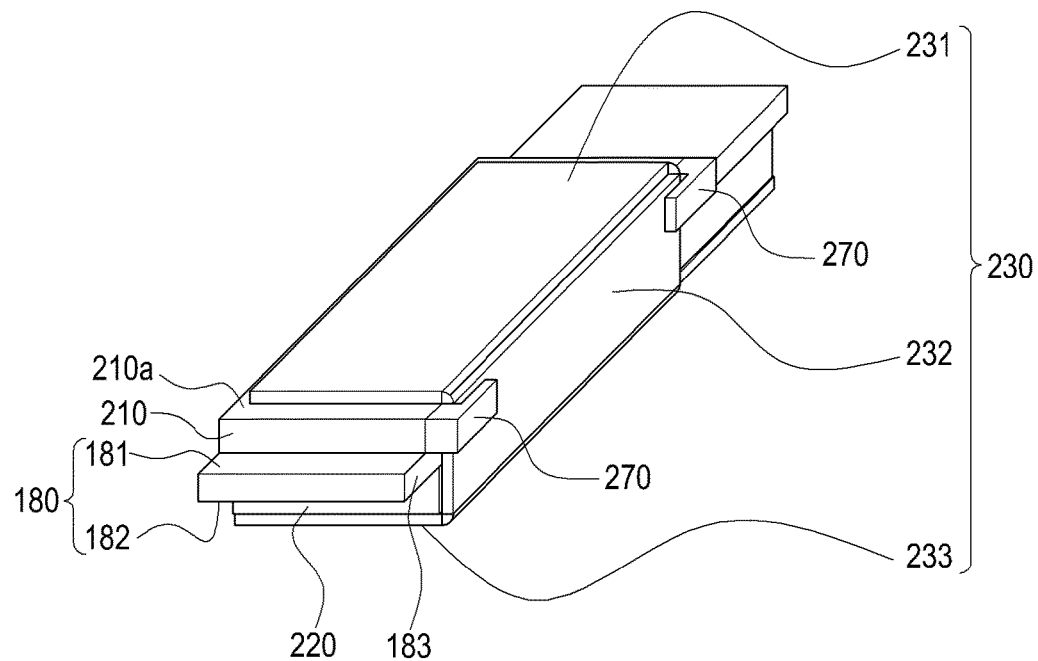
FIG. 12 is a perspective view illustrating the operating state of a fixing structure among the elements of the example shield structure according to various example embodiments of the present disclosure.
Figure 13:
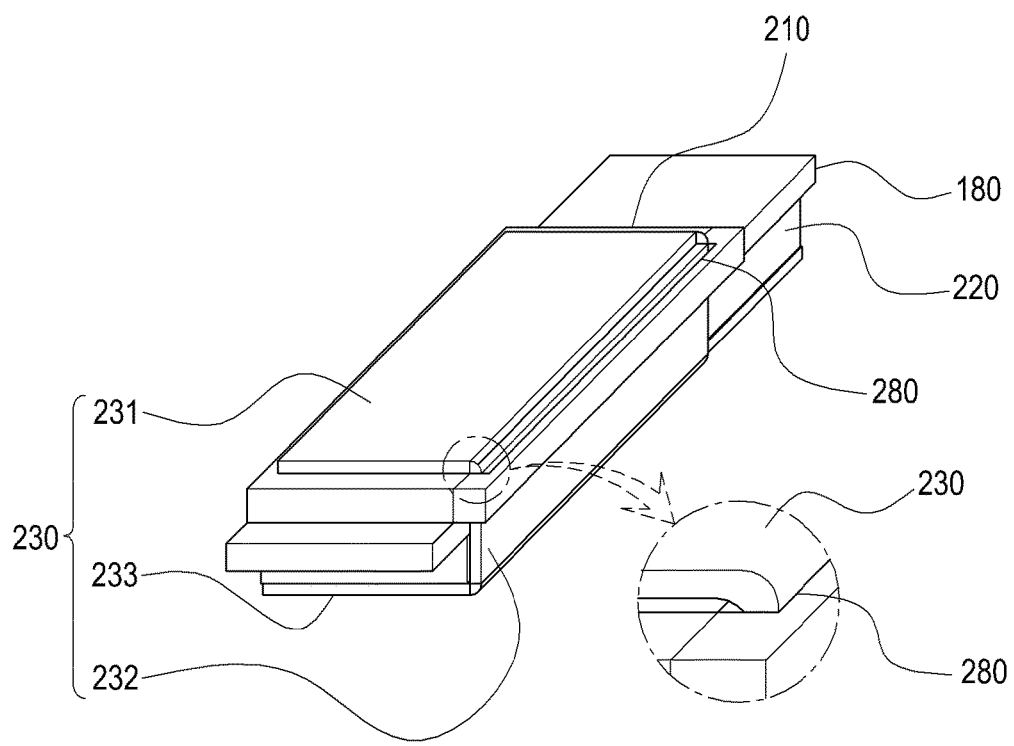
FIG. 13 is a perspective view illustrating another example embodiment of the fixing structure among the elements of the example shield structure according to various example embodiments of the present disclosure.

FIG. 12 is a perspective view illustrating the operating state of the fixing structure among the elements of the shield structure 200 according to various example embodiments of the present disclosure, and FIG. 13 is a perspective view illustrating another example embodiment of the fixing structure among the elements of the shield structure 200 according to various example embodiments of the present disclosure.

The fixing structure may include a hook-shaped structure 270 and/or an opening 280. The opening 280 may be an insertion hole, and may be formed in a different opening structure other than an insertion hole. The insertion hole may be described as an example of the opening 280 in various example embodiments of the present disclosure. As illustrated in FIG. 12, the hook-shaped structure 270 may be provided on the side surface of the first frame structure 210 to make contact with the second sheet 232 and simultaneously prevent and/or reduce a separation of the second sheet 232.

FIG. 12 illustrates the hook-shaped structure 270 provided on the side surface of the first frame structure 210.

As illustrated in FIG. 12, the first sheet 231 covers the opening 210b formed in the first surface 210a of the first frame structure 210, and the second sheet 232 is bent by the first bending portion 240 to cover the side surfaces of the first and second frame structures 210 and 220 and the side surface 183 of the printed circuit board 180. The third sheet 233 is bent by the second bending portion 250 to cover the opening formed in the first surface 220a of the second frame structure 220. In this state, the hook-shaped structure 270 provided on the side surface of the first frame structure 210 covers the second sheet 232. The hook-shaped structure 270 may cover the side surface of the second sheet 232 to make contact with the second sheet 232 and simultaneously prevent the second sheet 232 from being separated from the side surfaces of the first and second frame structures 210 and 220 and the side surface of the printed circuit board 180.

In another example embodiment, as illustrated in FIG. 13, the insertion hole 280 may be formed in the first frame structure 210 in order to fix the flexible sheet 230 inserted thereinto and simultaneously prevent and/or reduce the possibility of the flexible sheet 230 from being separated from the side surfaces of the first and second frame structures 210 and 220 and the side surface of the printed circuit board 180. The insertion hole 280 may also be formed in the second frame structure 220 in addition to the first frame structure 210.

For example, FIG. 13 illustrates the flexible sheet 230 passing through the insertion hole 280.

As illustrated in FIG. 13, as one end of the flexible sheet 230 is inserted into the insertion hole 280 and passes downward through the insertion hole 280, the flexible sheet 230 surrounds the side surfaces of the first and second frame structures 210 and 220 and the side surface 183 of the printed circuit board 180 and simultaneously covers the opening formed in the first surface 220a of the second frame structure 220. In this example, the insertion hole 280 may prevent and/or reduce the possibility of the flexible sheet 230 from being separated from the side surfaces of the first and second frame structures 210 and 220 and the side surface 183 of the printed circuit board 180.

Figure 14A:
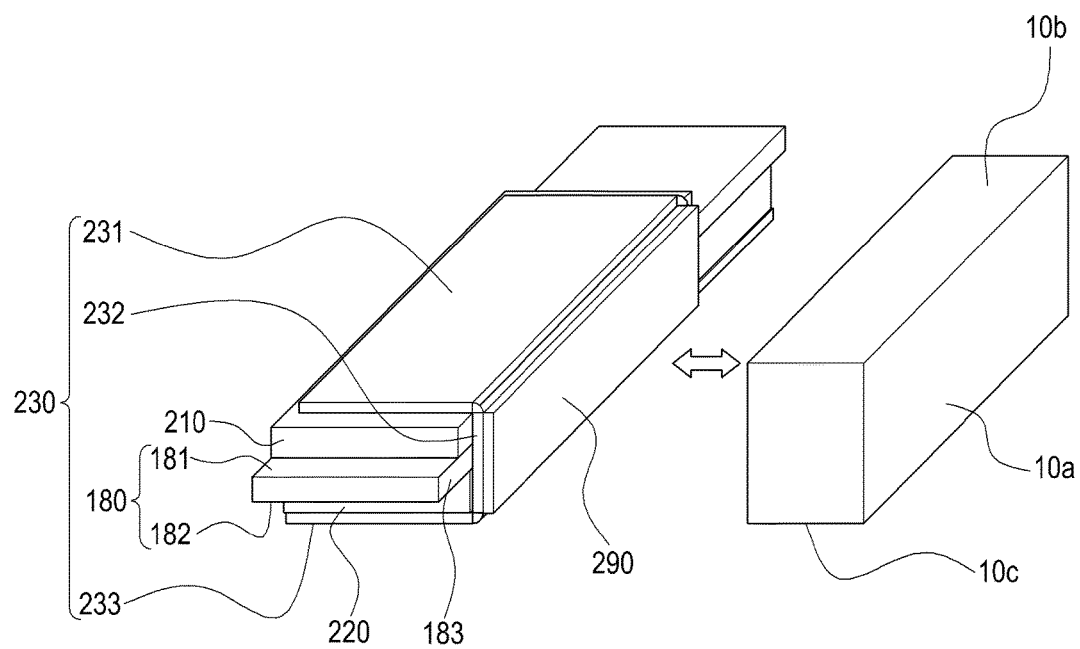
FIG. 14A is a perspective view illustrating a state before a support structure among the elements of the example shield structure, according to various example embodiments of the present disclosure, operates.
Figure 14B:
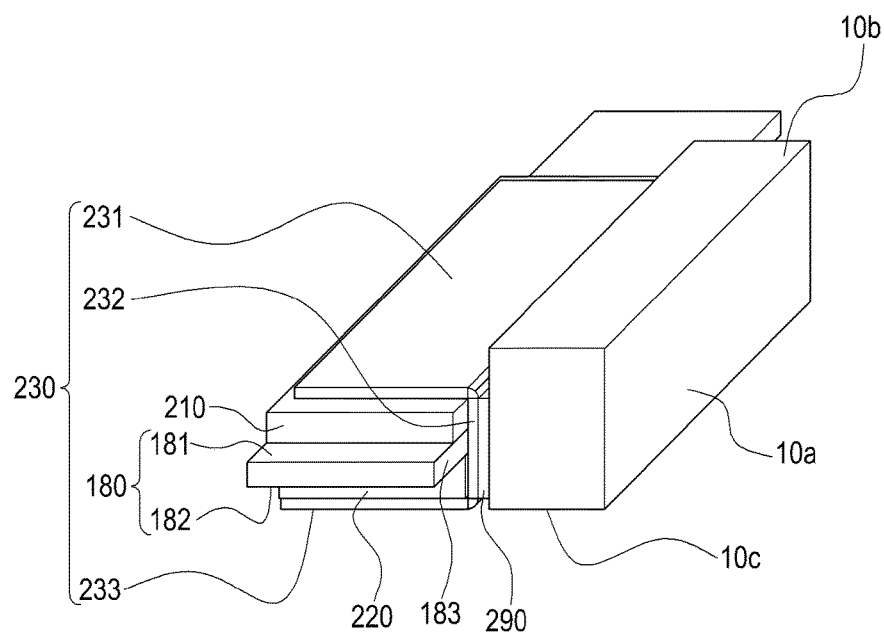
FIG. 14B is a perspective view illustrating a state after the support structure among the elements of the example shield structure, according to various example embodiments of the present disclosure, operates.

In yet another example embodiment, as illustrated in FIGS. 14A and 14B, a support structure 290 may be provided on the outer surface of the second sheet 232. The support structure 290 may be disposed between at least a part of the housing 10a and at least a part of the shield structure 200 to prevent and/or reduce a separation of the second sheet 232.

For example, FIG. 14A is a perspective view illustrating a state in which the support structure 290 is mounted on the outer surface of the second sheet 232, and FIG. 14B is a perspective view illustrating a state in which the support structure 290 and the housing 10a make contact with each other.

As illustrated in FIGS. 14A and 14B, the first sheet 231 covers the opening formed in the first surface 210a of the first frame structure 210, and the second sheet 232 is bent by the first bending portion 240 to cover the side surfaces of the first and second frame structures 210 and 220 and the side surface 183 of the printed circuit board 180. The third sheet 233 is bent by the second bending portion 250 to cover the opening formed in the first surface 220a of the second frame structure 220. In this state, the support structure 290 is mounted on the outer surface of the second sheet 232, and the housing 10a is brought into contact with the support structure 290. In this example, the support structure 290 and the housing 10a make contact with each other, and the support structure 290 is pressed by the housing 10a at the same time. The support structure 290 may prevent and/or reduce the possibility of the second sheet 232 from being separated from the side surfaces of the first and second frame structures 210 and 220 and the side surface of the printed circuit board 180. The support structure 290 may have resilience such that the support structure 290 is pressed while making contact with the housing 10a. In another embodiment, the housing 10a may be constituted by an external mechanical part.

Another example embodiment of the support structure 290, according to the present disclosure, will be described below with reference to FIGS. 15A and 15B. For example, a support structure 291 may be provided on the outer surface of the second sheet 232. The support structure 291 may be disposed between at least a part of the housing 10a and at least a part of the shield structure 200 and may be folded, for example, at least two times to make contact with the housing 10a.

Figure 15A:
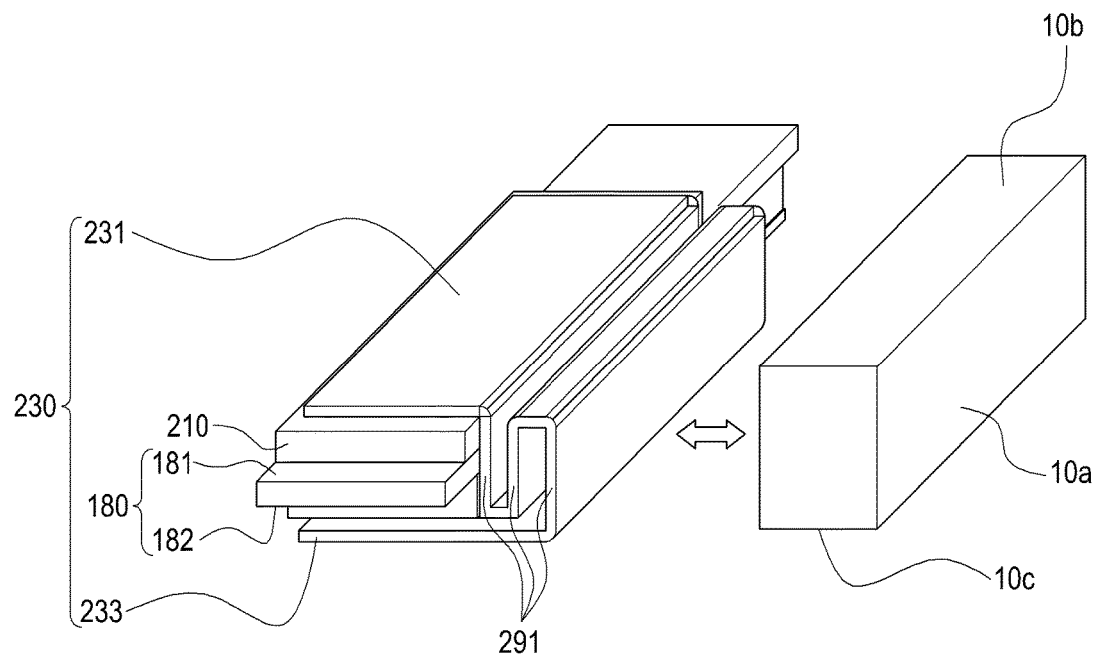
FIG. 15A is a perspective view illustrating a state before another example embodiment of the support structure among the elements of the example shield structure, according to various example embodiments of the present disclosure, operates.
Figure 15B:
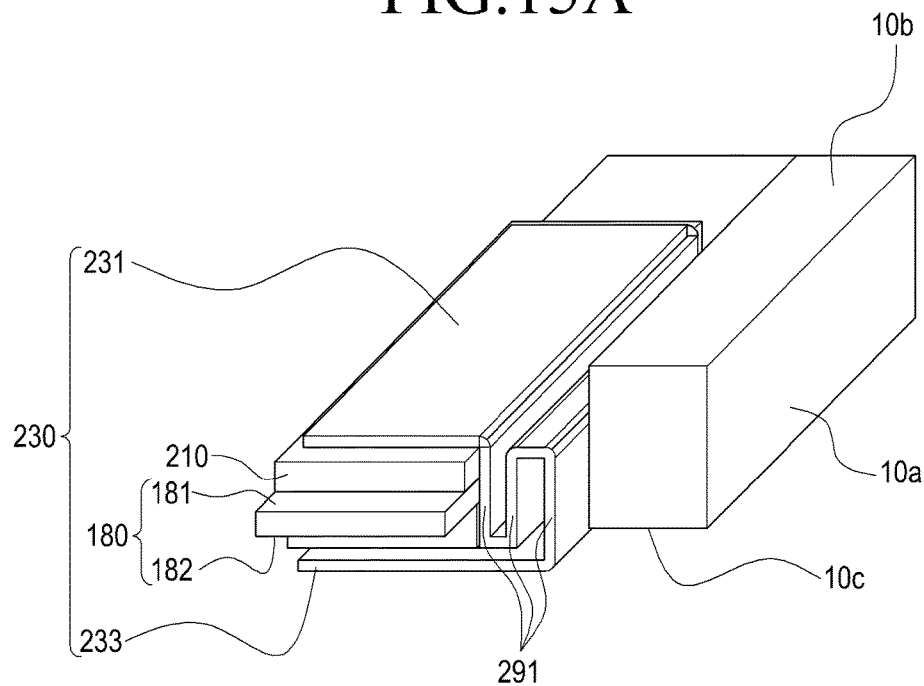
FIG. 15B is a perspective view illustrating a state after the other example embodiment of the support structure among the elements of the example shield structure, according to various example embodiments of the present disclosure, operates.

For example, FIG. 15A is a perspective view illustrating a state in which the support structure 291 is mounted on the outer surface of the second sheet 232, and FIG. 15B is a perspective view illustrating a state in which the support structure 291 and the housing 10a make contact with each other.

As illustrated in FIGS. 15A and 15B, the first sheet 231 covers the opening formed in the first surface 210a of the first frame structure 210, and the second sheet 232 is bent by the first bending portion 240 to cover the side surfaces of the first and second frame structures 210 and 220 and the side surface 183 of the printed circuit board 180. The third sheet 233 is bent by the second bending portion 250 to cover the opening formed in the first surface 220a of the second frame structure 220. In this state, the support structure 291, which is folded at least two times, may be mounted on the outer surface of the second sheet 232, and the housing 10a is brought into contact with the support structure 291. In this case, the support structure 291 and the housing 10a make contact with each other, and the support structure 291 is pressed by the housing 10a at the same time. The support structure 291 has resilience such that the support structure 291 is pressed while making contact with the housing 10a.

As described above, the support structure may be folded several times to make contact with the housing, or may include a sponge with resilience. While the support structure is provided by the folded structure or the resilient sponge in the various example embodiments of the present disclosure, the support structure is not limited thereto. In addition to the sponge or the folded structure, various forms of support structures may be employed for the support structure. For example, the support structure may be folded in zigzags, or may be folded several times in alternating directions, to make contact with the housing.

Yet another example embodiment of the support structure 290, according to the present disclosure, will be described below. For example, the support structure 290 may be applied to a flexible electronic device. According to an example embodiment, the flexible electronic device may include a flexible Printed Circuit Board (PCB). The flexible electronic device may be constituted by a flexible device other than the flexible PCB. For example, the flexible electronic device may be constituted by a flexible display or a flexible touch panel.

The flexible sheet 230 may be disposed on a first surface of the flexible printed circuit board, and the support structure may be disposed between the flexible sheet and the flexible printed circuit board to support the flexible sheet 230. Accordingly, the support structure may be disposed such that the flexible sheet 230 and the flexible printed circuit board are entirely flexible when the support structure is disposed between the flexible sheet 230 and the flexible printed circuit board, or the support structure may have a partially rigid structure with a plurality of support structures arranged at a specified interval.

The flexible sheet 230 may include a shielding film. For example, the flexible sheet 230 may include a shrink film, and the shrink film may be formed of a material that is shrunk and fixed when heat is applied thereto. For example, the flexible sheet 230, which includes the shrink film, may be easily shrunk and detached by applying heat thereto, and may be re-attached by applying heat thereto again. Accordingly, the flexible sheet including the shrink film may be easily detached from, or attached again to, the printed circuit board or the first and second frame structures 210 and 220. The flexible sheet 230 may be formed of an adhesive material that reacts to heat.

Figure 16A:
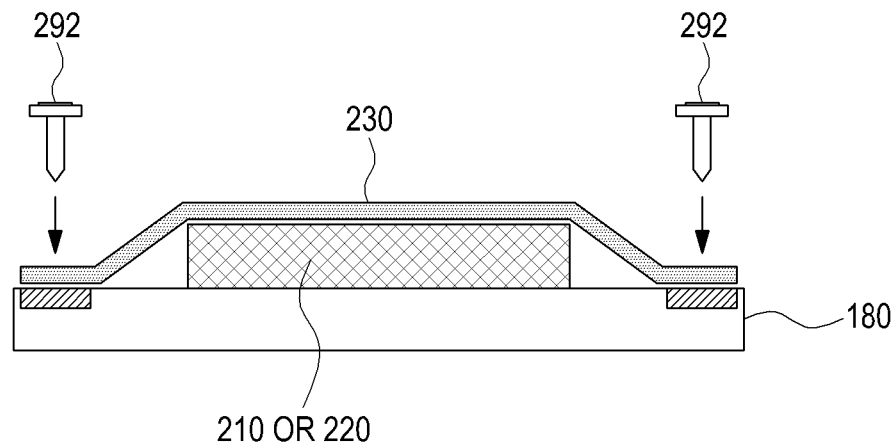
FIG. 16A is a side sectional view illustrating a state before a flexible sheet among the elements of the example shield structure, according to various example embodiments of the present disclosure, is fixed to the printed circuit board or at least one of the frame structures using a screw or pin.
Figure 16B:
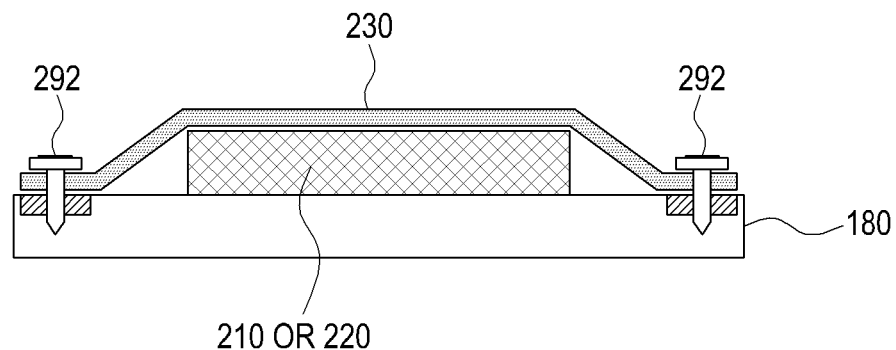
FIG. 16B is a side sectional view illustrating a state after the flexible sheet among the elements of the example shield structure, according to various example embodiments of the present disclosure, is fixed to the printed circuit board or the at least one frame structure using the screw or pin.

According to an example embodiment, as illustrated in FIGS. 16A and 16B, the flexible sheet 230 may be fixed to the printed circuit board 180 or the first and second frame structures 210 and 220 by screws or pins. For example, the flexible sheet 230 may be fixed to the printed circuit board or the first and second frame structures 210 and 220 by passing screws 292 or pins (not shown) through the flexible sheet 230 and then driving the screws 292 or pins (not shown) into the printed circuit board or the first and second frame structures 210 and 220.

Figure 16C:
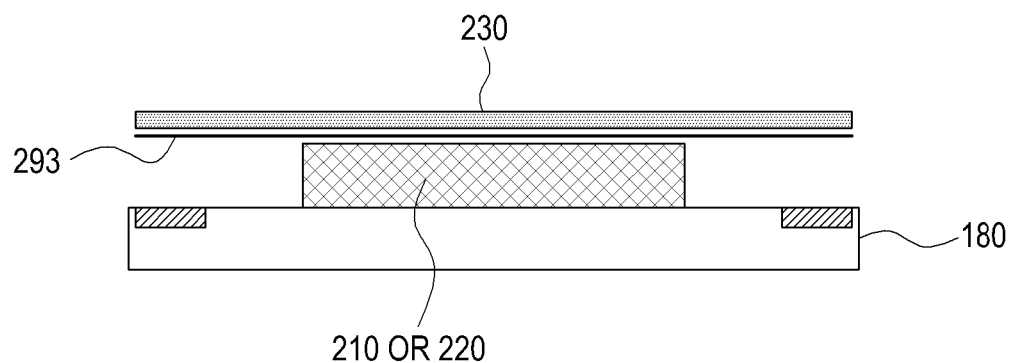
FIG. 16C is a side sectional view illustrating a state before the flexible sheet among the elements of the example shield structure, according to various example embodiments of the present disclosure, is fixed to the printed circuit board or at least one of the frame structures using an adhesive layer.
Figure 16D:
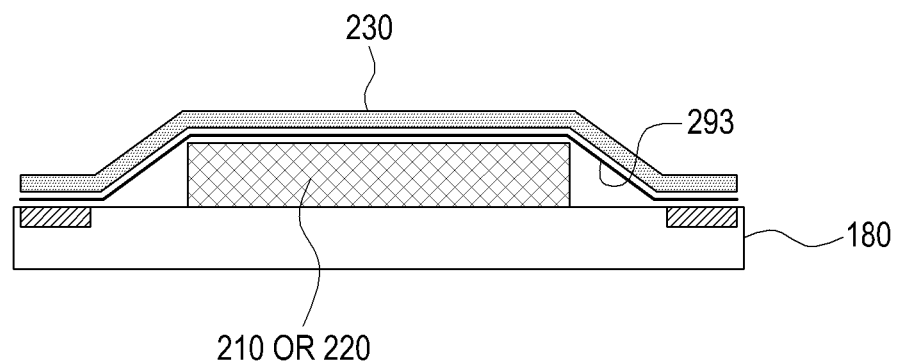
FIG. 16D is a side sectional view illustrating a state after the flexible sheet among the elements of the example shield structure, according to various example embodiments of the present disclosure, is fixed to the printed circuit board or the at least one frame structure using the adhesive layer.

According to an example embodiment, as illustrated in FIGS. 16C and 16D, the flexible sheet 230 may include a shielding film that includes an adhesive layer (not illustrated). For example, the flexible sheet 230 may be bonded to the printed circuit board 180 or the first and second frame structures 210 and 220 by applying heat or pressure using the adhesive layer 293. Accordingly, the flexible sheet 230 may be easily attached using the adhesive layer.

As described above, the flexible sheet 230 may be fixed to the printed circuit board 180 or the first and second frame structures 210 and 220 using the shielding film, the adhesive layer, the screws or pins. The flexible sheet may be fixed using fixing means other than the shielding film, the adhesive layer, the screws or pins.

A process of manufacturing the flexible sheet 230 will be described in greater detail below. As illustrated in FIG. 9 mentioned above, the flexible sheet 230 may include the first, second, and third sheets 231, 232, and 233, the first bending portion 240 may be provided between the first and second sheets 231 and 232, and the second bending portion 250 may be provided between the second and third sheets 232 and 233. The first and second bending portions 240 and 250 may connect the first, second, and third sheets 231, 232, and 233 such that the first, second, and third sheets 231, 232, and 233 are integrally formed with each other.

Each of the first to third sheets 231, 232, and 233 may include the adhesive layer 230a, the at least one metal layer 230b disposed on the adhesive layer 230a, and the insulation layer 230c disposed on the at least one metal layer 230b.

The first and second bending portions 240 and 250 may include the metal layers 241 and 251 and the insulation layers 242 and 252 disposed on the metal layers 241 and 251.

The operating process of the above-configured flexible sheet 230 will be described in greater detail below. As illustrated in FIG. 5 mentioned above, the first sheet 231 covers the opening 210b of the first frame structure 210 provided on the first surface 181 of the printed circuit board 180. The second sheet 232 is bent at a substantially right angle with respect to the first sheet 231 by the first bending portion 240 formed at one end thereof to cover the opening 210c formed in the side surface of the first frame structure 210 and the side surface 183 of the printed circuit board 180. In this example, the second sheet 232 covers the openings 210c and 220c formed in the side surfaces of the first and second frame structures 210 and 220. The third sheet 233 is bent at a substantially right angle with respect to the second sheet 232 by the second bending portion 250 formed at the opposite end of the second sheet 232 to cover the opening (not illustrated) of the second frame structure 220.

In the various example embodiments of the present disclosure, the first, second, and third sheets 231, 232, and 233 and the first and second bending portions 240 and 250 are configured to surround the side surface of the printed circuit board 180 and the openings 210c and 220c that are formed in the first surfaces 210a and 220a and the side surfaces of the frame structures 210 and 220 in which the electronic components 190 of the electronic device 10 are embedded, which makes it possible to remove a side wall formed on a side surface of an existing frame structure (e.g., a shield can) and to simultaneously reduce as much mounting space of the electronic components as the removed space, thereby making the electronic components and the electronic device 10 smaller and slimmer. Furthermore, it is possible to mount the electronic components in the space where the side wall is removed, thereby effectively utilizing the space of the product.

Moreover, the first, second, and third sheets 231, 232, and 233 and the first and second bending portions 240 and 250 are configured to surround the first and second frame structures 210 and 220 and the printed circuit board 180, thereby further enhancing the shielding function of the product.

In addition, the flexible sheet 230 may include, for example, at least one neutral plane adjustment feature that facilitates the bending of at least a part of the flexible sheet. The flexible sheet that has the neutral plane adjustment feature may be easily bent to surround the first, second, and third surfaces 210a, 210c, and 210d of the first frame structure 210 and the side surface 183 of the printed circuit board 180 in an easy manner.

According to various example embodiments of the present disclosure, an electronic device may include: a housing that includes a first surface directed in a first direction and a second surface directed in a second direction that is opposite to the first direction; a printed circuit board included in the housing, wherein the printed circuit board includes a first surface directed in the first direction and a second surface directed in the second direction; at least one electronic component disposed on the first surface of the printed circuit board; and at least one shield structure configured to electro-magnetically shield the at least one electronic component, and the shield structure may include: a flexible sheet comprising a first sheet that covers the at least one electronic component and a second sheet that at least partially covers the space between the first sheet and the first surface of the printed circuit board, when viewed from above the first surface of the printed circuit board; and at least one frame structure that supports the first and second sheets.

According to various example embodiments of the present disclosure, the second sheet may extend from an edge of the first sheet.

According to various example embodiments of the present disclosure, the at least one frame structure may include: a first surface that surrounds at least a part of the electronic component, the first surface being directed in the first direction; and a side surface that at least partially surrounds the space between the first surface of the at least one frame structure and the first surface of the printed circuit board. The first sheet may be disposed on the first surface of the at least one frame structure, and the second sheet may be disposed on at least a part of the side surface of the at least one frame structure.

According to various example embodiments of the present disclosure, the at least one frame structure may include at least one opening that is formed in at least a part of the first surface thereof and/or in at least a part of the side surface thereof, and the flexible sheet may be disposed to cover the at least one opening.

According to various example embodiments of the present disclosure, the at least one frame structure may include a fixing structure configured to fix at least a part of the flexible sheet.

According to various example embodiments of the present disclosure, the flexible sheet may include at least one neutral plane adjustment feature that facilitates the bending of at least a part of the flexible sheet.

According to various example embodiments of the present disclosure, the flexible sheet may include: an adhesive layer that makes contact with at least a part of the at least one frame structure; an insulation layer at least partially spaced apart from the adhesive layer; and at least one metal layer disposed between the adhesive layer and the insulation layer.

According to various example embodiments of the present disclosure, the flexible sheet may have a thickness in a range of 0.01 mm to 0.09 mm.

According to various example embodiments of the present disclosure, the adhesive layer may have a thickness in a range of 0.010 mm to 0.030 mm, the metal layer may have a thickness in a range of 0.005 mm to 0.025 mm, and the insulation layer may have a thickness in a range of 0.005 mm to 0.020 mm.

According to various example embodiments of the present disclosure, the electronic device may further include at least one of an adhesive layer, a screw, and a pin that fix the flexible sheet to the printed circuit board or the at least one frame structure.

According to various example embodiments of the present disclosure, the electronic device may further include at least one other electronic component disposed on the second surface of the printed circuit board; the flexible sheet may further include a third sheet that covers the at least one other electronic component and a fourth sheet that at least partially covers the space between the third sheet and the second surface of the printed circuit board, when viewed from above the second surface of the printed circuit board; and the shield structure may include at least one other frame structure that supports the third and fourth sheets.

According to various example embodiments of the present disclosure, the fourth sheet may extend from the second sheet.

According to various example embodiments of the present disclosure, the fourth sheet may extend from the third sheet.

According to various example embodiments of the present disclosure, the electronic device may further include a support structure disposed between at least a part of the housing and at least a part of the shield structure.

According to various example embodiments of the present disclosure, the support structure may have resilience.

According to various example embodiments of the present disclosure, the support structure may be formed by folding its surface, which makes contact with the housing, two or more times.

According to various example embodiments of the present disclosure, an electronic device may include: a housing that includes a first surface directed in a first direction and a second surface directed in a second direction that is opposite to the first direction; a printed circuit board included in the housing, wherein the printed circuit board includes a first surface directed in the first direction, a second surface directed in the second direction, and a side surface that is substantially perpendicular to the first or second surface; at least one electronic component disposed on the first surface of the printed circuit board; and at least one shield structure configured to electro-magnetically shield the at least one electronic component, and the shield structure may include: a first frame structure that surrounds at least a part of the electronic component disposed on the first surface of the printed circuit board, wherein the first frame structure includes a first surface directed in the first direction and a side surface that at least partially surrounds the space between the first surface of the first frame structure and the first surface of the printed circuit board; and a flexible sheet that covers the first surface and side surface of the first frame structure and the side surface of the printed circuit board.

According to various example embodiments of the present disclosure, the flexible sheet may include a conductive film.

According to various example embodiments of the present disclosure, the electronic device may further include: at least one other electronic component disposed on the second surface of the printed circuit board; and a second frame structure that surrounds at least a part of the other electronic component disposed on the second surface of the printed circuit board, and the second frame structure may include: a first surface directed in the second direction; and a side surface that at least partially surrounds the space between the first surface of the second frame structure and the second surface of the printed circuit board. The flexible sheet may include: a first sheet that covers an opening formed in the first surface of the first frame structure; a second sheet that extends from an edge of the first sheet and covers the side surface of the first frame structure, the side surface of the printed circuit board, and the side surface of the second frame structure; and a third sheet that extends from an edge of the second sheet and covers an opening formed in the first surface of the second frame structure.

According to various example embodiments of the present disclosure, a first bending portion may be formed between the first and second sheets, and a second bending portion may be formed between the second and third sheets.

According to various example embodiments of the present disclosure, at least one of the first and second bending portions may include a plurality of wrinkles.

According to various example embodiments of the present disclosure, the first and second sheets may include a first number of layers, and the first and second bending portions may include a second number of layers, where the first number may be larger than the second number.

According to various example embodiments of the present disclosure, the printed circuit board may include at least one ground plane, and the electronic component and the first and second frame structures may be electrically connected with the ground plane.

According to various example embodiments of the present disclosure, the electronic device may further include a structure connected to the side surface of the first frame structure to bring the second sheet close to the first frame structure.

According to various example embodiments of the present disclosure, the first frame structure may include an opening into which a part of the flexible sheet is fixedly inserted.

According to various example embodiments of the present disclosure, the flexible sheet may be fixed to the printed circuit board or the at least one frame structure using one of an adhesive layer, a screw, and a pin.

According to various example embodiments of the present disclosure, the flexible sheet may be constituted by a shielding film.

An example configuration of a shield structure 300 used in the electronic device 10, according to various other example embodiments of the present disclosure, will be described in greater detail below.

Figure 17:
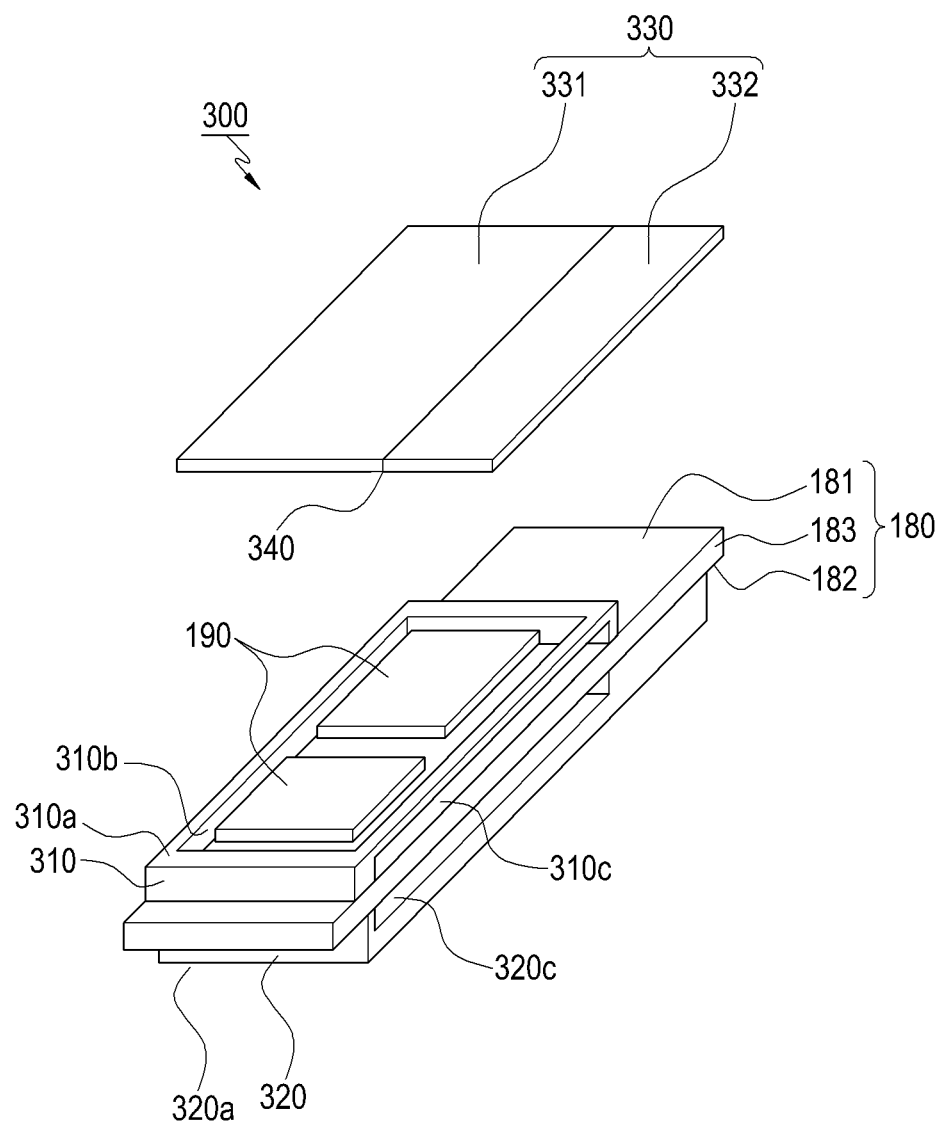
FIG. 17 is an exploded perspective view illustrating the configuration of an example shield structure according to various other example embodiments of the present disclosure.

FIG. 17 is an exploded perspective view illustrating an example configuration of the shield structure 300 according to various other example embodiments of the present disclosure.

Referring to FIG. 17, for example, the shield structure 300 may be provided by first and second shield structures. The first shield structure may include a printed circuit board 180, first and second frame structures 310 and 320, and a first flexible sheet 330. The printed circuit board 180 may include a first surface 181 on which first electronic components 190 of the electronic device 10 are mounted. The first frame structure 310 may be provided on the first surface 181 of the printed circuit board 180 such that the first electronic components 190 may be embedded in the first frame structure 310. The first frame structure 310 may include: a first surface directed in the first direction; and a first side surface that at least partially surrounds the space between the first surface of the first frame structure and the first surface of the printed circuit board. The first flexible sheet 330 may cover the first side surface and an opening 310b formed in the first surface 310a of the first frame structure 310 in order to prevent and/or reduce Electro-Magnetic Interference (EMI) of the first electronic components 190.

The second shield structure (not illustrated) may include the printed circuit board 180, the first and second frame structures 310 and 320, and a second flexible sheet (not illustrated). The printed circuit board 180 may include a second surface 182 on which second electronic components (not illustrated) of the electronic device 10 are mounted. The second frame structure 320 may be provided on the second surface 182 of the printed circuit board 180 such that the second electronic components may be embedded in the second frame structure 320. The second frame structure 320 may include: a first surface 320a directed in the second direction A2; and a second side surface that at least partially surrounds the space between the first surface of the second frame structure and the second surface of the printed circuit board. The second flexible sheet (not illustrated) may cover the second side surface and an opening formed in the first surface 320a of the second frame structure 320 in order to prevent and/or reduce Electro-Magnetic Interference (EMI) of the second electronic components.

Openings 310c and 320c may be formed in the side surfaces of the first and second frame structures 310 and 320 by partially removing the side surfaces of the first and second frame structures 310 and 320 in order to mount the first and second electronic components.

According to an example embodiment, the first flexible sheet 330 and the second flexible sheet (not illustrated) may be bent to cover the openings 310c and 320c formed in the side surfaces of the first and second frame structures 310 and 320 and the side surface 183 of the printed circuit board 180 so that the flexible sheets may further enhance the shielding function between the individual electronic components instead of the frame structures and may prevent and/or reduce Electro-Magnetic Interference (EMI) between the first and second electronic components. Furthermore, it is possible to remove a side wall formed on a side surface of an existing frame structure (e.g., a shield can) and simultaneously reduce as much mounting space of the electronic components 190 as the removed space, thereby making the electronic device 10 smaller and slimmer. In addition, it is possible to mount the first and second electronic components in the space where the side wall is removed, thereby effectively utilizing the space of the product.

Figure 18:
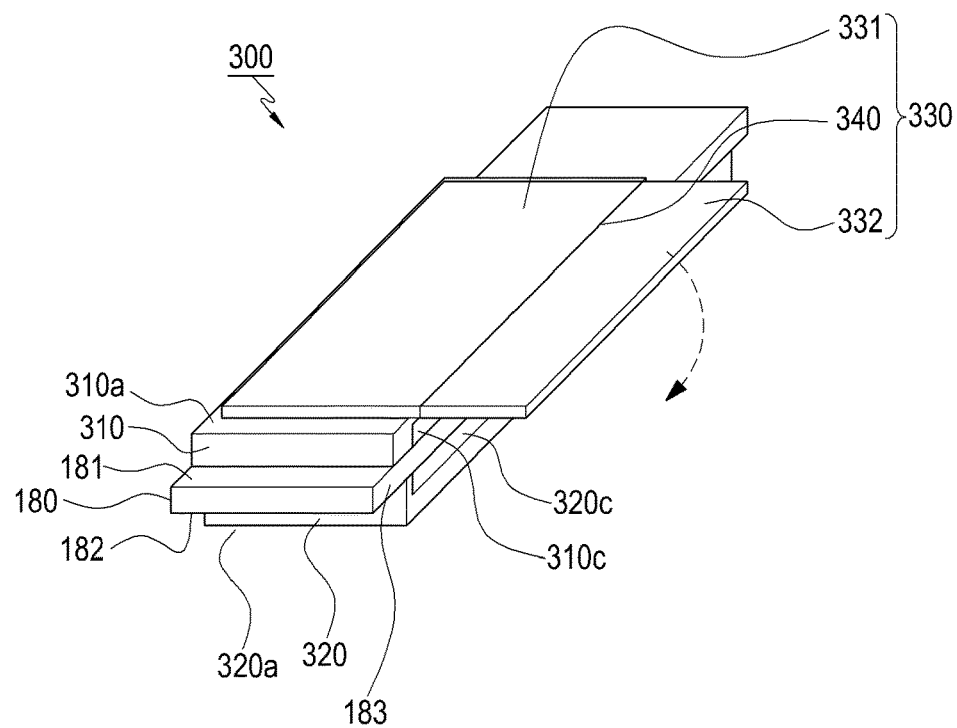
FIG. 18 is a perspective view illustrating a state in which a first surface of a first frame structure is covered with the example shield structure according to various other example embodiments of the present disclosure.

The first flexible sheet 330 will be described in greater detail below. FIG. 18 is a perspective view illustrating a state in which the first surface of the first frame structure 310 is covered with the shield structure 300 according to various other example embodiments of the present disclosure, and FIG. 19 is a perspective view illustrating a state in which the first surface and side surface of the first frame structure 310, the side surface of the printed circuit board 180, and the side surface of the second frame structure 320 are covered with the shield structure 300 according to various other example embodiments of the present disclosure.

Figure 19:
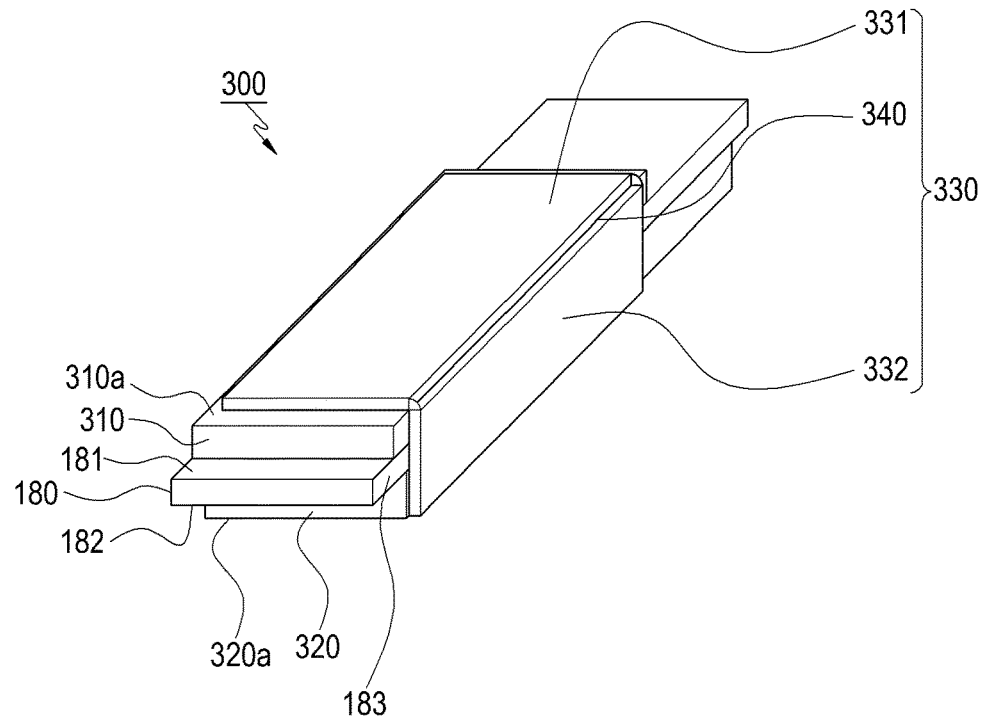
FIG. 19 is a perspective view illustrating a state in which the first surface and a side surface of the first frame structure, a side surface of a printed circuit board, and a side surface of a second frame structure are covered with the example shield structure according to various other example embodiments of the present disclosure.

Referring to FIGS. 18 to 19, for example, the first flexible sheet 330 may include first and second sheets 331 and 332. The first sheet 331 is configured to cover the opening 310b formed in the first surface 310a of the first frame structure 310. The second sheet 332 may be integrally formed on a side surface of the first sheet 331 to cover the side surface 183 of the printed circuit board 180 and the openings 310c and 320c formed in the side surfaces of the first and second frame structures 310 and 320.

As illustrated in FIG. 18, for example, the first sheet 331 covers the opening 310b of the first frame structure 310, and the second sheet 332 is bent by a bending portion 340 formed between the first and second sheets 331 and 332, which will be described below. In this example, as illustrated in FIG. 18, the second sheet 332 covers the side surface 183 of the printed circuit board 180 and the openings 310c and 320c formed in the side surfaces of the first and second frame structures 310 and 320.

The first flexible sheet 330 may include the first and second sheets 331 and 332, and the above-mentioned third sheet (not illustrated) that covers the opening (not illustrated) that is formed in the first surface 320a of the second frame structure 320 is not separately provided. Accordingly, the manufacturing cost may be reduced since the first flexible sheet 330 does not include the third sheet (not illustrated).

The bending portion 340 will be described in greater detail below. Referring to FIGS. 17 and 18 mentioned above, for example, the bending portion 340 may be formed between the first and second sheets 331 and 332 such that the second sheet 332, while being bent, may cover the side surface 183 of the printed circuit board 180 and the openings 310c and 320c formed in the side surfaces of the first and second frame structures 310 and 320.

In another example embodiment, the bending portion 340 may have a plurality of wrinkles formed therein for facilitating the bending of the second sheet 332.

The first and second sheets 331 and 332 may include a shielding film. Since the configurations of the first and second sheets 331 and 332 are the same as or similar to those of the first and second sheets 231 and 232 (illustrated in FIG. 4) that have already been described in the various embodiments of the present disclosure, a description thereof will be omitted.

Likewise, a description of the bending portion 340 will be omitted since the configuration of the bending portion 340 is the same as or similar to that of the bending portion 240 (illustrated in FIG. 4) that has already been described in the various embodiments of the present disclosure.

The operating process of the above-configured first flexible sheet 330 will be described in greater detail below. As illustrated in FIG. 17 mentioned above, the first flexible sheet 330 may include the first and second sheets 331 and 332 and the bending portion 340 provided between the first and second sheets 331 and 332.

The first sheet 331 covers the opening 310b of the first frame structure 310 provided on the first surface 181 of the printed circuit board 180. The second sheet 332 is bent at a right angle with respect to the first sheet 331 by the bending portion 340 formed at one end thereof to cover the side surface 183 of the printed circuit board 180 and the openings 310c and 320c formed in the side surfaces of the first and second frame structures 310 and 320. In this case, the second sheet 332 covers the openings 310c and 320c formed in the side surfaces of the first and second frame structures 310 and 320.

Accordingly, in the various example embodiments of the present disclosure, the first and second sheets 331 and 332 and the bending portion 340 are configured to surround the opening 310b formed in the first surface 310a of the first frame structure 310 in which the first electronic components 190 of the electronic device 10 are embedded, the openings 310c and 320c formed in the side surfaces of the first and second frame structures 310 and 320, and the side surface 183 of the printed circuit board 180, which makes it possible to remove a side wall formed on a side surface of an existing frame structure (e.g., a shield can) and to simultaneously reduce as much mounting space of the electronic components 190 as the removed space, thereby making the electronic device 10 smaller and slimmer. In addition, it is possible to mount the electronic components 190 in the space where the side wall is removed, thereby effectively utilizing the space of the product.

Likewise, a description of the second flexible sheet (not illustrated) will be omitted since the configuration of the second flexible sheet is the same as or similar to that of the first flexible sheet 330 (illustrated in FIG. 17) that has already been described.

According to various example embodiments of the present disclosure, an electronic device may include: a housing that includes a first surface directed in a first direction and a second surface directed in a second direction that is opposite to the first direction; a printed circuit board included in the housing, wherein the printed circuit board includes a first surface directed in the first direction and a second surface directed in the second direction; a first electronic component disposed on the first surface of the printed circuit board; a second electronic component disposed on the second surface of the printed circuit board; a first shield structure configured to electro-magnetically shield the first electronic component; and a second shield structure configured to electro-magnetically shield the second electronic component.

The first shield structure may include: a first frame structure that surrounds the first electronic component disposed on the first surface of the printed circuit board, wherein the first frame structure includes a first surface directed in the first direction and a first side surface that at least partially surrounds the space between the first surface of the first frame structure and the first surface of the printed circuit board; and a first flexible sheet that covers the first surface of the first frame structure and the first side surface.

The second shield structure may include: a second frame structure that surrounds the second electronic component disposed on the second surface of the printed circuit board, wherein the second frame structure includes a first surface directed in the second direction and a second side surface that at least partially surrounds the space between the first surface of the second frame structure and the second surface of the printed circuit board; and a second flexible sheet that covers the first surface and the second side surface of the second frame structure.

According to various example embodiments of the present disclosure, the flexible sheet may include: a first sheet that covers an opening formed in the first surface of the first frame structure; and a second sheet that extends from an edge of the first sheet and covers the side surface of the first frame structure, a side surface of the printed circuit board, and the side surface of the second frame structure.

According to various example embodiments of the present disclosure, a bending portion may be formed between the first and second sheets.

According to various example embodiments of the present disclosure, the sheet may include a shielding film.

The configuration of a shield structure 400 used in the electronic device 10, according to various other example embodiments of the present disclosure, will be described in greater detail below.

Figure 20:
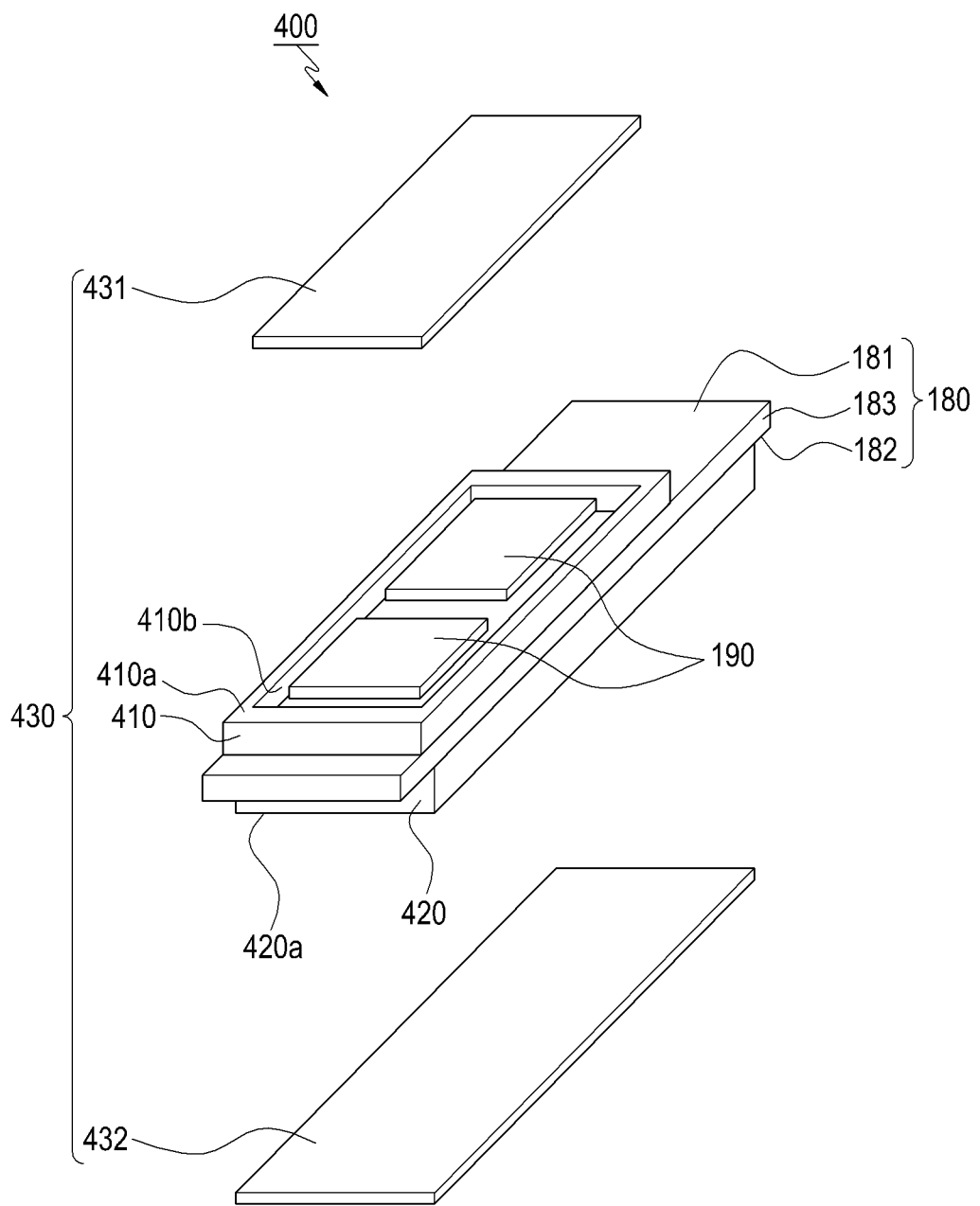
FIG. 20 is an exploded perspective view illustrating the configuration of an example shield structure according to various other example embodiments of the present disclosure.

FIG. 20 is an exploded perspective view illustrating the configuration of the shield structure 400 according to various other example embodiments of the present disclosure.

Referring to FIG. 20, the shield structure may include first and second shield structures, and the first shield structure 400 may include a printed circuit board 180, a first frame structure 410, and a first flexible sheet 431.

The printed circuit board 180 may include: a first surface 181 on which first electronic components 190 of the electronic device 10 are mounted; and a second surface 182 that is opposite to the first surface 181 and on which second electronic components (not illustrated) of the electronic device 10 are mounted.

The first frame structure 410 may be provided on the first surface 181 of the printed circuit board 180 to surround the first electronic components 190. The first frame structure 410 may include: a first surface directed in the first direction; and a first side surface that at least partially surrounds the space between the first surface of the first frame structure and the first surface of the printed circuit board.

A flexible sheet 430 may include first and second flexible sheets 431 and 432.

The first flexible sheet 431 may cover the first surface 410a formed at the upper side of the first frame structure 410 in order to prevent and/or reduce Electro-Magnetic Interference (EMI) of the first electronic components 190.

The flexible sheet 430 may be configured to cover the first surface 410a of the first frame structure 410 and a first surface 420a of a second frame structure 420 so that the flexible sheet 430 may further enhance the shielding function between the individual electronic components 190 instead of the frame structures and may prevent and/or reduce Electro-Magnetic Interference (EMI) between the electronic components 190.

The second shield structure may include the printed circuit board 180, the second frame structure 420, and the second flexible sheet 432. The second frame structure 420 may be provided on the second surface 182 of the printed circuit board 180 to surround the second electronic components (not illustrated). The second flexible sheet 432 may cover the first surface 420a formed at the lower side of the second frame structure 420 in order to prevent and/or reduce Electro-Magnetic Interference (EMI) of the second electronic components (not illustrated).

Figure 21:
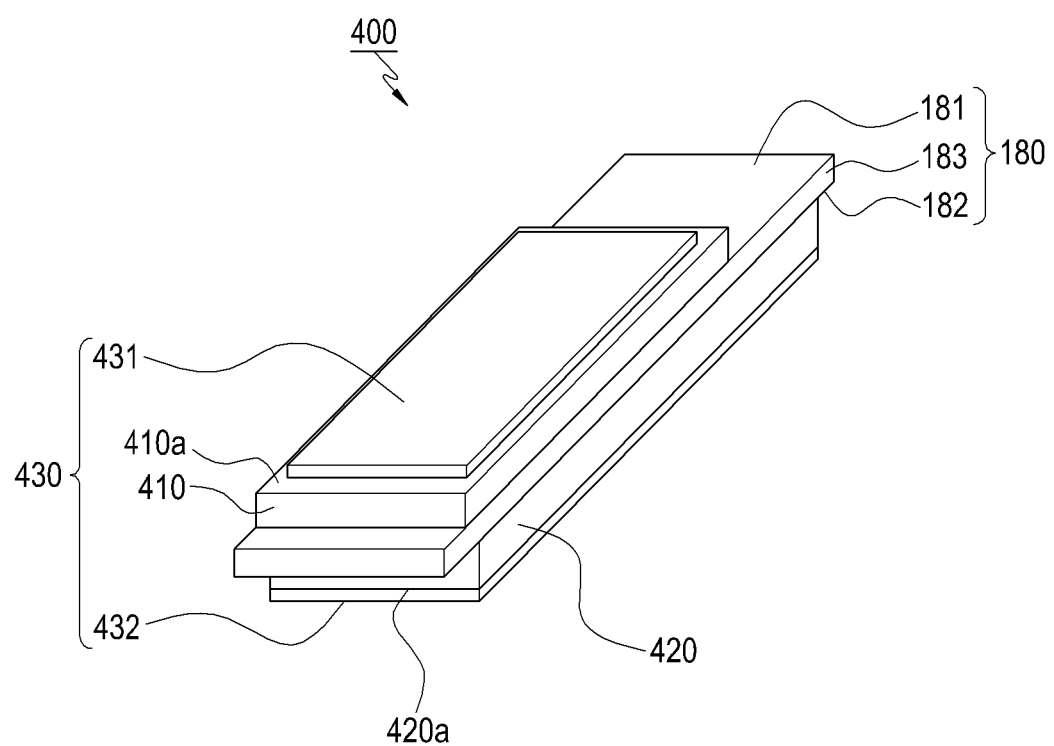
FIG. 21 is a perspective view illustrating a state in which first surfaces of first and second frame structures are covered with the example shield structure according to various other example embodiments of the present disclosure.

The flexible sheet 430 will be described in greater detail below. FIG. 21 is a perspective view illustrating a state in which the first surface 410a of the first frame structure 410 and the first surface 420a of the second frame structure 420 are covered with the shield structure 400 according to various other example embodiments of the present disclosure.

Referring to FIGS. 20 and 21, the first flexible sheet 431 may cover an opening 410b formed in the first surface 410a of the first frame structure 410. The second flexible sheet 432 may cover an opening (not illustrated) formed in the first surface 420a of the second frame structure 420.

For example, as illustrated in FIG. 21, the first flexible sheet 431 covers the opening 410b of the first frame structure 410, and the second flexible sheet 432 covers the opening (not illustrated) of the second frame structure 420.

Flexible sheets that cover the side surfaces of the first and second frame structures 410 and 420 and the side surface of the printed circuit board 180 are not provided. Accordingly, it is possible to reduce the manufacturing cost of the flexible sheet 430.

The first and second flexible sheets 431 and 432 may include a shielding film. Since the configurations of the first and second flexible sheets 431 and 432 are the same as or similar to those of the first and second sheets 231 and 232 (illustrated in FIG. 4) that have already been described in the various example embodiments of the present disclosure, a description thereof will be omitted.

The operating process of the above-configured first and second flexible sheets 431 and 432 will be described in greater detail. As illustrated in FIG. 19 mentioned above, for example, the first flexible sheet 431 covers the opening 410b of the first frame structure 410 provided on the first surface of the printed circuit board 180. The separate second flexible sheet 432 covers the opening (not illustrated) of the second frame structure 420. For example, the first and second flexible sheets 431 and 432 cover the first surface 410a formed at the upper side of the first frame structure 410 and the first surface 420a formed at the lower side of the second frame structure 420, respectively, while being separated from each other.

Accordingly, in the various example embodiments of the present disclosure, the first and second flexible sheets 431 and 432 are configured to cover the first surfaces 410a and 420a of the first and second frame structures 410 and 420 in which the electronic components 190 of the electronic device 10 are embedded, which makes it possible to prevent and/or reduce Electro-Magnetic Interference (EMI) between the electric components 190 and to further enhance the shielding function of the electronic device 10 accordingly.

According to various example embodiments of the present disclosure, an electronic device may include: a housing that includes a first surface directed in a first direction and a second surface directed in a second direction that is opposite to the first direction; a printed circuit board included in the housing, wherein the printed circuit board includes a first surface directed in the first direction and a second surface directed in the second direction; a first electronic component disposed on the first surface of the printed circuit board; a second electronic component disposed on the second surface of the printed circuit board; a first shield structure configured to electro-magnetically shield the first electronic component; and a second shield structure configured electro-magnetically shield the second electronic component.

The first shield structure may include: a first frame structure that surrounds the first electronic component disposed on the first surface of the printed circuit board, wherein the first frame structure includes a first surface directed in the first direction and a first side surface that at least partially surrounds the space between the first surface of the first frame structure and the first surface of the printed circuit board; and a first flexible sheet that covers the first surface of the first frame structure.

The second shield structure may include: a second frame structure that surrounds the second electronic component disposed on the second surface of the printed circuit board, wherein the second frame structure includes a first surface directed in the second direction and a second side surface that at least partially surrounds the space between the first surface of the second frame structure and the second surface of the printed circuit board; and a second flexible sheet that covers the first surface of the second frame structure.

According to various example embodiments of the present disclosure, the first flexible sheet may cover an opening formed in the first surface of the first frame structure, and the second flexible sheet may cover an opening formed in the first surface of the second frame structure.

According to various example embodiments of the present disclosure, the first and second flexible sheets may include a shielding film.

The configuration of a shield structure 500 used in the electronic device 10, according to various other example embodiments of the present disclosure, will be described in greater detail below.

Figure 22:
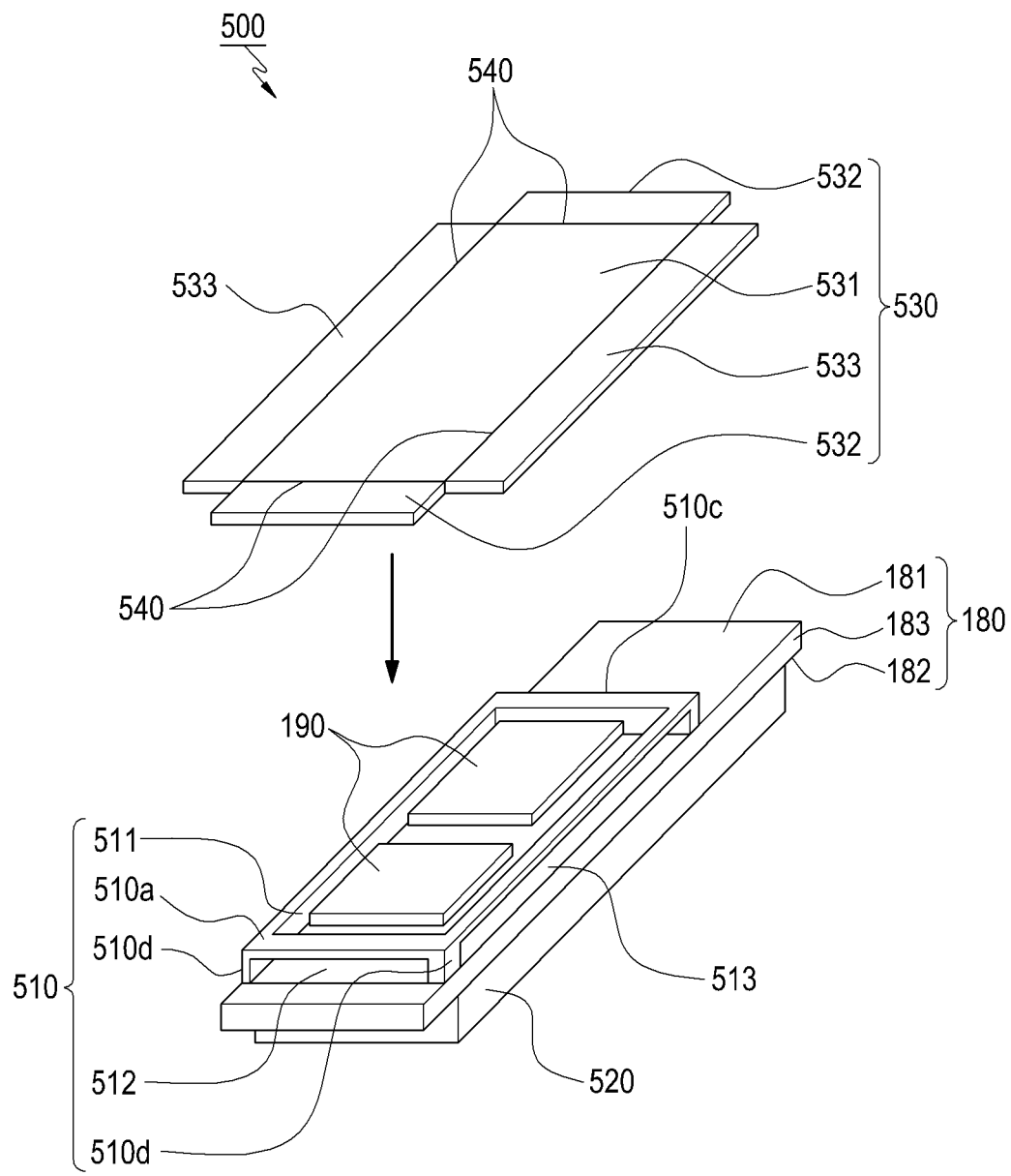
FIG. 22 is an exploded perspective view illustrating the configuration of an example shield structure according to various other example embodiments of the present disclosure.

FIG. 22 is an exploded perspective view illustrating the configuration of the shield structure 500 according to various other example embodiments of the present disclosure.

Referring to FIG. 22, for example, the shield structure 500 may include a printed circuit board 180, first and second frame structures 510 and 520, and a flexible sheet 530.

The printed circuit board 180 may include: a first surface 181 on which a plurality of electronic components 190 of the electronic device 10 are mounted; and a second surface 182 that is opposite to the first surface 181 and on which a plurality of electronic components 190 of the electronic device 10 are mounted.

The first frame structure 510 may be provided on the first surface 181 of the printed circuit board 180 such that the electronic components 190 may be embedded therein. The second frame structure 520 may be provided on the second surface 182 of the printed circuit board 180 such that the electronic components 190 may be embedded therein.

The flexible sheet 530 may selectively cover a first surface 510a, opposite longitudinal side surfaces, opposite lateral side surfaces of the first frame structure 510 and a side surface 183 of the printed circuit board 180 in order to prevent and/or reduce Electro-Magnetic Interference (EMI) of the individual electronic components 190.

At least one opening 512 may be formed in one longitudinal side surface of the first frame structure 510 by partially removing the longitudinal side surface of the first frame structure 510 in order to mount the electronic components 190.

At least one opening 513 may be formed in the opposite lateral side surfaces of the first frame structure 510 by partially removing the lateral side surfaces of the first frame structure 510 in order to mount the electronic components 190.

According to an example embodiment, the flexible sheet 530 may be bent to cover the first surface 510a of the first frame structure 510, the openings 512 and 513 formed in the side surfaces of the first frame structure, and the side surface 183 of the printed circuit board 180, which makes it possible to further enhance the shielding function between the individual electronic components 190 instead of the frame structures 510 and 520 and to prevent and/or reduce Electro-Magnetic Interference (EMI) between the electronic components 190. Furthermore, it is possible to remove a side wall formed on a side surface of an existing frame structure (e.g., a shield can) and simultaneously reduce as much mounting space of the electronic components 190 as the removed space, thereby making the electronic device 10 smaller and slimmer. In addition, it is possible to mount the electronic components 190 in the space where the side wall is removed, thereby effectively utilizing the space of the product.

Figure 23:
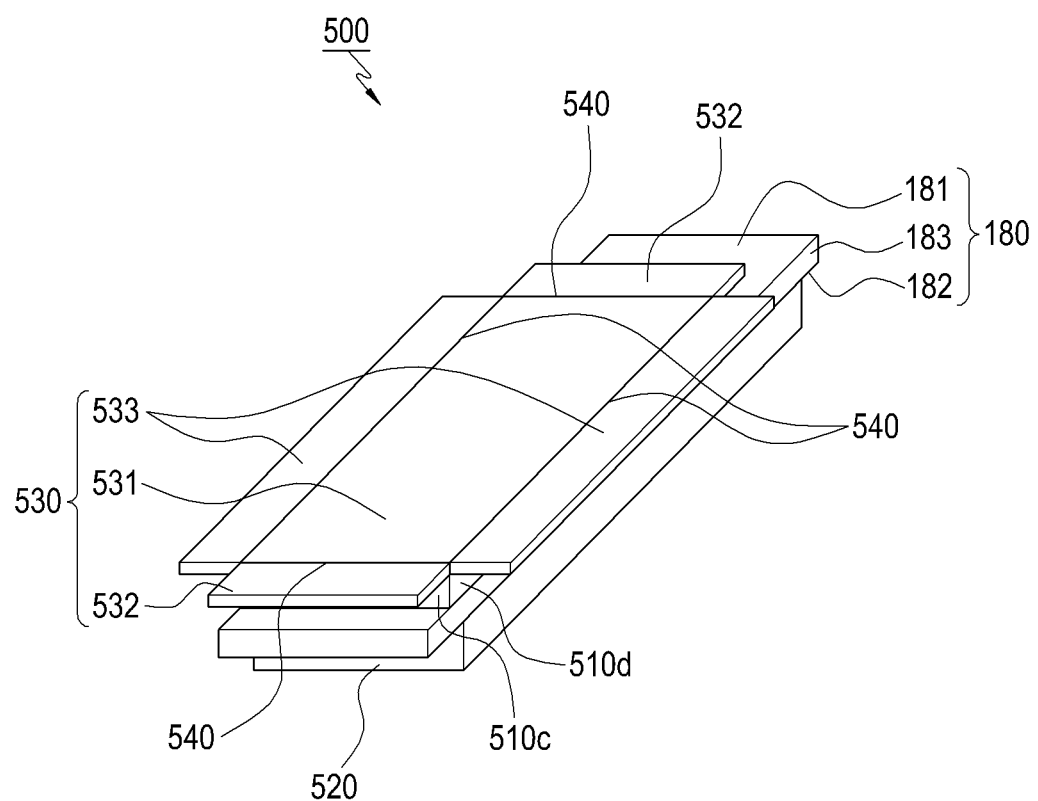
FIG. 23 is a perspective view illustrating a state in which a first surface of a first frame structure is covered with the example shield structure according to various other example embodiments of the present disclosure.

The flexible sheet 530 will be described in greater detail below. FIG. 23 is a perspective view illustrating a state in which the upper surface of the first frame structure 510 is covered with the shield structure 500 according to various other example embodiments of the present disclosure, and FIG. 24 is a perspective view illustrating a state in which first, second, and third surfaces of the first frame structure 510 and the side surface of the printed circuit board 180 are covered with the shield structure 500 according to various other example embodiments of the present disclosure.

Figure 24:
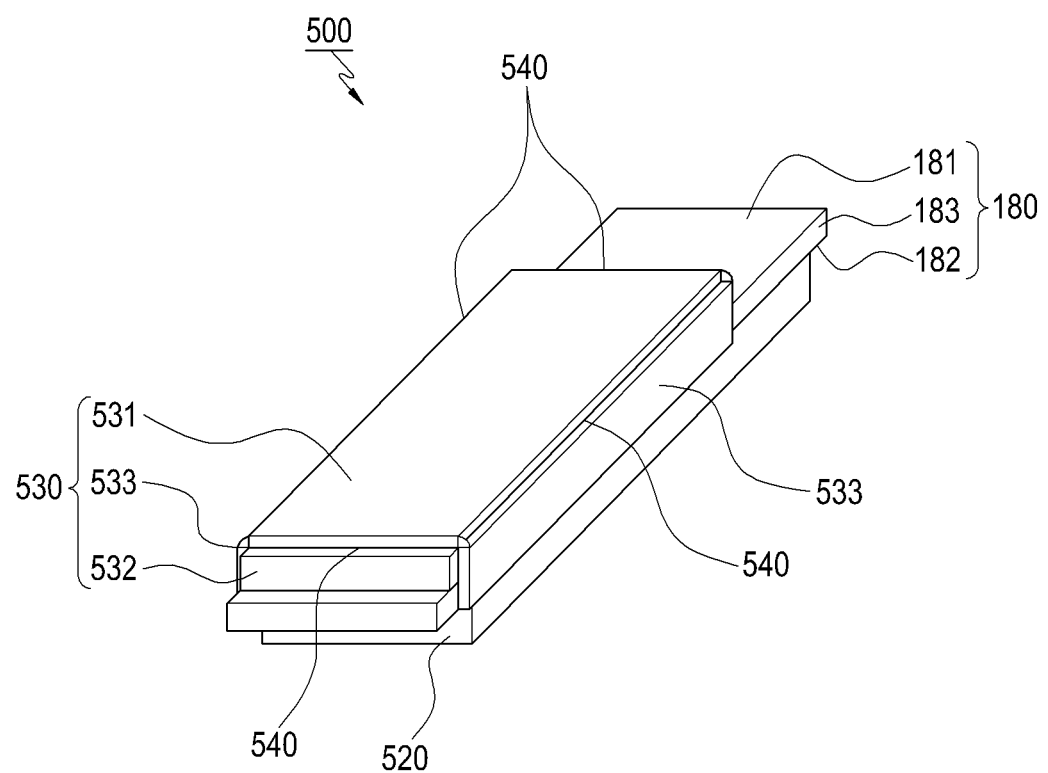
FIG. 24 is a perspective view illustrating a state in which the first surface and side surfaces of the first frame structure are covered with the example shield structure according to various other example embodiments of the present disclosure.

Referring to FIGS. 23 to 24, for example, the flexible sheet 530 may include first, second, and third sheets 531, 532, and 533.

The first sheet 531 is configured to cover an opening 511 that is formed in the first surface 510a of the first frame structure 510. The second sheets 532 may extend from the opposite longitudinal edges of the first sheet 531 such that the second sheets 532 are bent with respect to the first sheet 531 to cover the second surfaces 510c at the opposite longitudinal sides of the first frame structure 510. The third sheets 533 may extend from the opposite lateral edges of the first sheet 531 such that the third sheets 533 are bent with respect to the first sheet 531 to cover the third surfaces 510d at the opposite lateral sides of the first frame structure 510.

As illustrated in FIG. 23, the first sheet 531 covers the opening 511 formed in the first surface 510a of the first frame structure 510, and as illustrated in FIG. 24, the second sheets 532 are bent by bending portions 540 formed between the first sheet 531 and the second sheets 532, which will be described below. Since the second sheets 532 are integrally formed at the opposite longitudinal ends of the first sheet 531, the second sheets 532 are bent by the bending portions 540 to cover the second surfaces 510c formed at the opposite longitudinal sides of the first frame structure 510. In this case, the second sheets 532 cover the opening 512 formed in the second surface 510c.

Since the third sheets 533 are integrally formed at the opposite lateral sides of the first sheet 531 so as to be bent by the bending portions 540 formed between the first sheet 531 and the third sheets 533, the third sheets 533 cover the third surfaces 510d formed at the opposite lateral sides of the first frame structure 510 and the side surface 183 of the printed circuit board 180 when the third sheets 533 are bent by the bending portions 540. In this case, the third sheets 533 cover the openings 513 formed in the third surfaces 510d.

The bending portions 540 will be described in greater detail below. Referring to FIGS. 23 and 24 mentioned above, for example, the bending portions 540 may be formed between the first sheet 531 and the second and third sheets 532 and 533 such that the second and third sheets 532 and 533, while being bent, may cover the first, second, and third surfaces 510a, 510c, and 510d of the first frame structure 510 and the side surface 183 of the printed circuit board 180.

In another example embodiment, the bending portions 540 may have a plurality of wrinkles formed therein for facilitating the bending of the second and third sheets 532 and 533.

The first, second, and third sheets 531, 532, and 533 may include a shielding film. Since the configurations of the first, second, and third sheets 531, 532, and 533 are the same as or similar to those of the first, second, and third sheets 231, 232, and 233 (illustrated in FIG. 4) that have already been described in the various example embodiments of the present disclosure, a description thereof will be omitted.

Likewise, a description of the bending portions 540 will be omitted since the configuration of the bending portions 540 is the same as or similar to that of the bending portion 240 (illustrated in FIG. 4) that has already been described in the various example embodiments of the present disclosure.

The operating process of the above-configured flexible sheet 530 will be described in greater detail. As illustrated in FIG. 23 mentioned above, the flexible sheet 530 may include the first, second, and third sheets 531, 532, and 533 and the plurality of bending portions 540 provided between the first sheet 531 and the second and third sheets 532 and 533.

The first sheet 531 covers the opening 511 formed in the first surface 510a of the first frame structure 510. The second sheets 532 are bent at a right angle with respect to the first sheet 531 by the bending portions 540 to cover the second surfaces 510c formed at the opposite longitudinal sides of the first frame structure 510 and simultaneously cover the opening 512 formed in the second surface 510c. In this state, the third sheets 533 are bent at a right angle with respect to the first sheet 531 by the bending portions 540 to cover the third surfaces 510d formed at the opposite lateral sides of the first frame structure 510 and simultaneously cover the side surface 183 of the printed circuit board 180. In this case, the third sheets 533 cover the openings 513 formed in the third surfaces 510d of the first frame structure 510. For example, the flexible sheet 530 covers the first frame structure 510 provided on the first surface 181 of the printed circuit board 180, but does not cover the second frame structure 520 provided on the second surface 182 of the printed circuit board 180.

In another example embodiment, the flexible sheet 530 may not cover the first frame structure 510 provided on the first surface 181 of the printed circuit board 180, but may cover the second frame structure 520 provided on the second surface 182 of the printed circuit board 180 according to a selection.

As described above, the flexible sheet 530 may selectively cover the first and second frame structures 510 and 520 provided on the first and second surfaces 181 and 182 of the printed circuit board 180.

For example, the flexible sheet 530 may be configured to surround the first frame structure 510 provided on the first surface 181 of the printed circuit board 180 and the side surface 183 of the printed circuit board 180. On the other hand, according to a selection, the flexible sheet 530 may be configured to surround the second frame structure 520 provided on the second surface 182 of the printed circuit board 180 and the side surface 183 of the printed circuit board 180.

In yet another example embodiment, the flexible sheet 530 may be configured to surround the side surface of the printed circuit board 180 and both the first and second frame structures 510 and 520 provided on the first and second surfaces 181 and 182 of the printed circuit board 180.

Accordingly, in the various example embodiments of the present disclosure, the flexible sheet 530 may be configured to surround the side surface 183 of the printed circuit board 180 and the first, second, and third surfaces 510a, 510b, and 510c of the first frame structure 510 in which the electronic components 190 of the electronic device 10 are embedded, which makes it possible to remove a side wall formed on a side surface of an existing frame structure (e.g., a shield can) and to simultaneously reduce as much mounting space of the electronic components as the removed space, thereby making the electronic device 10 smaller and slimmer. In addition, it is possible to mount the electronic components 190 in the space where the side wall is removed, thereby effectively utilizing the space of the product.

According to various example embodiments of the present disclosure, an electronic device may include: a housing that includes a first surface directed in a first direction and a second surface directed in a second direction that is opposite to the first direction; a printed circuit board included in the housing, wherein the printed circuit board includes a first surface directed in the first direction and a second surface directed in the second direction; at least one electronic component disposed on the first surface of the printed circuit board; a shield structure configured to electromagnetically shield the at least one electronic component.

The shield structure may include: a first frame structure that surrounds at least some of the electronic components disposed on the first surface of the printed circuit board, wherein the first frame structure includes a first surface directed in the first direction and a plurality of side surfaces that at least partially surround the space between the first surface of the first frame structure and the first surface of the printed circuit board and are directed in different directions; and a flexible sheet that covers the first surface of the first frame structure and at least two of the plurality of side surfaces.

According to various example embodiments of the present disclosure, the flexible sheet may include: a first flexible sheet that covers an opening formed in the first surface of the first frame structure; a plurality of second flexible sheets that extend from the opposite longitudinal edges of the first flexible sheet and cover the second surfaces formed at the opposite longitudinal sides of the first frame structure; and a plurality of third flexible sheets that extend from the opposite lateral edges of the first flexible sheet and cover the third surfaces formed at the opposite lateral sides of the first frame structure and the side surface of the printed circuit board.

According to various example embodiments of the present disclosure, a plurality of bending portions may be formed between the first flexible sheet and the second and third flexible sheets to bend the second and third flexible sheets.

According to various example embodiments of the present disclosure, the first, second, and third flexible sheets may include a shielding film.

The configuration of a shield structure 600 used in the electronic device 10, according to various other example embodiments of the present disclosure, will be described in greater detail below.

Figure 25:
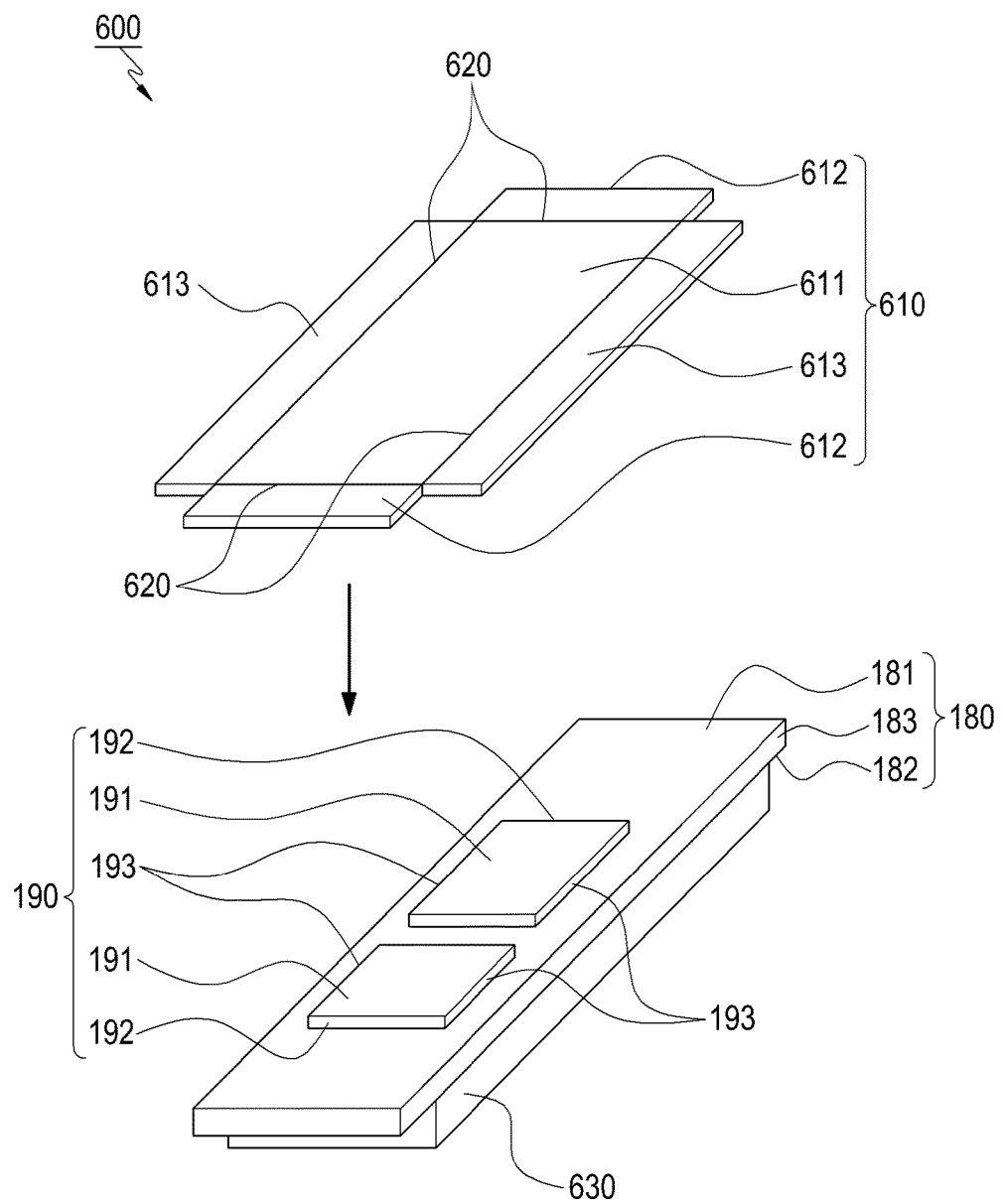
FIG. 25 is an exploded perspective view illustrating the configuration of an example shield structure according to various other example embodiments of the present disclosure.

FIG. 25 is an exploded perspective view illustrating the configuration of the shield structure 600 according to various other example embodiments of the present disclosure.

Referring to FIG. 25, for example, the shield structure 600 may include a printed circuit board 180, a frame structure 630, and a flexible sheet 610.

The printed circuit board 180 may include: a first surface 181 on which a plurality of electronic components 190 of the electronic device 10 are mounted; and a second surface 182 that is opposite to the first surface 181 and on which a plurality of electronic components 190 of the electronic device 10 are mounted.

The frame structure 630 may be provided on the second surface 182 of the printed circuit board 180 such that the electronic components 190 may be embedded in the frame structure 630.

The flexible sheet 610 may cover the electronic components 190 on the first surface 181 of the printed circuit board 180 in order to prevent and/or reduce Electro-Magnetic Interference (EMI) of the individual electronic components 190.

The flexible sheet 610, according to various example embodiments of the present disclosure, may be disposed to directly cover the electronic components 190 without the frame structure 630 provided on the first surface 181 of the printed circuit board 180.

According to an example embodiment, the flexible sheet 610 may be bent to cover the first surface 181 and the side surface 183 of the printed circuit board 180 so that the flexible sheet 610 may further enhance the shielding function between the individual electronic components 190 instead of the frame structure 630 and may prevent and/or reduce Electro-Magnetic Interference (EMI) between the electronic components 190. Furthermore, since an existing frame structure (e.g., a shield can) is not necessary, it is possible to reduce the manufacturing cost, to reduce as much mounting space of the electronic components 190 as the space of the removed frame structure, and to make the electronic device 10 smaller and slimmer.

Figure 26:
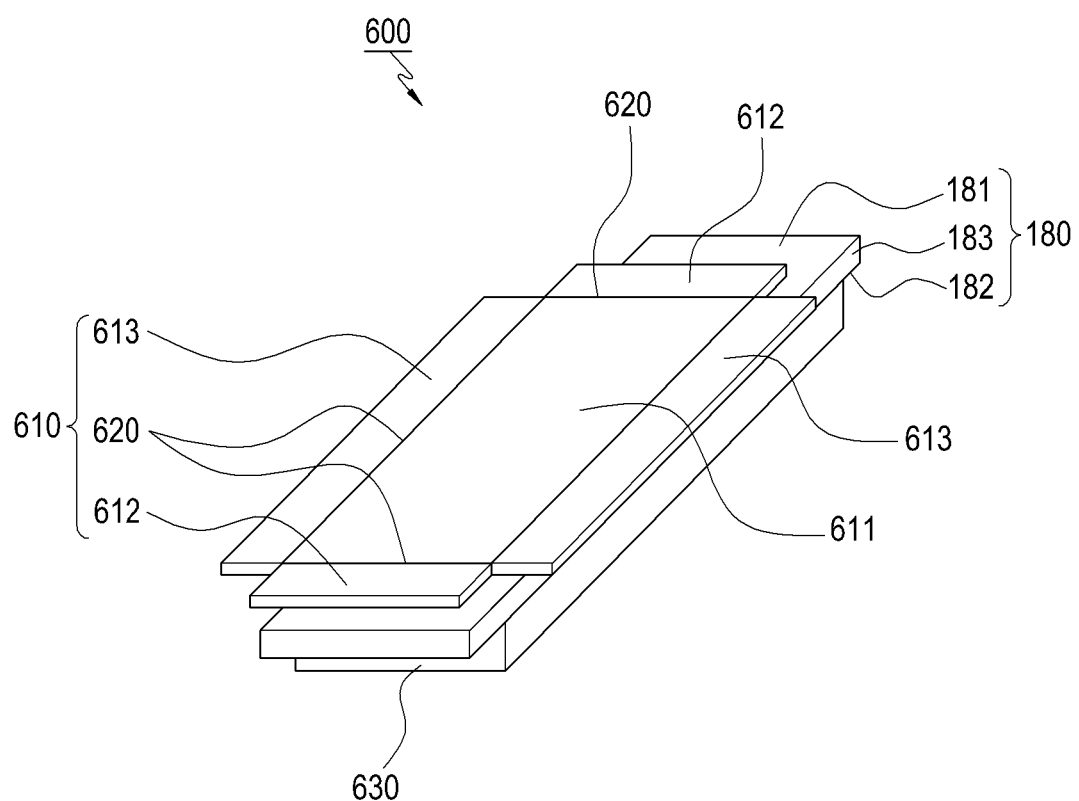
FIG. 26 is a perspective view illustrating a state in which first surfaces of a plurality of electronic components of an electronic device are covered with the example shield structure according to various other example embodiments of the present disclosure.

The flexible sheet 610 will be described in greater detail below. FIG. 26 is a perspective view illustrating a state in which the first surface of the printed circuit board 180 is covered with the shield structure 600 according to various other example embodiments of the present disclosure, and FIG. 27 is a perspective view illustrating a state in which the first surface and side surface of the printed circuit board 180 are covered with the shield structure 600 according to various other example embodiments of the present disclosure.

Figure 27:
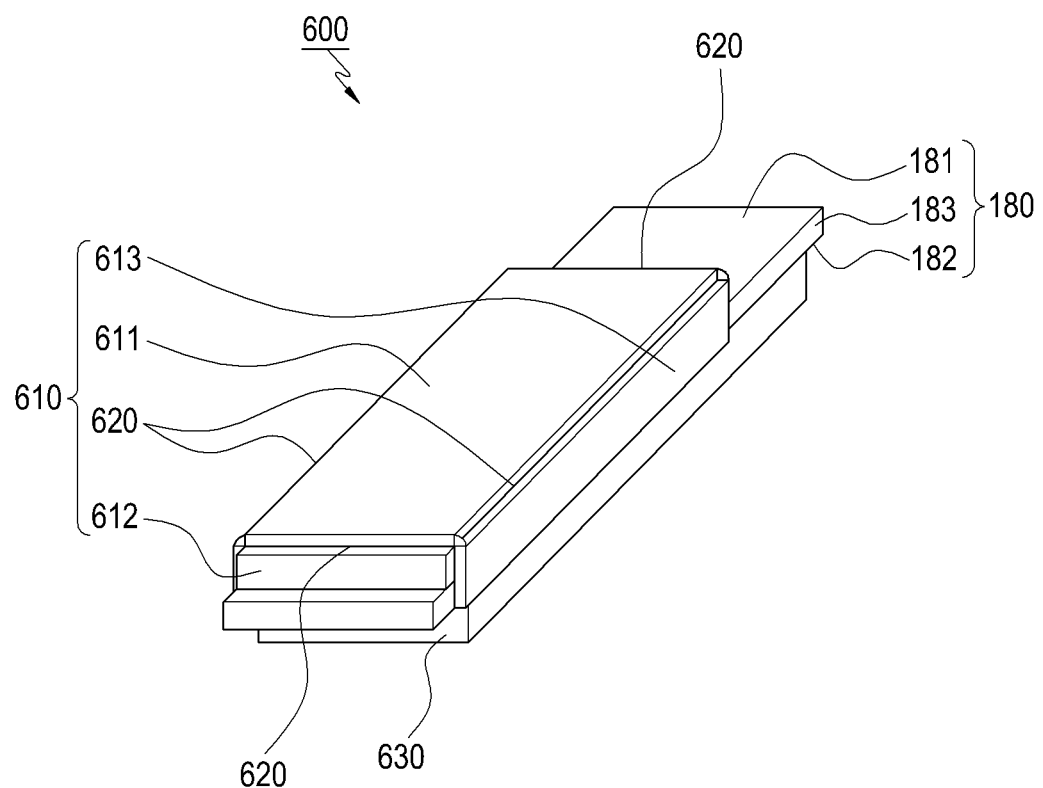
FIG. 27 is a perspective view illustrating a state in which first, second, and third surfaces of the plurality of electronic components of the electronic device are covered with the example shield structure according to various other example embodiments of the present disclosure.

Referring to FIGS. 26 to 27, for example, the flexible sheet 610 may include first, second, and third flexible sheets 611, 612, and 613.

The first flexible sheet 611 is configured to cover first surfaces 191 of the electronic components disposed on the first surface 181 of the printed circuit board 180. The second flexible sheets 612 may extend from the opposite longitudinal edges of the first flexible sheet 611 such that the second flexible sheets 612 are bent with respect to the first flexible sheet 611 to cover the outermost second surfaces 192 of the electronic components 190. The third flexible sheets 613 may extend from the opposite lateral edges of the first flexible sheet 611 such that the third flexible sheets 613 are bent with respect to the first flexible sheet 611 to cover third surfaces 193 formed at the opposite lateral sides of each electronic component 190 and the side surface 183 of the printed circuit board 180.

As illustrated in FIG. 26, the first flexible sheet 611 is provided above the first surface of the printed circuit board 180 and covers the first surfaces 191 of the electronic components 190 provided on the first surface 181 of the printed circuit board 180. As illustrated in FIG. 27, the second flexible sheets 612 are bent by bending portions 620 formed between the first flexible sheet 611 and the second flexible sheets 612, which will be described below. Since the second flexible sheets 612 are integrally formed at the opposite longitudinal ends of the first flexible sheet 611, the second flexible sheets 612 are bent by the bending portions 620 to cover the outermost second surfaces 192 of the electronic components 190.

Since the third flexible sheets 613 are integrally formed at the opposite lateral sides of the first flexible sheet 611 so as to be bent by the bending portions 620 formed between the first flexible sheet 611 and the third flexible sheets 613, the third flexible sheets 613 cover the third surfaces 193 formed at the opposite lateral sides of each electronic component 190 and the side surface 183 of the printed circuit board 180 when the third flexible sheets 613 are bent by the bending portions 620.

The bending portions 620 will be described in greater detail. Referring to FIGS. 25 to 27 mentioned above, for example, the plurality of bending portions 620 may be formed between the first flexible sheet 611 and the second and third flexible sheets 612 and 613 such that the second and third flexible sheets 612 and 613, while being bent, may cover the first, second, and third surfaces 191, 192, and 193 of the electronic components 190 and the side surface 183 of the printed circuit board 180.

In another example embodiment, the bending portions 620 may have a plurality of wrinkles formed therein for facilitating the bending of the second and third flexible sheets 612 and 613.

The first, second, and third flexible sheets 611, 612, and 613 may be constituted by a shielding film. Since the configurations of the first, second, and third flexible sheets 611, 612, and 613 are the same as or similar to those of the first, second, and third flexible sheets 231, 232, and 233 (illustrated in FIG. 4) that have already been described in the various embodiments of the present disclosure, a description thereof will be omitted.

Likewise, a description of the bending portions 620 will be omitted since the configuration of the bending portions 620 is the same as or similar to that of the bending portion 240 (illustrated in FIG. 4) that has already been described in the various embodiments of the present disclosure.

The operating process of the above-configured flexible sheet 610 will be described in greater detail. As illustrated in FIGS. 25 to 27 mentioned above, the flexible sheet 610 may include the first, second, and third flexible sheets 611, 612, and 613 and the plurality of bending portions 620 provided between the first flexible sheet 611 and the second and third flexible sheets 612 and 613.

The first flexible sheet 611 is provided above the first surface 181 of the printed circuit board 180 and directly covers the plurality of electronic components 190 provided on the first surface 181 of the printed circuit board 180. The second flexible sheets 612 are bent at a right angle with respect to the first flexible sheet 611 by the bending portions 620 to cover the outermost second surfaces 192 of the electronic components 190. In this state, the third flexible sheets 613 are bent at a right angle with respect to the first flexible sheet 611 by the bending portions 620 to cover the third surfaces 193 formed at the opposite lateral sides of each electronic component 190 and simultaneously cover the side surface 183 of the printed circuit board 180. Since the plurality of electronic components 190 of the electronic device 10 are mounted on the second surface 182 of the printed circuit board 180, the plurality of electronic components 190 provided on the second surface 812 are covered with the frame structure 630.

According to an example embodiment, the flexible sheet 610 may cover the plurality of electronic components 190 mounted on the first surface 181 of the printed circuit board 180, and the frame structure 630 may cover the plurality of electronic components 190 mounted on the second surface 182 of the printed circuit board 180 that is opposite to the first surface 181.

In another example embodiment, the flexible sheet 610 may directly cover the plurality of electronic components 190 mounted on the second surface 182 of the printed circuit board 180 without the frame structure 630. For example, the flexible sheet 610 may cover all the electronic components 190 mounted on the first and second surfaces 181 and 182 of the printed circuit board 180.

Accordingly, in the various example embodiments of the present disclosure, the first, second, and third sheets 611, 612, and 613 and the plurality of bending portions 620 are configured to surround the electronic components 190 of the electronic device 10 and the side surface of the printed circuit board 180 so that an existing frame structure (e.g., a shield can) is not necessary, which makes it possible to reduce the mounting space of the electronic components 190, to make the electronic device 10 smaller and slimmer, and to reduce the manufacturing cost of the product. Furthermore, it is possible to mount the electronic components 190 in the space where an existing frame structure (e.g., a shield can) is removed, thereby effectively utilizing the space of the product.

According to various example embodiments of the present disclosure, an electronic device may include: a housing that includes a first surface directed in a first direction and a second surface directed in a second direction that is opposite to the first direction; a printed circuit board included in the housing, wherein the printed circuit board includes a first surface directed in the first direction and a second surface directed in the second direction; one or more electronic components disposed on the first surface of the printed circuit board; and a shield structure configured to electro-magnetically shield the one or more electronic components, and the shield structure may include a flexible sheet having a structure configured to surround the electronic components and configured to cover the electronic components and surround the side surfaces of the electronic components when viewed from above the first surface of the printed circuit board.

According to various example embodiments of the present disclosure, the flexible sheet may include: a first flexible sheet that covers the first surfaces of the electronic components; a plurality of second flexible sheets that extend from the opposite longitudinal edges of the first flexible sheet and cover the outermost second surfaces of the electronic components; and a plurality of third flexible sheets that extend from the opposite lateral edges of the first flexible sheet and cover the third surfaces formed at the opposite lateral sides of each electronic component and the side surface of the printed circuit board.

According to various example embodiments of the present disclosure, the electronic device may further include a plurality of bending portions formed between the first flexible sheet and the second and third flexible sheets to bend the second and third flexible sheets.

According to various example embodiments of the present disclosure, the electronic device may further include a frame structure in which electronic components mounted on the second surface of the printed circuit board are embedded.

According to various example embodiments of the present disclosure, the first, second, and third flexible sheets may include a shielding film.

The configuration of a shield structure 700 used in the electronic device 10, according to various other example embodiments of the present disclosure, will be described in greater detail below.

Figure 28:
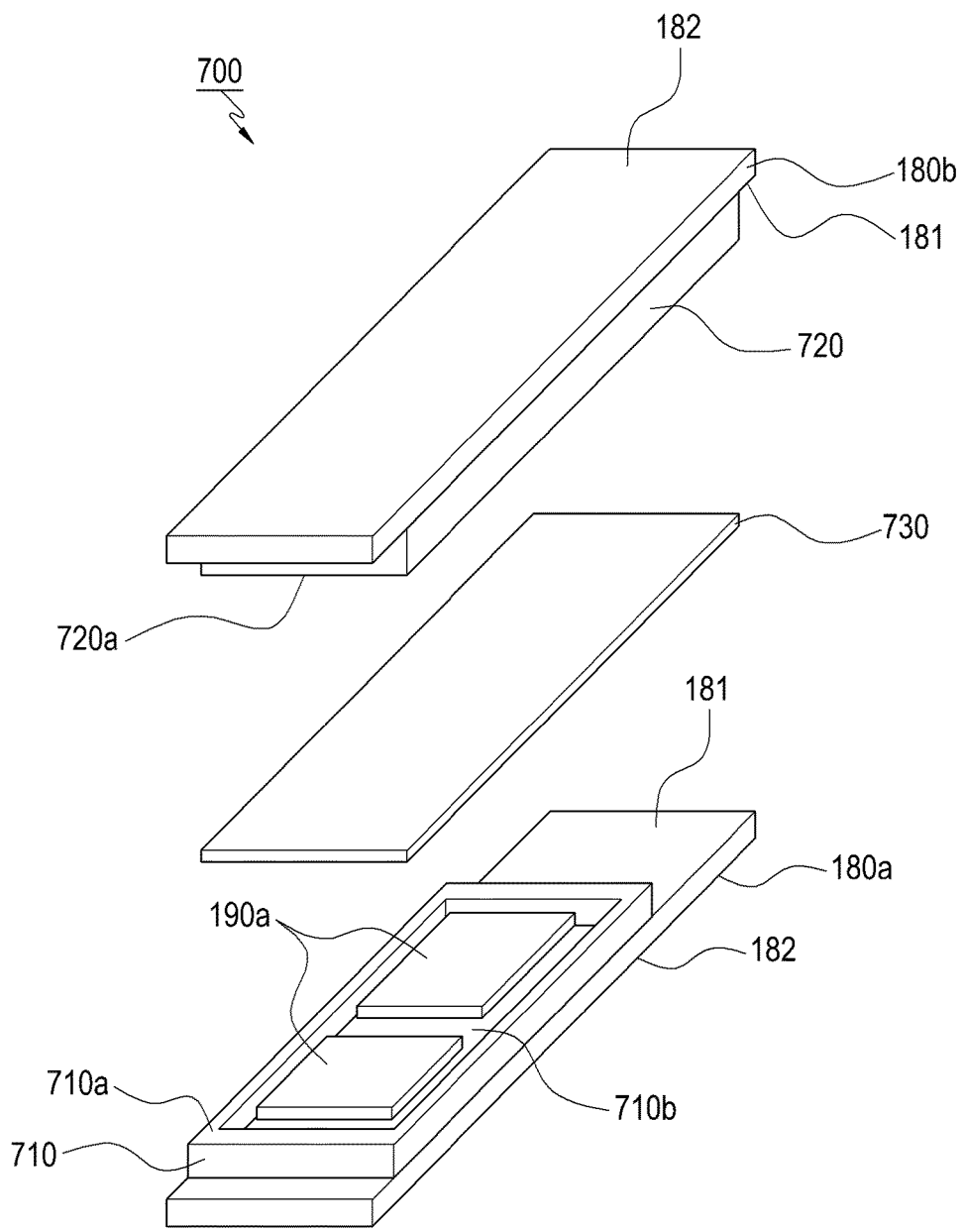
FIG. 28 is an exploded perspective view illustrating the configuration of an example shield structure according to various other example embodiments of the present disclosure.

FIG. 28 is an exploded perspective view illustrating the configuration of the shield structure 700 according to various other example embodiments of the present disclosure.

Referring to FIG. 28, for example, the shield structure 700 may include first and second printed circuit boards 180, first and second frame structures 710 and 720, and a flexible sheet 730.

The first printed circuit board 180a may include: a first surface 181 on which first electronic components 190a of the electronic device 10 are mounted; and a second surface 182 that is opposite to the first surface 181 and on which a plurality of first electronic components 190a of the electronic device 10 are not mounted.

The second printed circuit board 180b may include: a first surface 181 on which a plurality of second electronic components (not illustrated) of the electronic device 10 are mounted to face the first electronic components 190a; and a second surface 182 that is opposite to the first surface 181 and on which a plurality of second electronic components (not illustrated) of the electronic device 10 are not mounted.

The first frame structure 710 may be provided on the first surface 181 of the first printed circuit board 180a to surround the first electronic components 190a. The second frame structure 720 may be provided on the first surface 181 of the second printed circuit board 180b to surround the second electronic components (not illustrated).

The flexible sheet 730 may be disposed between the first and second frame structures 710 and 710 in order to prevent and/or reduce Electro-Magnetic Interference (EMI) of the individual electronic components.

According to an example embodiment, the flexible sheet 730 is disposed between the first and second frame structures 710 and 720 to cover openings 710b formed in the first surfaces 710a of the first and second frame structures 710 and 720.

For example, the single flexible sheet 730 is used in common to shield the first and second frame structures 710 and 720 provided on the stack-type printed circuit boards 180a and 180b, which makes it possible to reduce the manufacturing cost by decreasing the number of shield structures, to further enhance the shielding function between the electronic components 190, and to prevent and/or reduce Electro-Magnetic Interference (EMI) between the electronic components 190.

Figure 29:
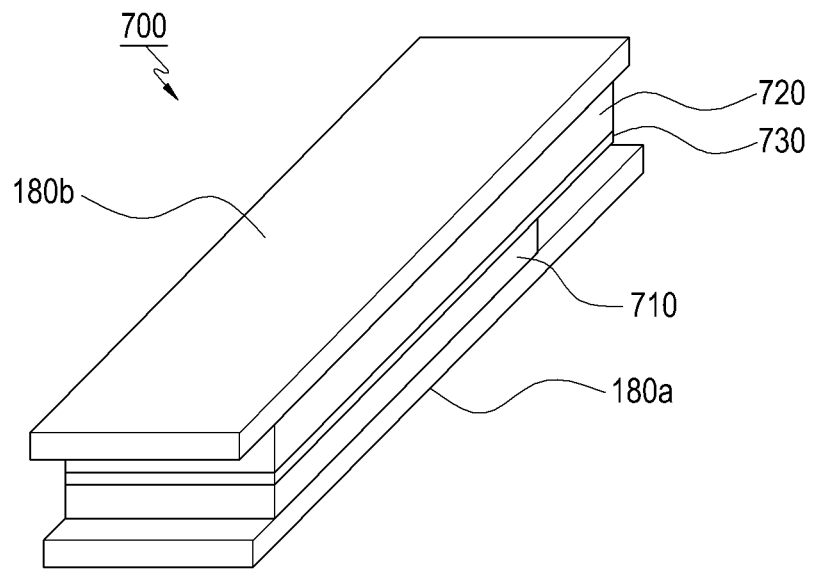
FIG. 29 is a perspective view illustrating a state in which the example shield structure, according to various other example embodiments of the present disclosure, is disposed between first and second frame structures.
Figure 30:
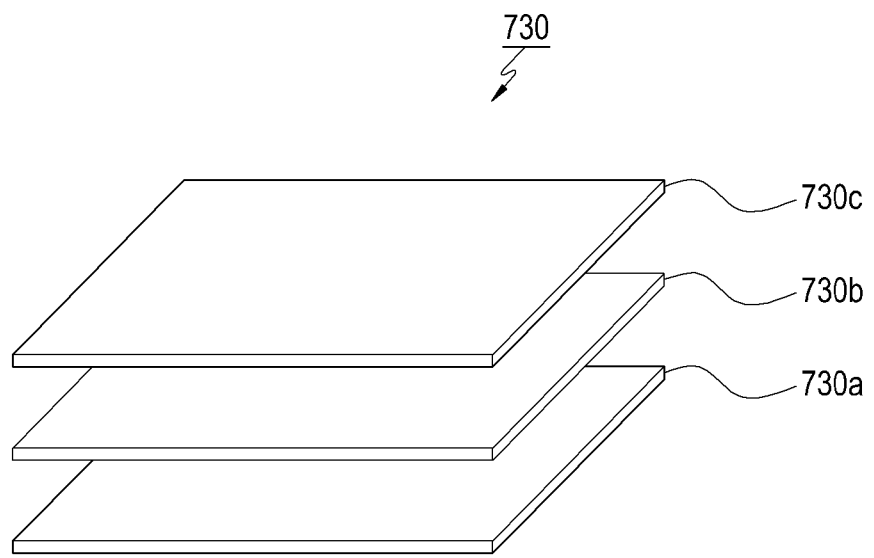
FIG. 30 is a perspective view illustrating the configuration of a flexible sheet among the elements of the example shield structure according to various other example embodiments of the present disclosure.

The flexible sheet 730 will be described below in greater detail. FIG. 29 is a perspective view illustrating a state in which the shield structure 700, according to various other example embodiments of the present disclosure, is disposed between the first and second frame structures 710 and 720, and FIG. 30 is a perspective view illustrating the configuration of the flexible sheet 730 among the elements of the shield structure 700 according to various other example embodiments of the present disclosure.

Referring to FIG. 29, the shield structure 700 may include the first and second printed circuit boards 180a and 180b, the first and second frame structures 710 and 720, and the flexible sheet 730.

The plurality of first electronic components 190a of the electronic device may be mounted on the first surface 181 of the first printed circuit board 180a and may be disposed within the first frame structure 710. The plurality of second electronic components (not illustrated) of the electronic device 10 may be mounted on the first surface 181 of the second printed circuit board 180b and may be disposed within the second frame structure 720.

The flexible sheet 730 may be provided between the first and second frame structures 710 and 720. For example, the flexible sheet 730 covers the openings formed in the first and second frame structures 710 and 720.

As illustrated in FIG. 30, the flexible sheet 730 may include first and second adhesive layers 730a and 730c and a metal layer 730b.

The first adhesive layer 730a may be provided on the metal layer 730b, which will be described below, such that the first adhesive layer 730a may be attached to the first surface 710a of the first frame structure 710. The metal layer 730b may be provided on the first adhesive layer 730a to shield electro-magnetic waves of the first and second electronic components. The second adhesive layer 730c may be provided on the metal layer 730b such that the second adhesive layer 730c may be attached to the first surface 720a at the lower side of the second frame structure 720.

The operating process of the above-configured flexible sheet 730 will be described in greater detail. As illustrated in FIG. 28 mentioned above, for example, the flexible sheet 730 may be provided between the first and second frame structures 710 and 720 on the first and second printed circuit boards 180a and 180b. The first and second frame structures 710 and 720 may be stacked to face each other, and the flexible sheet 730 may be interposed between the first surfaces 710a and 720a of the first and second frame structures 710 and 720.

In this example, the first adhesive layer 730a of the flexible sheet 730 may be attached to the first surface 710a of the first frame structure 710, and the second adhesive layer 730c of the flexible sheet 730 may be attached to the first surface 720a of the second frame structure 720.

Accordingly, the first adhesive layer 730a of the flexible sheet 730 is attached to the first surface 710a of the first frame structure 710 on the first printed circuit board 180a, and the second adhesive layer 730c of the flexible sheet 730 is attached to the first surface 720a of the second frame structure 720 on the second printed circuit board 180b.

As described above, in the various example embodiments of the present disclosure, the second frame structure 720 provided on the second printed circuit board 180b is stacked on the first frame structure 710 provided on the first printed circuit board 180a, and the single flexible sheet 730 is interposed between the first and second frame structures 710 and 720 so that the single flexible sheet 730 may be used in common for the two printed circuit boards 180a and 180b, thereby further enhancing the shielding function of the product and reducing the manufacturing cost of the product by decreasing the number of flexible sheets.

According to various example embodiments of the present disclosure, an electronic device may include: a housing that includes a first surface directed in a first direction and a second surface directed in a second direction that is opposite to the first direction; a first printed circuit board included in the housing and having a first electronic component mounted thereon; a second printed circuit board included in the housing and disposed to face the first printed circuit board and having a second electronic component mounted thereon to face the first electronic component; and a shield structure configured to electro-magnetically shield the first and second electronic components, and the shield structure may include: a first frame structure connected to the first printed circuit board to surround the first electronic component; a second frame structure connected to the second printed circuit board to surround the second electronic component; and a flexible sheet connected to the first and second frame structures and located between the first and second electronic components to electro-magnetically shield the first and second electronic components from each other.

According to various example embodiments of the present disclosure, the flexible sheet may include: a first adhesive layer attached to a first surface of the first frame structure; a metal layer provided on the first adhesive layer; and a second adhesive layer provided on the metal layer and attached to a first surface of the second frame structure.

According to various example embodiments of the present disclosure, the flexible sheet may serve as a shield bridge configured to electro-magnetically shield the electronic components on the first and second printed circuit boards.

According to various example embodiments of the present disclosure, the flexible sheet may include a shielding film.

The configuration of a shield structure 800 used in the electronic device 10, according to various other example embodiments of the present disclosure, will be described below in greater detail.

Figure 31:
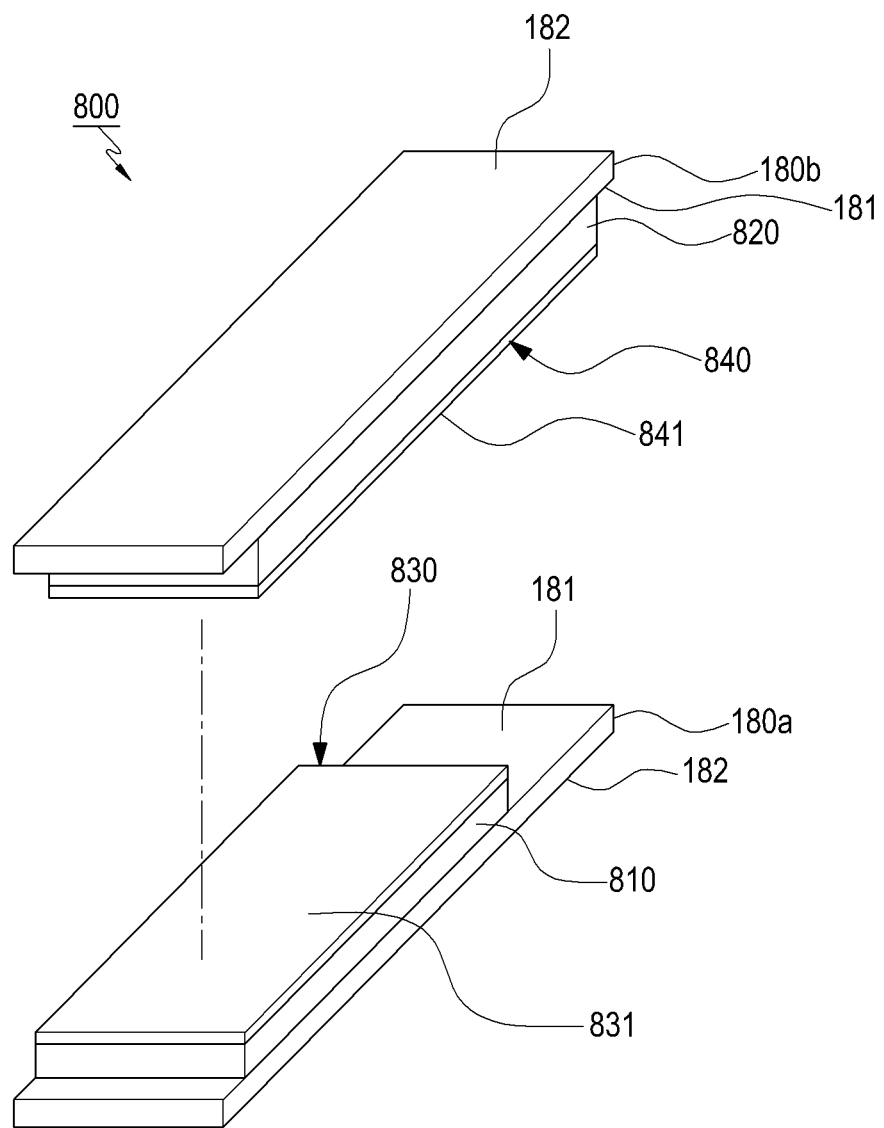
FIG. 31 is an exploded perspective view illustrating the configuration of an example shield structure according to various other example embodiments of the present disclosure.

FIG. 31 is an exploded perspective view illustrating the configuration of the shield structure 800 according to various other example embodiments of the present disclosure.

Referring to FIG. 31, for example, the shield structure 800 may include first and second printed circuit boards 180, first and second frame structures 810 and 820, and first and second flexible sheets 830 and 840.

The first printed circuit board 180a may include: a first surface 181 on which a plurality of first electronic components 190a of the electronic device 10 are mounted; and a second surface 182 that is opposite to the first surface 181 and on which a plurality of first electronic components 190a of the electronic device 10 are not mounted.

The second printed circuit board 180b may include: a first surface 181 on which a plurality of second electronic components (not illustrated) of the electronic device 10 are mounted to face the first electronic components 190a (illustrated in FIG. 33); and a second surface 182 that is opposite to the first surface 181 and on which a plurality of second electronic components (not illustrated) of the electronic device 10 are not mounted.

The first frame structure 810 may be provided on the first surface 181 of the first printed circuit board 180a such that the first electronic components 190a may be embedded therein.

The second frame structure 820 may be provided on the first surface 181 of the second printed circuit board 180b such that the second electronic components (not illustrated) may be embedded therein.

Figure 33:
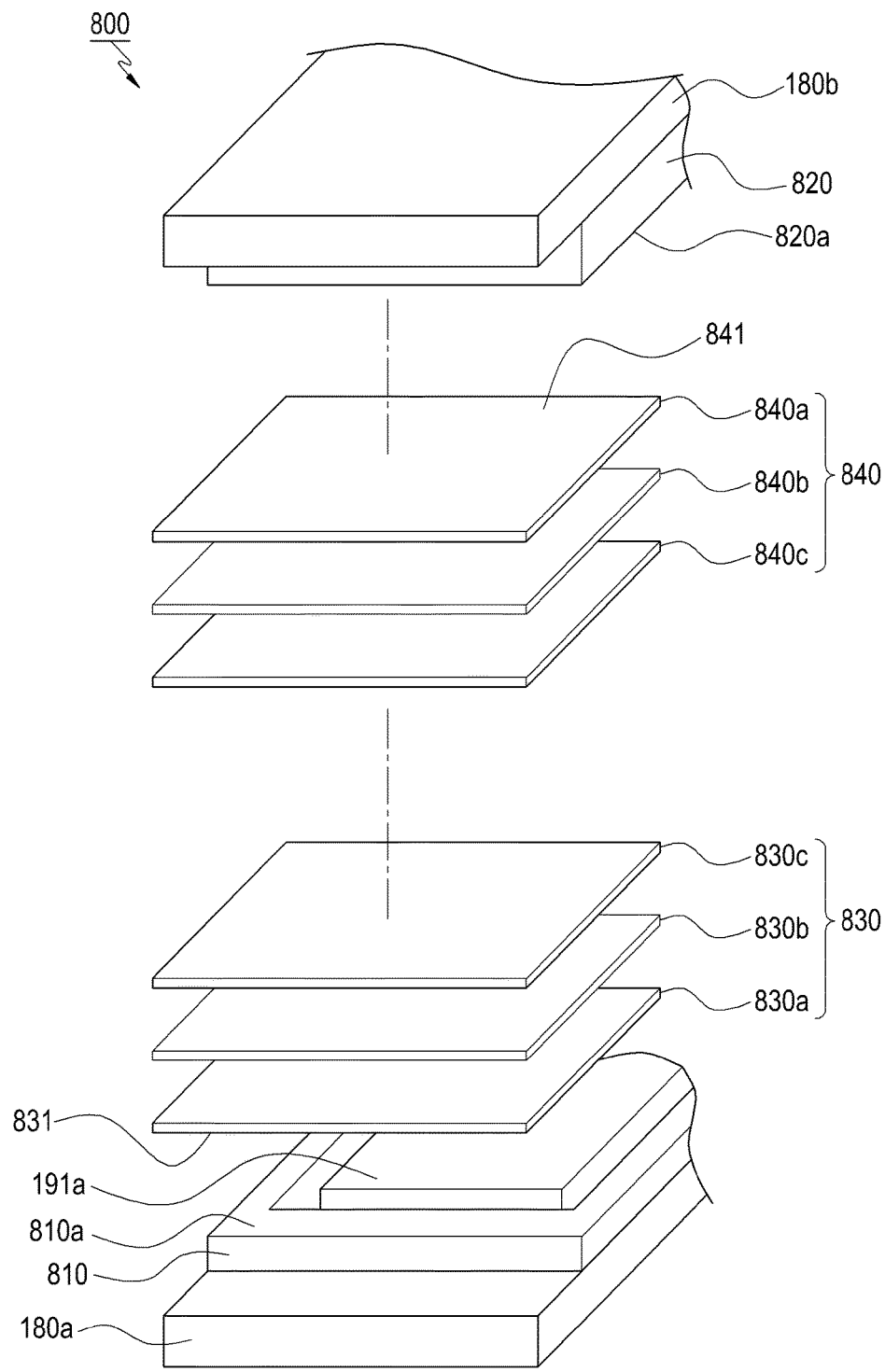
FIG. 33 is a perspective view illustrating the configurations of the first and second flexible sheets among the elements of the example shield structure according to various other example embodiments of the present disclosure.

The first flexible sheet 830 may be disposed on a first surface 810a (illustrated in FIG. 33) of the first frame structure 810 in order to prevent and/or reduce Electro-Magnetic Interference (EMI) of the first electronic components 190a (illustrated in FIG. 33). The second flexible sheet 840 may be disposed on a first surface 820a (illustrated in FIG. 33) of the second frame structure 820 in order to prevent and/or reduce Electro-Magnetic Interference (EMI) of the second electronic components (not illustrated).

According to an example embodiment, the first and second flexible sheets 830 and 840 are disposed between the first and second frame structures 810 and 820 to cover openings formed in the first and second frame structures 810 and 820.

For example, as illustrated in FIG. 33, the first and second flexible sheets 830 and 840 are provided on the first surfaces 810a and 820a of the first and second frame structures 810 and 820 on the two stack-type printed circuit boards 180a and 180b and are configured to be overlaid with each other, which makes it possible to further enhance the shielding function between the individual electronic components 190 and to prevent and/or reduce Electro-Magnetic Interference (EMI) between the electronic components 190. Furthermore, the first and second flexible sheets may be configured to be electrically connected with each other while being overlaid with each other, thereby further enhancing the shielding force of the product.

Figure 32:
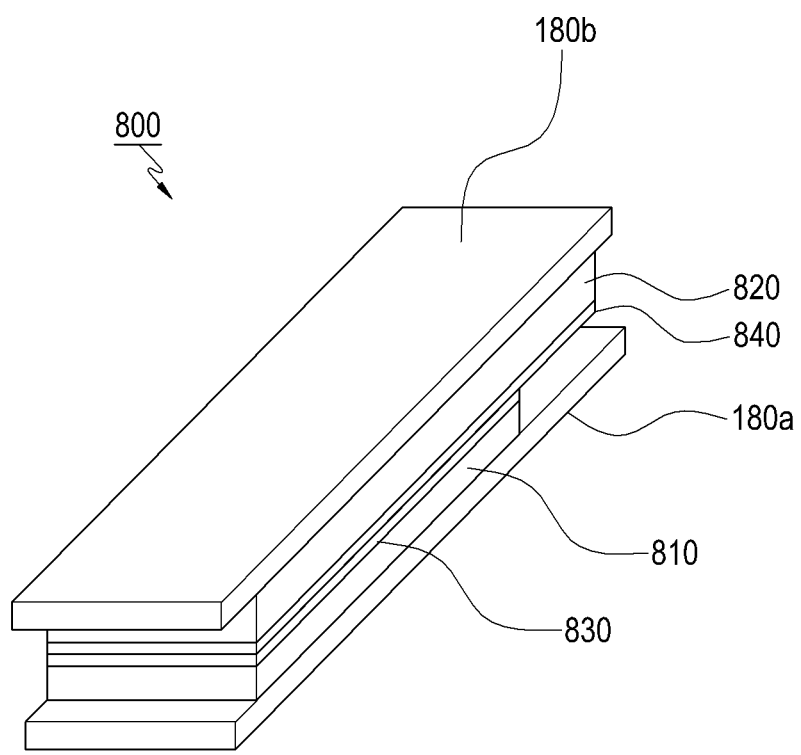
FIG. 32 is a perspective view illustrating first and second flexible sheets among the elements of the example shield structure according to various other example embodiments of the present disclosure.

The first and second flexible sheets 830 and 840 will be described below in greater detail. FIG. 32 is a perspective view illustrating a state in which the first and second flexible sheets 830 and 840 of the shield structure 800, according to various other example embodiments of the present disclosure, are disposed between the first and second frame structures 810 and 820, and FIG. 33 is a perspective view illustrating the configurations of the first and second flexible sheets 830 and 840 among the elements of the shield structure 800 according to various other example embodiments of the present disclosure.

Referring to FIG. 32, for example, the shield structure 800 may include the first and second printed circuit boards 180, the first and second frame structures 810 and 820, and the first and second flexible sheets 830 and 840.

The plurality of first electronic components 191a (illustrated in FIG. 33) of the electronic device 10 may be mounted on the first surface 181 of the first printed circuit board 180a and may be embedded in the first frame structure 810. In this state, the first flexible sheet 830 may cover the opening formed in the first surface 810a of the first frame structure 810.

The plurality of second electronic components (not illustrated) of the electronic device 10 may be mounted on the first surface 181 of the second printed circuit board 180b and may be embedded in the second frame structure 820. In this state, the second flexible sheet 840 may cover the opening formed in the first surface 820a of the second frame structure 820.

The first and second flexible sheets 830 and 840 cover the openings formed in the first and second frame structures 810 and 820.

As illustrated in FIG. 33, for example, the first flexible sheet 830 may include first and second adhesive layers 830a and 830c and a metal layer 830b.

The first adhesive layer 830a may be provided on the lower surface of the metal layer 830b, which will be described below, such that the first adhesive layer 830a may be attached to the first surface 810a of the first frame structure 810. The metal layer 830b may be provided on the upper surface of the first adhesive layer 830a to shield electro-magnetic waves of the first electronic components 191a. The second adhesive layer 830c may be provided on the upper surface of the metal layer 830b such that the second adhesive layer 830c may be attached to the second adhesive layer 840c of the second flexible sheet 840.

The second flexible sheet 840 may include first and second adhesive layers 840a and 840c and a metal layer 840b.

The first adhesive layer 840a may be provided on the upper surface of the metal layer 840b, which will be described below, such that the first adhesive layer 840a may be attached to the first surface 820a of the second frame structure 820.

The metal layer 840b may be provided on the lower surface of the first adhesive layer 840a to shield electromagnetic waves of the second electronic components 190b.

The second adhesive layer 840c may be provided on the lower surface of the metal layer 840b such that the second adhesive layer 840c may be attached to the second adhesive layer 830c of the first flexible sheet 830, which will be described below.

The operating process of the above-configured first and second flexible sheets 830 and 840 will be described in more detail. As illustrated in FIG. 31 mentioned above, the first flexible sheet 830 may be provided on the upper surface of the first frame structure 810 on the first printed circuit board 180a, and the second flexible sheet 840 may be provided on the lower surface of the second frame structure 820 on the second printed circuit board 180b. For example, the first and second flexible sheets 830 and 840 may be stacked on each other while facing each other.

In this example, the second adhesive layer 830c of the first flexible sheet 830 may be attached to the second adhesive layer 840c of the second flexible sheet 840, as illustrated in FIG. 32.

The first adhesive layer 830a of the first flexible sheet 830 is attached to the first surface 810a of the first frame structure 810, and the second adhesive layer 840c of the second flexible sheet 840 is attached to the first flexible sheet 830. The first and second flexible sheets 830 and 840 are overlaid with each other while facing each other. According to an embodiment, the second flexible sheet 840 is disposed on the first flexible sheet 830.

As described above, in the various embodiments of the present disclosure, the first flexible sheet 830 is provided on the first surface 810a of the first frame structure 810 on the first printed circuit board 180a, and the second flexible sheet 840 is provided on the first surface 820a of the second frame structure 820 on the second printed circuit board 180b such that the first and second flexible sheets 830 and 840 are overlaid with each other while facing each other at the same time that the first and second frame structures 810 and 820 on the first and second printed circuit boards 180a and 180b are stacked on each other. Accordingly, the shielding function of the product may be further enhanced by providing the first and second flexible sheets 830 and 840 on the first and second printed circuit boards 180a and 180b, respectively.

According to various example embodiments of the present disclosure, an electronic device may include: a housing that includes a first surface directed in a first direction and a second surface directed in a second direction that is opposite to the first direction; a first printed circuit board included in the housing, a plurality of first electronic components of the electronic device being mounted on the first printed circuit board; a second printed circuit board included in the housing, a plurality of second electronic components being mounted on the second printed circuit board to face the first electronic components; and a shield structure configured to electro-magnetically shield the first and second electronic components. The shield structure may include: a first frame structure connected to the first printed circuit board to surround the first electronic components; a second frame structure connected to the second printed circuit board to surround the second electronic components; a first flexible sheet connected to the first frame structure; and a second flexible sheet connected to the second frame structure, and the first and second flexible sheets may be disposed between the first and second electronic components and may face each other to electro-magnetically shield the first and second electronic components from each other.

According to various example embodiments of the present disclosure, the first flexible sheet may include: a first adhesive layer attached to a first surface of the first frame structure; a metal layer provided on the first adhesive layer; and a second adhesive layer attached the metal layer and attached to a second adhesive layer of the second flexible sheet.

According to various example embodiments of the present disclosure, the second flexible sheet may include: a first adhesive layer attached to a first surface of the second frame structure; a metal layer provided on the first adhesive layer; and the second adhesive layer attached the metal layer and attached to the second adhesive layer of the first flexible sheet.

According to various example embodiments of the present disclosure, the first and second flexible sheet may serve as shield bridges that electro-magnetically shield the electronic components on the first and second printed circuit boards.

According to various example embodiments of the present disclosure, the first and second flexible sheets may include a shielding film.

The configuration of a shield structure 900 used in the electronic device 10, according to various other example embodiments of the present disclosure, will be described below in greater detail.

Figure 34:
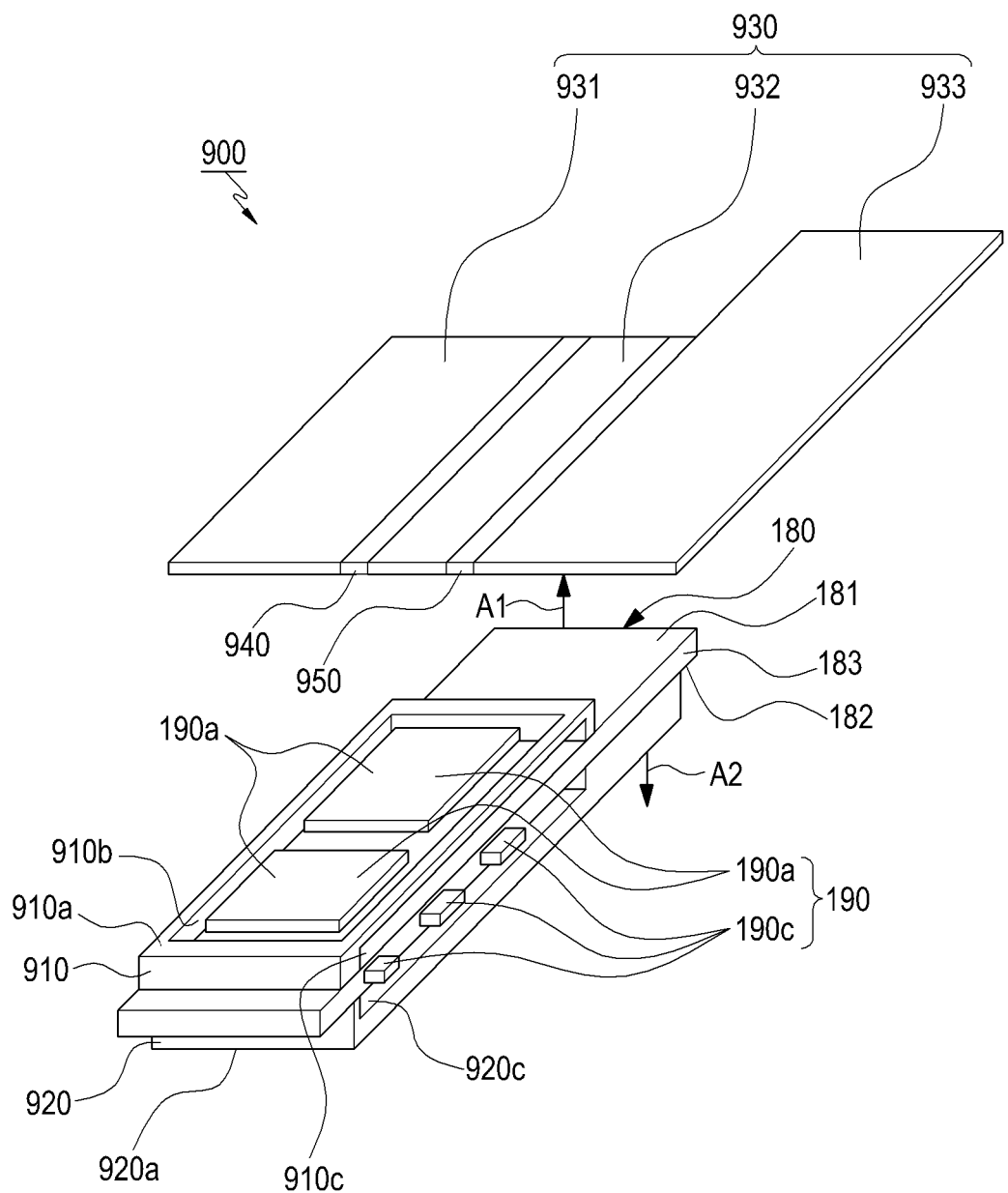
FIG. 34 is an exploded perspective view illustrating the configuration of an example shield structure according to various other example embodiments of the present disclosure.

FIG. 34 is a perspective view illustrating the configuration of the shield structure 900 according to various other example embodiments of the present disclosure.

Referring to FIG. 34, for example, the electronic device 10 may include the housing 10a (illustrated in FIG. 14) of the electronic device 10, a printed circuit board 180, and a shield structure 900.

The housing 10a may include the first surface 10b (illustrated in FIG. 14) that is directed in the first direction A1.

The printed circuit board 180 may include: a first surface 181 directed in the first direction A1 with one or more electronic components 190 mounted thereon; and a second surface 182 formed to be opposite to the first surface 181 and directed in the second direction A2, which is different from the first direction, with one or more electronic components 190 mounted thereon. One or more electronic components 190 may be disposed on a side surface 183 of the printed circuit board 180.

For example, one or more first electronic components 190a may be disposed on the first surface 181 of the printed circuit board 180, one or more second electronic components 190b may be disposed on the second surface 182 of the printed circuit board 180, and one or more third electronic components 190c may be disposed on the side surface 183 of the printed circuit board 180.

The shield structure 900 may be provided within the housing 10a of the electronic device 10 to electro-magnetically shield the one or more first and second electronic components 190a and 190b disposed on the first and second surfaces 181 and 182 of the printed circuit board 180 or the one or more third electronic components 190c disposed on the side surface 183 of the printed circuit board 180.

The shield structure 900 may include first and second frame structures 910 and 920 and a flexible sheet 930.

The first frame structure 910 may be provided on the first surface 181 of the printed circuit board 180 to surround at least some of the electronic components 190.

The second frame structure 920 may be provided on the second surface 182 of the printed circuit board 180 to surround at least some of the electronic components 190.

The flexible sheet 930 covers first surfaces 910a and 920a and side surfaces of the first and second frame structures 910 and 920 and the one or more third electronic components 190c disposed on the side surface 183 of the printed circuit board 180 in order to prevent and/or reduce Electro-Magnetic Interference (EMI) of the first and second electronic components 190a and 190b.

Openings 910b, 910c, 920b, and 920c may be formed in at least a part of the first surface 910a of the first frame structure 910, in at least a part of the first surface 920a of the second frame structure 920, and/or in the side surfaces of the first and second frame structures 910 and 920. The openings 910b, 910c, 920b, and 920c may form mounting spaces for mounting the electronic components 190.

According to an embodiment, the flexible sheet 930 is bent to cover the openings 910b, 910c, 920b, and 920c of the first and second frame structures 910 and 920 and the third electronic components disposed on the side surface 183 of the printed circuit board 180, which makes it possible to enhance the shielding function between the first and second electronic components 190a and 190b. In addition, the flexible sheet 930 covers and shields the third electronic components 190c disposed on the side surface 183 of the printed circuit board 180, which makes it possible to prevent and/or reduce Electro-Magnetic Interference (EMI) between the individual electronic components.

Figure 35:
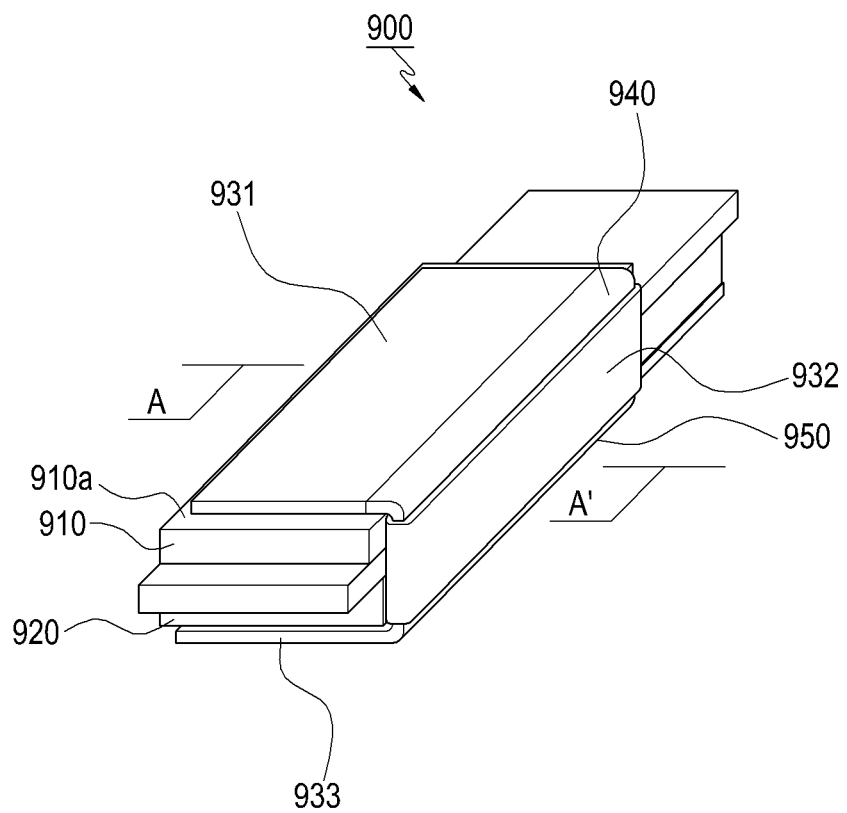
FIG. 35 is a perspective view illustrating the operating state of the example shield structure according to various other example embodiments of the present disclosure.

The flexible sheet 930 will be described below in greater detail. FIG. 35 is a perspective view illustrating the operating state of the shield structure according to various other example embodiments of the present disclosure, and FIG. 36 is a sectional view taken along line A-A' of FIG. 35.

Figure 36:
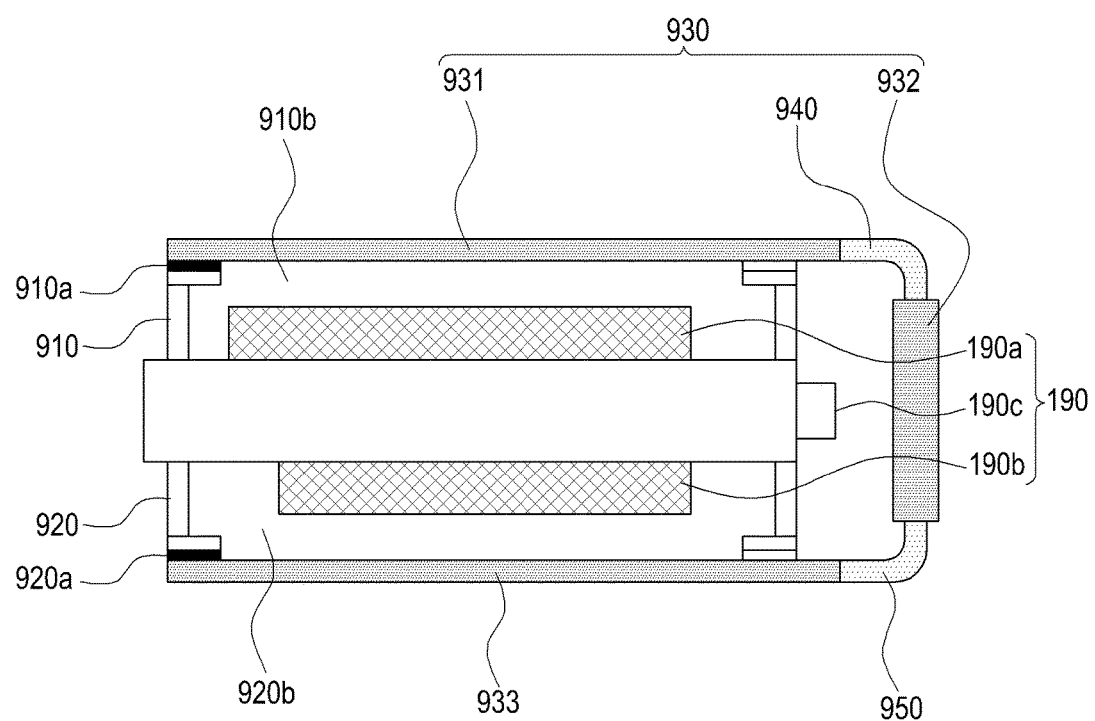
FIG. 36 is a sectional view taken along line A-A' of FIG. 35.

Referring to FIGS. 35 to 36, the flexible sheet 930 may include first, second, and third sheets 931, 932, and 933.

The first sheet 931 is configured to cover the opening 910b formed in the first surface 910a of the first frame structure 910.

The second sheet 932 may extend from a lateral side edge of the first sheet 931 and may be bent to cover the openings 910c and 920c formed in the side surfaces of the first and second frame structures 910 and 920 and the third electronic components 190c disposed on the side surface 183 of the printed circuit board 180.

The third sheet 933 may extend from a lateral side edge of the second sheet 932 and may be bent to cover the opening 920b formed in the first surface 920a of the second frame structure 920.

For example, as illustrated in FIG. 36, the first sheet 931 covers the opening 910a of the first frame structure 910, and the second sheet 932 is bent by a first bending portion 940 formed between the first and second sheets 931 and 932, which will be described below. In this example, the second sheet 932 covers the openings 910c and 920c formed in the side surfaces of the first and second frame structures 910 and 920 and the third electronic components 190c disposed on the side surface 183 of the printed circuit board 180. Further, the third sheet 933 is bent by a second bending portion 950 formed between the second and third sheets 932 and 933, which will be described below, to cover the opening 920b formed in the first surface 920a of the second frame structure 920.

The first and second bending portions 940 and 950 will be described below in greater detail.

Referring to FIG. 36 mentioned above, for example, the first bending portion 940 may be formed between the first and second sheets 931 and 932 in order to bend the second sheet 932 and simultaneously cover the side surfaces of the first and second frame structures 910 and 920 and the third electronic components 190c disposed on the side surface 183 of the printed circuit board 180.

The second bending portion 950 may be formed between the second and third flexible sheets 932 and 933 in order to bend the third sheet 933 and simultaneously cover the opening 920b formed in the first surface 920a of the second frame structure 920.

In another example embodiment, as illustrated in FIG. 36, the first and second bending portions 940 and 950 may be formed of a flexible material in order to facilitate the bending of the second and third sheets 932 and 933. In yet another embodiment, the first and second bending portions 940 and 950 may be formed of a shielding material in order to shield the third electronic components 190c disposed on the side surface 183 of the printed circuit board 180c.

When the flexible sheet 930 covers the first surfaces 910a and 920a and side surfaces of the first and second frame structures 910 and 920 and the side surface 183 of the printed circuit board 180, an opening (e.g., a gap) may be formed between the second sheet 932 of the flexible sheet 930 and the side surfaces of the first and second frame structures 910 and 920 or the side surface 183 of the printed circuit board 180, but the opening does not have a great effect on the prevention of Electro-Magnetic Interference (EMI) between the electronic components 190.

Figure 37:
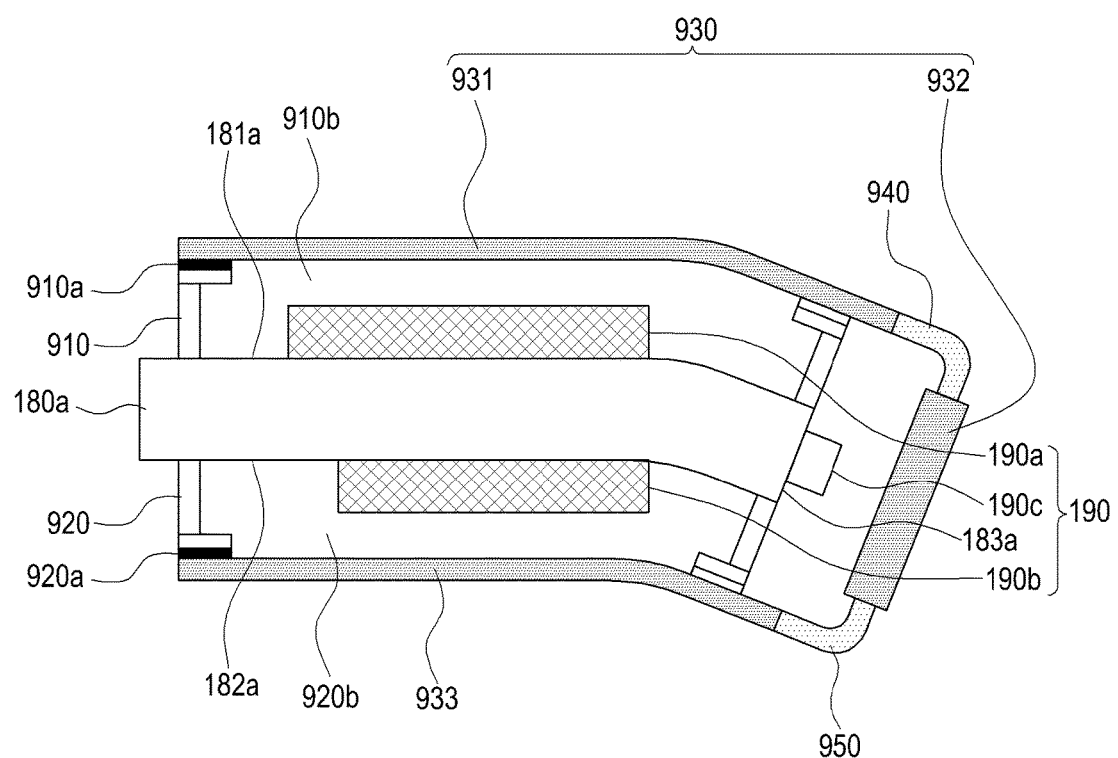
FIG. 37 is a side sectional view illustrating a state in which the example shield structure, according to various other example embodiments of the present disclosure, is applied to a flexible printed circuit board.

By way of example, FIG. 37 is a side sectional view illustrating a state in which the shield structure, according to various other example embodiments of the present disclosure, is applied to a flexible printed circuit board 180c.

As illustrated in FIG. 37, the printed circuit board 180 may include a flexible printed circuit board 180c. For example, one or more first electronic components 190a may be disposed on a first surface 181a of the flexible printed circuit board 180c, one or more second electronic components 190b may be disposed on a second surface 182a of the flexible printed circuit board 180c, and one or more third electronic components 190c may be disposed on a side surface 183a of the flexible printed circuit board 180c.

The shield structure 900 may include the first and second frame structures 910 and 920 and the flexible sheet 930.

The first frame structure 910 may be provided on the first surface 181a of the flexible printed circuit board 180c to surround at least some of the electronic components 190.

The second frame structure 920 may be provided on the second surface 182a of the flexible printed circuit board 180c to surround at least some of the electronic components 190.

The flexible sheet 930 covers the first surfaces 910a and 920a and side surfaces of the first and second frame structures 910 and 920 and the one or more third electronic components 190c disposed on the side surface of the flexible printed circuit board 180c in order to prevent and/or reduce Electro-Magnetic Interference (EMI) of the individual electronic components 190.

The flexible sheet 930 may be curved together with the flexible printed circuit board 180c. The curved flexible sheet 930 may include the first, second, and third flexible sheets 931, 932, and 933. The first, second, and third flexible sheets may also be curved together.

The curved first flexible sheet 931 is configured to cover the opening 910b formed in the first surface 910a of the first frame structure 910. The curved second flexible sheet 932 may extend from a lateral side edge of the first flexible sheet 931 and may be bent to cover the openings 910c and 920c formed in the side surfaces of the first and second frame structures 910 and 920 and the third electronic components 190c disposed on the side surface 183a of the curved flexible printed circuit board 180c. The curved third flexible sheet 933 may extend from a lateral side edge of the second flexible sheet 932 and may be bent to cover the opening 920b formed in the first surface 920a of the second frame structure 920.

Accordingly, the flexible sheet 930 may be applied to the flexible printed circuit board 180c to be curved, as well as the printed circuit board 180 that is inflexible.

According to various example embodiments of the present disclosure, an electronic device may include: a housing that includes a first surface directed in a first direction; a first printed circuit board included in the housing, wherein the first printed circuit board includes a first surface directed in the first direction and a second surface directed in a second direction that is different from the first direction; an electronic component disposed on at least one of the first and second surfaces of the printed circuit board and a side surface of the printed circuit board; and a shield structure configured to electro-magnetically shield the electronic component, and the shield structure may include: a first frame structure that surrounds at least a part of the electronic component that is disposed on at least one of the first and second surfaces and side surface of the printed circuit board; and a flexible sheet that at least partially surrounds the first frame structure and the electronic component.

According to various example embodiments of the present disclosure, the flexible sheet may include: a first flexible sheet that covers an opening formed in the first surface of the first frame structure; a second flexible sheet that extends from an edge of the first flexible sheet and covers a side surface of the first frame structure and the electronic component disposed on the side surface of the printed circuit board; and a third flexible sheet that extends from an edge of the second flexible sheet and covers an opening formed in the first surface of the second frame structure.

According to various example embodiments of the present disclosure, a first bending portion may be formed between the first and second flexible sheets to bend the second flexible sheet, and a second bending portion may be formed between the second and third flexible sheets to bend the third flexible sheet.

According to various example embodiments of the present disclosure, the first, second, and third flexible sheets may be constituted by a shielding film.

According to various example embodiments of the present disclosure, the printed circuit board may include a flexible printed circuit board.

A process method for the shield structure 200 (illustrated in FIG. 4) that is used in the electronic device 10, according to various example embodiments of the present disclosure, will be described below in greater detail.

Figure 38:
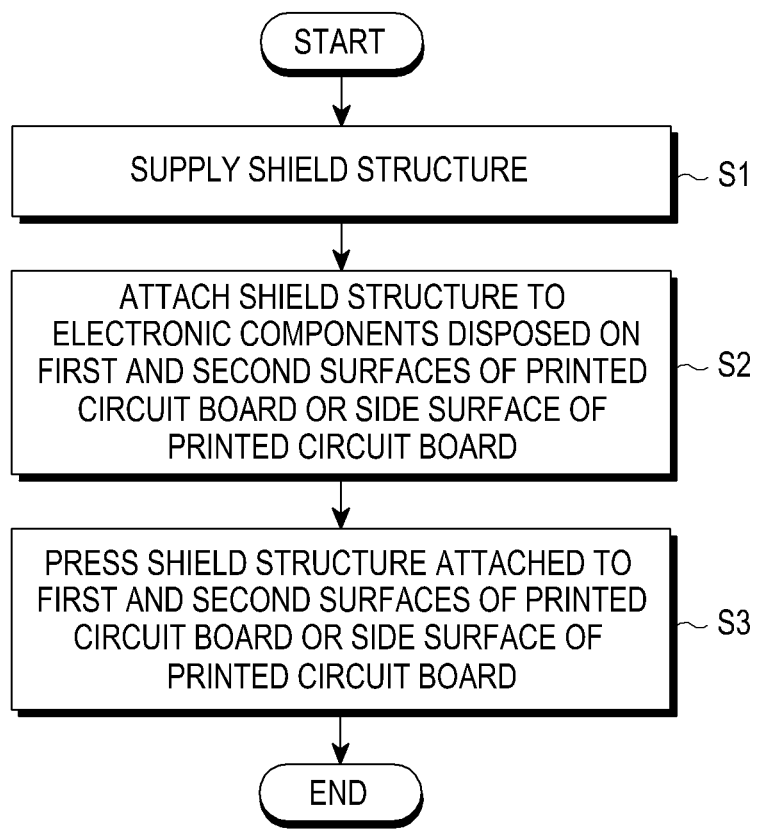
FIG. 38 is a flowchart illustrating an example process method for a shield structure according to various example embodiments of the present disclosure.

FIG. 38 is a flowchart illustrating an example process method for the shield structure 200 (illustrated in FIG. 4) according to various example embodiments of the present disclosure.

Referring to FIG. 38, for example, the housing 10a may include: the first surface 10b (illustrated in FIG. 14) that is directed in the first direction A1 and the second surface 10c (illustrated in FIG. 14) that is directed in the second direction A2 opposite to the first direction A1, and the printed circuit board 180 may be provided in the housing 10a. The printed circuit board 180 may include: the first surface 181 directed in the first direction A1 with one or more electronic components 190 mounted thereon; and the second surface 182 that is opposite to the first surface 181 and is directed in the second direction A2 with one or more electronic components 190 mounted thereon. One or more electronic components may be disposed on the side surface 183 of the printed circuit board 180.

In this state, the shield structure 200 may be supplied in order to electro-magnetically shield the one or more electronic components disposed on the first and second surfaces 181 and 182 of the printed circuit board 180 or on the side surface 183 of the printed circuit board 180, and the supplied shield structure may move toward the electronic components 190 disposed on the first and second surfaces 181 and 182 of the printed circuit board 180 or on the side surface 183 of the printed circuit board 180 (Step S1).

The shield structure 200, which has moved toward the electronic components in step S1, may be attached to cover the electronic components disposed on the first and second surfaces 181 and 182 of the printed circuit board 180 or on the side surface 183 of the printed circuit board 180 (Step S2).

A pressure may be applied to the shield structure 200 that has been attached, in step S2, to the electronic components 190 disposed on the first and second surfaces 181 and 182 of the printed circuit board 180 or on the side surface 183 of the printed circuit board 180 (Step S3).

In the pressing operation, the shield structure 200 may be attached with heat or pressure applied thereto. Accordingly, it is possible to strengthen the bonding force between the shield structure 200 and the first and second surfaces 181 and 182 of the printed circuit board 180 or the side surface 183 of the printed circuit board 180.

The process method for the shield structure, according to the various example embodiments of the present disclosure, may also be applied to the various other example embodiments of the present disclosure mentioned above. Accordingly, descriptions of process methods for the shield structures, according to various example embodiments of the present disclosure, will be omitted.

According to various example embodiments of the present disclosure, a method for manufacturing an electronic device may include: attaching a shield structure to first and second surfaces of a printed circuit board included in the electronic device and to a side surface of the printed circuit board such that the shield structure covers one or more electronic components disposed on the first and second surfaces and the side surface of the printed circuit board to electro-magnetically shield the one or more electronic components; and pressing the shield structure attached to the first and second surfaces of the printed circuit board or to the side surface of the printed circuit board.

According to various example embodiments of the present disclosure, the bonding force of the shield structure may be strengthened by heat or pressure applied thereto in the operation of pressing the shield structure.

Figure 39:
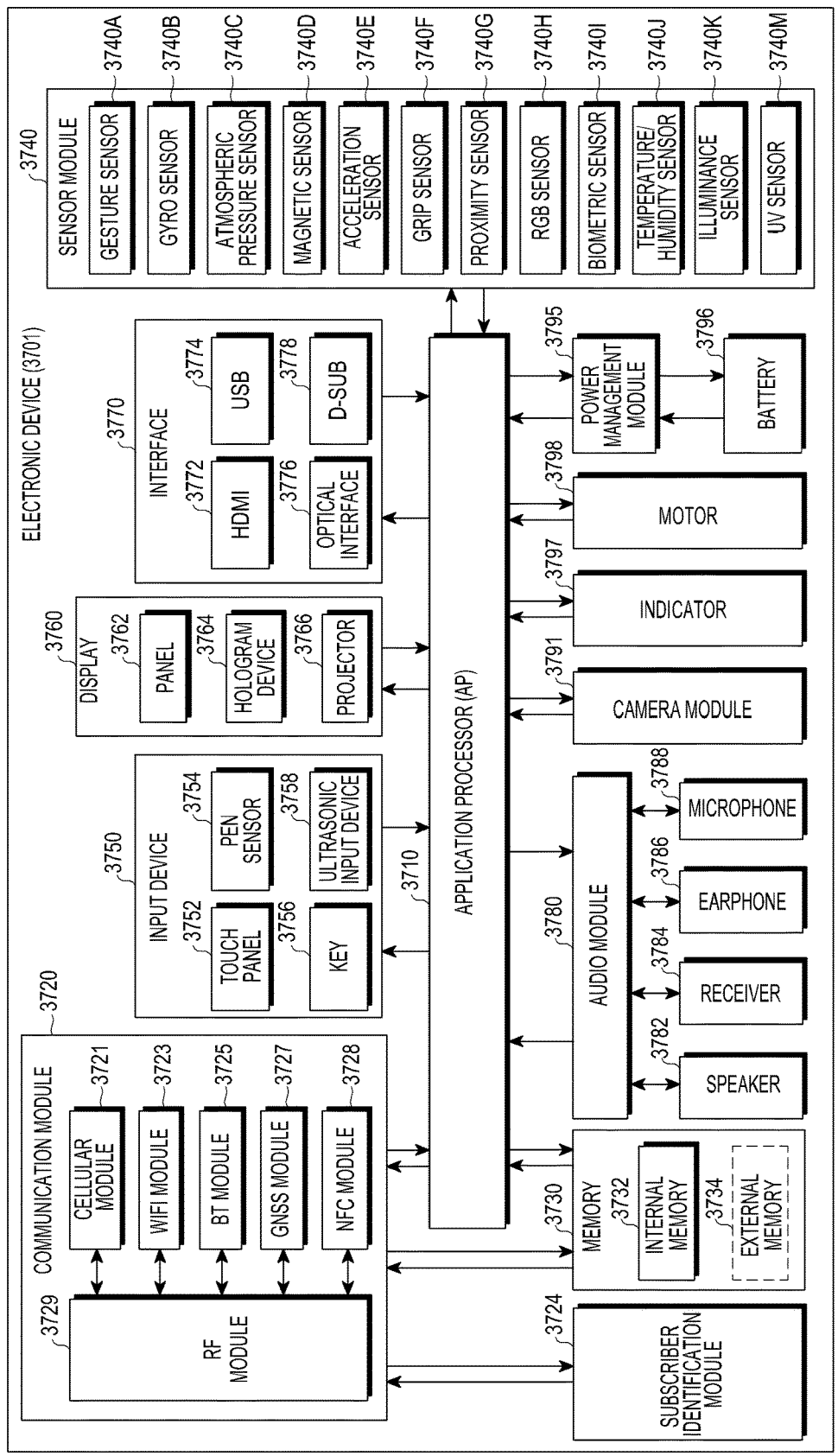
FIG. 39 is a block diagram illustrating an example structure of an electronic device according to various example embodiments of the present disclosure.

FIG. 39 is a block diagram of an electronic device 3701 according to various example embodiments of the present disclosure. The electronic device 3701 may include, for example, the entirety or a part of the electronic device 10 illustrated in FIG. 1. The electronic device 3701 may include at least one processor (e.g., Application Processor (AP)) 3710, a communication module (e.g., including communication circuitry) 3720, a subscriber identification module 3724, a memory 3730, a sensor module 3740, an input device (e.g., including input circuitry) 3750, a display 3760, an interface (e.g., including interface circuitry) 3770, an audio module 3780, a camera module 3791, a power management module 3795, a battery 3796, an indicator 3797, and a motor 3798.

The processor 3710 may, for example, control a plurality of hardware or software elements connected thereto and may perform various types of data processing and operations by driving an operating system or application programs. The processor 3710 may be embodied as, for example, various processing circuitry, a System on Chip (SoC), or the like. According to an example embodiment, the processor 3710 may further include a Graphic Processing Unit (GPU) and/or an image signal processor. The processor 3710 may include at least some (e.g., a cellular module 3721) of the elements illustrated in FIG. 39. The processor 3710 may load commands or data received from at least one (e.g., a non-volatile memory) of the other elements into a volatile memory, process the loaded instructions or data, and store various data in a non-volatile memory.

Figure 3:
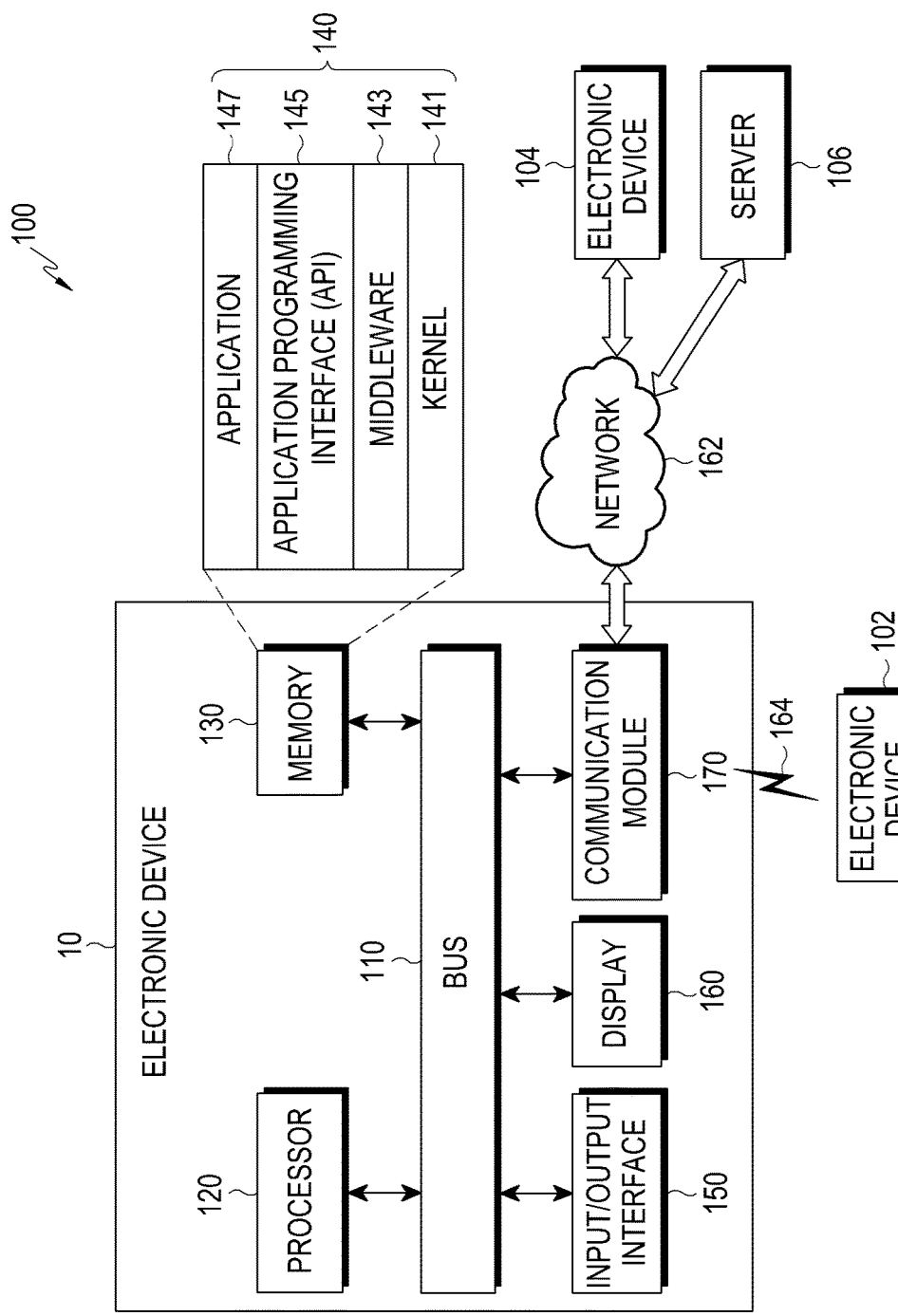
FIG. 3 is a block diagram illustrating an example network environment that includes the electronic device according to various example embodiments of the present disclosure.

The communication module 3720 may have a configuration that is the same as, or similar to, that of the communication module 170 of FIG. 3. The communication module 3720 may include various communication circuitry, such as, for example, and without limitation, a cellular module 3721, a WiFi module 3723, a Bluetooth module 3725, a GNSS module 3727 (e.g., a GPS module, a Glonass module, a Beidou module, or a Galileo module), an NFC module 3728, and a Radio Frequency (RF) module 3729.

The cellular module 3721 may provide, for example, a voice call, a video call, a text message service, an Internet service, etc. through a communication network. According to an example embodiment, the cellular module 3721 may identify and authenticate the electronic device 3701 within a communication network using the subscriber identification module 3724 (e.g., a SIM card). According to an embodiment, the cellular module 3721 may perform at least some of the functions that the processor 3710 may provide. According to an embodiment, the cellular module 3721 may include a Communication Processor (CP).

The WiFi module 3723, the Bluetooth module 3725, the GNSS module 3727, or the NFC module 3728 may include, for example, a processor for processing data transmitted and received through the corresponding module. According to some embodiments, at least some (two or more) of the cellular module 3721, the WiFi module 3723, the Bluetooth module 3725, the GNSS module 3727, and the NFC module 3728 may be included in one Integrated Chip (IC) or IC package.

The RF module 3729 may transmit and receive, for example, communication signals (e.g., RF signals). The RF module 3729 may include, for example, a transceiver, a Power Amplifier Module (PAM), a frequency filter, a Low Noise Amplifier (LNA), an antenna, etc. According to another embodiment, at least one of the cellular module 3721, the WiFi module 3723, the Bluetooth module 3725, the GNSS module 3727, and the NFC module 3728 may transmit and receive RF signals through a separate RF module.

The subscriber identification module 3724 may include, for example, a card that includes a subscriber identification module and/or an embedded SIM, and may contain unique identification information (e.g., an Integrated Circuit Card Identifier (ICCID)) or subscriber information (e.g., an International Mobile Subscriber Identity (IMSI)).

The memory 3730 (e.g., the memory 130) may include, for example, an internal memory 3732 or an external memory 3734. The internal memory 3732 may include, for example, at least one of a volatile memory (e.g., a Dynamic Random Access Memory (DRAM), a Static RAM (SRAM), a Synchronous Dynamic RAM (SDRAM), etc.) and a non-volatile memory (e.g., a One Time Programmable Read Only Memory (OTPROM), a Programmable ROM (PROM), an Erasable and Programmable ROM (EPROM), an Electrically Erasable and Programmable ROM (EEPROM), a mask ROM, a flash ROM, a flash memory (e.g., a NAND flash memory, a NOR flash memory, etc.), a hard disc drive, a Solid State Drive (SSD), etc.).

The external memory 3734 may further include a flash drive, which may be, for example, a Compact Flash (CF), a Secure Digital (SD), a Micro Secure Digital (Micro-SD), a Mini Secure Digital (Mini-SD), an eXtreme Digital (xD), a memory stick, etc. The external memory 3734 may be functionally and/or physically connected with the electronic device 3701 through various interfaces.

The sensor module 3740 may, for example, measure a physical quantity or detect the operating state of the electronic device 3701 and may convert the measured and detected information into an electrical signal. The sensor module 3740 may include, for example, at least one of a gesture sensor 3740A, a gyro sensor 3740B, an atmospheric pressure sensor 3740C, a magnetic sensor 3740D, an acceleration sensor 3740E, a grip sensor 3740F, a proximity sensor 3740G a color sensor 3740H (e.g., a Red, Green, and Blue (RGB) sensor), a biometric sensor 3740I, a temperature/humidity sensor 3740J, an illuminance sensor 3740K, and a ultraviolet (UV) sensor 3740M. Additionally or alternatively, the sensor module 3740 may include, for example, an E-nose sensor, an electromyography (EMG) sensor, an electroencephalogram (EEG) sensor, an electrocardiogram (ECG) sensor, an Infrared (IR) sensor, an iris sensor, and/or a fingerprint sensor. The sensor module 3740 may further include a control circuit for controlling one or more sensors included therein. In some embodiments, the electronic device 3701 may further include a processor configured to control the sensor module 3740 as a part of, or separately from, the processor 3710 to control the sensor module 3740 while the processor 3710 is in a sleep state.

The input device 3750 may include various input circuitry, such as, for example, and without limitation, a touch panel 3752, a (digital) pen sensor 3754, a key 3756, and an ultrasonic input device 3758. The touch panel 3752 may use, for example, at least one of a capacitive type, a resistive type, an infrared type, and an ultrasonic type. In another example embodiment, the touch panel 3752 may further include a control circuit. The touch panel 3752 may further include a tactile layer to provide a tactile reaction to a user.

The (digital) pen sensor 3754 may include, for example, a recognition sheet that is a part of, or separate from, the touch panel. The key 3756 may include, for example, a physical button, an optical key, or a keypad. The ultrasonic input device 3758 may detect ultrasonic waves, which are generated by an input unit, through a microphone (e.g., a microphone 3788) to identify data corresponding to the detected ultrasonic waves.

The display 3760 (e.g., the display 160) may include a panel 3762, a hologram device 3764 or a projector 3766. The panel 3762 may include a configuration that is the same as, or similar to, that of the display 160 of FIG. 1. The panel 3762 may be implemented to be, for example, flexible, transparent, or wearable. The panel 3762, together with the touch panel 3752, may be implemented as a single module. The hologram device 3764 may show a three-dimensional image in the air using interference of light. The projector 3766 may display an image by projecting light onto a screen. The screen may be located, for example, in the interior of, or on the exterior of, the electronic device 3701. According to an embodiment, the display 3760 may further include a control circuit for controlling the panel 3762, the hologram device 3764, or the projector 3766.

The interface 3770 may include various interface circuitry, such as, for example, and without limitation, a High-Definition Multimedia Interface (HDMI) 3772, a Universal Serial Bus (USB) 3774, an optical interface 3776, or a D-subminiature (D-sub) 3778. The interface 3770 may be included in, for example, the communication module 170 illustrated in FIG. 3. Additionally or alternatively, the interface 3770 may include, for example, a Mobile High-definition Link (MHL) interface, a Secure Digital (SD) card/Multi-Media Card (MMC) interface, or an Infrared Data Association (IrDA) standard interface.

The audio module 3780 may, for example, convert a sound into an electrical signal, and vice versa. At least some elements of the audio module 3780 may be included in, for example, the input/output interface 150 illustrated in FIG. 3. The audio module 3780 may process sound information that is input or output through, for example, a speaker 3782, a receiver 3784, earphones 3786, the microphone 3788, etc.

The camera module 3791 is, for example, a device that may photograph a still image and a moving image. According to an embodiment, the camera module 3791 may include one or more image sensors (e.g., a front sensor or a rear sensor), a lens, an Image Signal Processor (ISP), or a flash (e.g., an LED or xenon lamp).

The power management module 3795 may manage, for example, the power of the electronic device 3701. According to an embodiment, the power management module 3795 may include a Power Management Integrated Circuit (PMIC), a charger Integrated Circuit (IC), or a battery or fuel gauge. The PMIC may have a wired and/or wireless charging method. Examples of the wireless charging method may include a magnetic resonance method, a magnetic induction method, an electro-magnetic wave method, etc. Additional circuits (e.g., a coil loop, a resonance circuit, a rectifier, etc.) for wireless charging may be further included. The battery gauge may measure, for example, the residual quantity of the battery 3796 and a voltage, current, or temperature while charging. The battery 3796 may include, for example, a rechargeable battery and/or a solar battery.

The indicator 3797 may indicate a particular state (e.g., a booting state, a message state, a charging state, etc.) of the electronic device 3701 or a part thereof (e.g., the processor 3710). The motor 3798 may convert an electrical signal into a mechanical vibration and may generate a vibration, a haptic effect, etc. Although not illustrated, the electronic device 3701 may include a processing unit (e.g., a GPU) for supporting mobile TV. The processing unit for supporting mobile TV may process media data according to a standard, such as Digital Multimedia Broadcasting (DMB), Digital Video Broadcasting (DVB), MediaFlo™, etc.

Each of the above-described component elements of hardware according to the present disclosure may be configured with one or more components, and the names of the corresponding component elements may vary based on the type of electronic device. The electronic device according to various example embodiments of the present disclosure may include at least one of the aforementioned elements. Some elements may be omitted or other additional elements may be further included in the electronic device. Also, some of the hardware components according to various example embodiments may be combined into one entity, which may perform functions identical to or similar to those of the relevant components before the combination.

Figure 40:
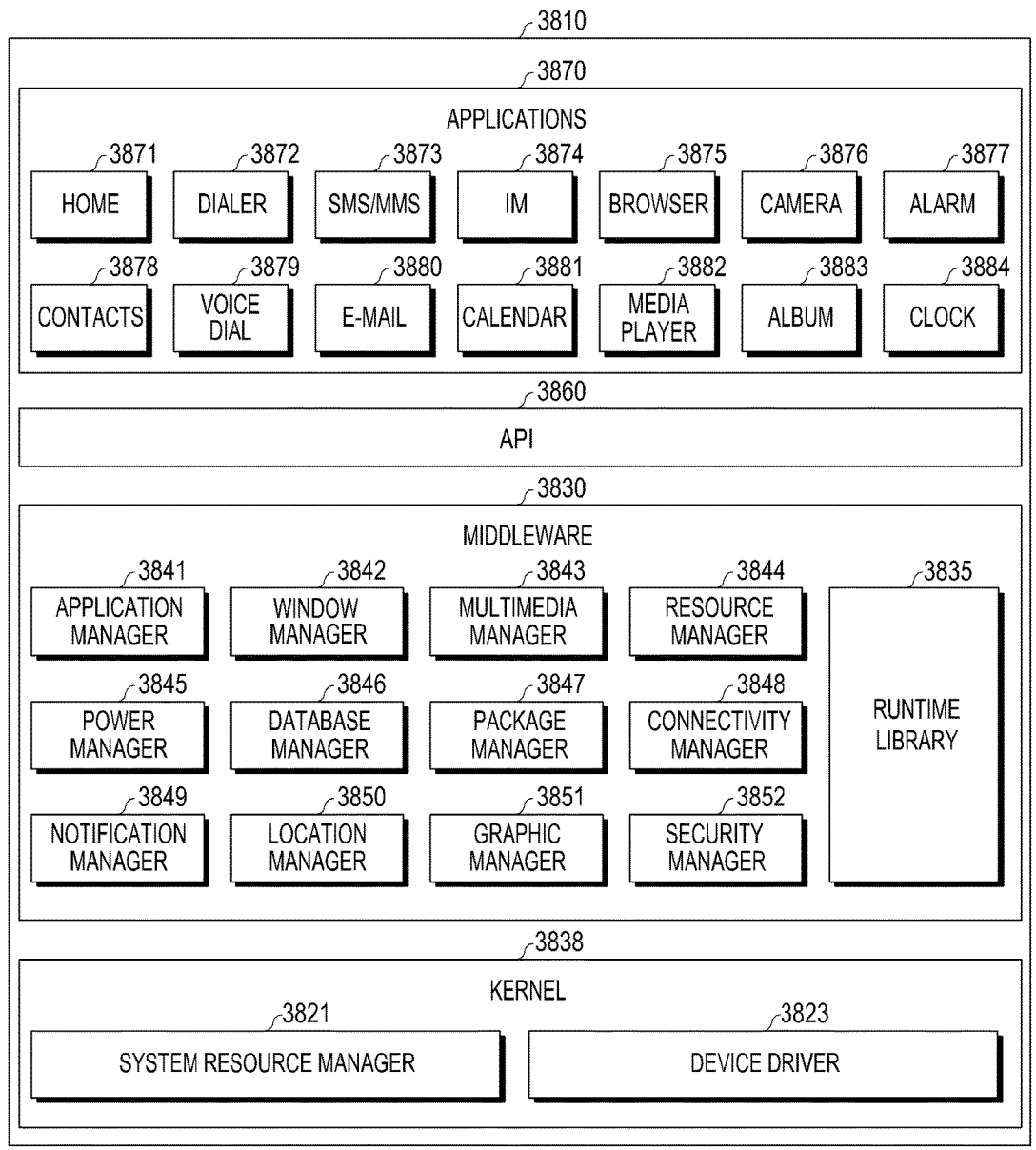
FIG. 40 is a block diagram illustrating an example program module according to various example embodiments of the present disclosure.

FIG. 40 is a block diagram of a program module according to various example embodiments of the present disclosure. According to an embodiment, the program module 3810 (e.g., the program 140) may include an Operating System (OS) that controls resources relating to an electronic device (e.g., the electronic device 10) and/or various applications (e.g., the application programs 147) that are executed in the operating system. The operating system may be, for example, Android, iOS, Windows, Symbian, Tizen, Bada, etc.

The program module 3810 may include a kernel 3820, middleware 3830, an Application Programming Interface (API) 3860, and/or applications 3870. At least a part of the program module 3810 may be preloaded on the electronic device, or may be downloaded from an external electronic device (e.g., the electronic device 102 or 104, the server 106, etc.).

The kernel 3820 (e.g., the kernel 141) may include, for example, a system resource manager 3821 and/or a device driver 3823. The system resource manager 3821 may control, assign, or retrieve system resources. According to an embodiment, the system resource manager 3821 may include a process management unit, a memory management unit, a file system management unit, etc. The device driver 3823 may include, for example, a display driver, a camera driver, a Bluetooth driver, a shared memory driver, a USB driver, a keypad driver, a WiFi driver, an audio driver, or an Inter-Process Communication (IPC) driver.

The middleware 3830 may provide a function required by the applications 3870 in common, or may provide various functions to the applications 3870 through the API 3860 to enable the applications 3870 to efficiently use limited system resources within the electronic device. According to an embodiment, the middleware 3830 (e.g., the middleware 143) may include, for example, at least one of a runtime library 3835, an application manager 3841, a window manager 3842, a multimedia manager 3843, a resource manager 3844, a power manager 3845, a database manager 3846, a package manager 3847, a connectivity manager 3848, a notification manager 3849, a location manager 3850, a graphic manager 3851, and a security manager 3852.

The runtime library 3835 may include, for example, a library module used by a compiler to add a new function through a programming language while the applications 3870 are being executed. The runtime library 3835 may perform functions relating to the management of input and output, the management of a memory, an arithmetic function, etc.

The application manager 3841 may manage, for example, a life cycle of at least one of the applications 3870. The window manager 3842 may manage Graphical User Interface (GUI) resources used on a screen. The multimedia manager 3843 may identify formats required for reproducing various media files and may encode or decode a media file using a codec suitable for the corresponding format. The resource manager 3844 may manage resources (such as a source code, a memory, a storage space, etc.) of at least one of the applications 3870.

The power manager 3845 may operate together with, for example, a Basic Input/Output System (BIOS) to manage a battery or power and may provide power information required for the operation of the electronic device. The database manager 3846 may generate, search, and/or change a database to be used by at least one of the applications 3870. The package manager 3847 may manage the installation or updating of an application that is distributed in the form of a package file.

The connectivity manager 3848 may manage a wireless connection, for example, Wi-Fi, Bluetooth, etc. The notification manager 3849 may display or notify of an event (such as an arrival message, an appointment, notification of proximity, etc.) in such a manner as not to disturb a user. The location manager 3850 may manage the location information of the electronic device. The graphic manager 3851 may manage a graphic effect to be provided to a user and a user interface relating to the graphic effect. The security manager 3852 may provide all security functions required for system security or user authentication. According to an embodiment, in a case where the electronic device (e.g., the electronic device 10) has a telephone function, the middleware 3830 may further include a telephony manager for managing a voice or video call function of the electronic device.

The middleware 3830 may include a middleware module that forms various combinations of the functions of the above-described elements. The middleware 3830 may provide specialized modules according to the types of operating systems in order to provide differentiated functions. In another embodiment, the middleware 3830 may dynamically remove some of the existing elements, or may add new elements.

The API 3860 (e.g., the API 145) is, for example, a set of API programming functions, and may be provided with different configurations according to operating systems. For example, in the case of Android or iOS, one API set may be provided for each platform, and in the case of Tizen, two or more API sets may be provided for each platform.

The applications 3870 (e.g., the application programs 147) may include one or more applications that may perform functions, for example, home 3871, dialer 3872, SMS/MMS 3873, Instant Message (IM) 3874, browser 3875, camera 3876, alarm 3877, contacts 3878, voice dial 3879, e-mail 3880, calendar 3881, media player 3882, album 3883, clock 3884, health care (e.g., measuring exercise quantity or blood sugar), and environment information (e.g., atmospheric pressure, humidity, temperature information, etc.).

According to an example embodiment, the applications 3870 may include an application (hereinafter, referred to as an "information exchange application" for the convenience of description) that supports information exchange between the electronic device (e.g., the electronic device 10) and an external electronic device (e.g., the electronic device 102 or 104). The information exchange application may include, for example, a notification relay application for forwarding specific information to an external electronic device or a device management application for managing an external electronic device.

For example, the notification relay application may include a function of transferring notification information generated from the other applications (e.g., the SMS/MMS application, the e-mail application, the health care application, the environmental information application, etc.) of the electronic device to an external electronic device (e.g., the electronic device 102 or 104). In another embodiment, the notification relay application may, for example, receive notification information from an external electronic device and may provide the received notification information to a user.

The device management application may manage (e.g., install, delete, or update), for example, at least one function of an external electronic device (e.g., the electronic device 102 or 104) that communicates with the electronic device (e.g., a function of turning on/off the external electronic device itself (or some components thereof) or a function of adjusting the brightness (or resolution) of a display), applications that operate in the external electronic device, or services (e.g., a call service, a message service, etc.) that are provided by the external electronic device.

According to an example embodiment, the applications 3870 may include applications (e.g., a health care application of a mobile medical appliance, etc.) that are specified according to attributes of an external electronic device (e.g., the electronic device 102 or 104). According to an embodiment, the applications 3870 may include applications received from an external electronic device (e.g., the server 106, or the electronic device 102 or 104). According to an embodiment, the applications 3870 may include a preloaded application or a third party application that may be downloaded from a server. The names of the elements of the program module 3810, according to the illustrated embodiment, may vary depending on the types of operating systems.

According to various example embodiments, at least a part of the program module 3810 may be implemented in software, firmware, hardware, or a combination of two or more thereof. At least a part of the program module 3810 may be implemented (e.g., executed) by, for example, a processor (e.g., the processor 120). At least a part of the program module 3810 may include, for example, a module, a program, a routine, a set of instructions, a process, etc. for performing one or more functions.

The term "module" as used herein may, for example, refer to a unit including one of hardware (e.g., circuitry), software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of processing circuitry, an Application-Specific Integrated Circuit (ASIC) chip, a Field-Programmable Gate Arrays (FPGA), and a programmable-logic device for performing operations which has been known or are to be developed hereinafter.

According to various example embodiments, at least some of the devices (for example, modules or functions thereof) or the method (for example, operations) according to the present disclosure may be implemented by a command stored in a computer-readable storage medium in a programming module form. The instruction, when executed by a processor (e.g., the processor 120), may cause the one or more processors to execute the function corresponding to the instruction. The computer-readable storage medium may be, for example, the memory 130.

The computer readable recoding medium may include a hard disk, a floppy disk, magnetic media (e.g., a magnetic tape), optical media (e.g., a Compact Disc Read Only Memory (CD-ROM) and a Digital Versatile Disc (DVD)), magneto-optical media (e.g., a floptical disk), a hardware device (e.g., a Read Only Memory (ROM), a Random Access Memory (RAM), a flash memory), and the like. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

The programming module according to the present disclosure may include one or more of the aforementioned components or may further include other additional components, or some of the aforementioned components may be omitted. Operations executed by a module, a programming module, or other component elements according to various embodiments of the present disclosure may be executed sequentially, in parallel, repeatedly, or in a heuristic manner. Furthermore, some operations may be executed in a different order or may be omitted, or other operations may be added.

While the present disclosure has been illustrated and described with reference to certain embodiments thereof, it will be understood by those skilled in the art that various changes in form and details may be made therein without departing from the spirit and scope of the present disclosure as defined by the appended claims.

What is claimed is:

1. An electronic device comprising:
   a housing comprising a first surface directed in a first direction and a second surface directed in a second direction opposite the first direction;

a printed circuit board included in the housing and comprising a first surface directed in the first direction and a second surface directed in the second direction;

at least one electronic component disposed on the first surface of the printed circuit board; and at least one shield structure configured to electro-magnetically shield the at least one electronic component, wherein the shield structure comprises:

a flexible sheet comprising a first sheet that covers the at least one electronic component and a second sheet that at least partially covers the space between the first sheet and the first surface of the printed circuit board;

at least one frame structure, comprising a first frame disposed on the first surface of the printed circuit board and a second frame disposed on the second surface of the printed circuit board, that supports the first and second sheets, wherein the flexible sheet covers the first frame and the second frame;

wherein the first frame and the second frame comprises at least one first opening that is formed in at least a part of a first surface of the first frame and the second frame, the first surface being directed in the first direction, and the first frame and the second frame comprises at least one second opening that is formed in at least a part of a side surface of the first frame and the second frame, wherein the first sheet is disposed to cover the at least one first opening, and wherein the second sheet is substantially perpendicular to the first sheet and disposed to cover the at least one second opening.

2. The electronic device of claim 1, wherein the second sheet extends from an edge of the first sheet.

3. The electronic device of claim 1, wherein the at least one frame structure comprises:

a first surface that surrounds at least a part of the electronic component, the first surface being directed in the first direction; and a side surface that at least partially surrounds the space between the first surface of the at least one frame structure and the first surface of the printed circuit board, wherein the first sheet is disposed on the first surface of the at least one frame structure, and the second sheet is disposed on at least a part of the side surface of the at least one frame structure.

4. The electronic device of claim 1, wherein the at least one frame structure comprises a fixing structure configured to fix at least a part of the flexible sheet to at least a part of the frame structure.

5. The electronic device of claim 1, wherein the flexible sheet comprises at least one neutral plane adjustment region configured to facilitate bending of at least a part of the flexible sheet.

6. The electronic device of claim 1, wherein the flexible sheet comprises:

an adhesive layer that makes contact with at least a part of the at least one frame structure;

an insulation layer at least partially spaced apart from the adhesive layer; and at least one metal layer disposed between the adhesive layer and the insulation layer.

7. The electronic device of claim 6, wherein the flexible sheet has a thickness in a range of 0.01 mm to 0.09 mm, and wherein the adhesive layer has a thickness in a range of 0.010 mm to 0.030 mm, the metal layer has a thickness in a range of 0.005 mm to 0.025 mm, and the insulation layer has a thickness in a range of 0.005 mm to 0.020 mm.

8. The electronic device of claim 1, wherein the electronic device further comprises at least one other electronic component disposed on the second surface of the printed circuit board, the flexible sheet further comprises a third sheet that covers the at least one other electronic component and a fourth sheet that at least partially covers the space between the third sheet and the second surface of the printed circuit board, when viewed from above the second surface of the printed circuit board, and the second frame supports the third and fourth sheets.

9. The electronic device of claim 8, wherein the fourth sheet extends from the second sheet, and wherein the fourth sheet extends from the third sheet.

10. The electronic device of claim 1, wherein the electronic device further comprises a support structure disposed between at least a part of the housing and at least a part of the shield structure, wherein the support structure has resilience, and wherein the support structure includes a folded surface that is folded two or more times, the support structure contacting the housing.

11. An electronic device comprising:

a housing comprising a first surface directed in a first direction and a second surface directed in a second direction opposite the first direction;

a printed circuit board included in the housing and comprising a first surface directed in the first direction, a second surface directed in the second direction, and a side surface that is substantially perpendicular to the first or second surface;

at least one electronic component disposed on the first surface of the printed circuit board; and at least one shield structure configured to electro-magnetically shield the at least one electronic component, wherein the shield structure comprises:

a first frame structure that surrounds at least a part of the electronic component disposed on the first surface of the printed circuit board, the first frame structure comprising a first surface directed in the first direction and a side surface that at least partially surrounds the space between the first surface of the first frame structure and the first surface of the printed circuit board;

a second frame structure provided on the second surface of the printed circuit board;

a flexible sheet that covers the first surface and side surface of the first frame structure and the side surface of the printed circuit board, wherein the flexible sheet covers the first frame structure and the second frame structure;

wherein the first frame and the second frame comprises at least one first opening that is formed in at least a part of a first surface of the first frame and the second frame, the first surface being directed in the first direction, and the first frame and the second frame comprises at least one second opening that is formed in at least a part of a side surface of the first frame and the second frame, wherein a first sheet of the flexible sheet is disposed to cover the at least one first opening, and wherein a second sheet of the flexible sheet is substantially perpendicular to the first sheet and disposed to cover the at least one second opening.

12. The electronic device of claim 11, wherein the flexible sheet comprises a conductive film.

13. The electronic device of claim 11, wherein the electronic device further comprises:
- at least one other electronic component disposed on the second surface of the printed circuit board; and
- the second frame structure surrounds at least a part of the other electronic component disposed on the second surface of the printed circuit board, the second frame structure comprising a first surface directed in the second direction and a side surface that at least partially surrounds the space between the first surface of the second frame structure and the second surface of the printed circuit board, and
- the flexible sheet comprises:
- a first sheet that covers an opening formed in the first surface of the first frame structure;
- a second sheet that extends from an edge of the first sheet and covers the side surface of the first frame structure, the side surface of the printed circuit board, and the side surface of the second frame structure; and
- a third sheet that extends from an edge of the second sheet and covers an opening formed in the first surface of the second frame structure.

14. The electronic device of claim 13, wherein a first bending portion configured to facilitate bending is formed between the first and second sheets, and a second bending portion configured to facilitate bending is formed between the second and third sheets.

15. The electronic device of claim 14, wherein at least one of the first and second bending portions comprises a plurality of wrinkles.

16. The electronic device of claim 14, wherein the first and second sheets comprise a first number of layers, and the first and second bending portions comprise a second number of layers, wherein the first number of layers is greater than the second number of layers.

17. The electronic device of claim 11, wherein the printed circuit board comprises at least one ground plane, and the electronic component and the first and second frame structures are electrically connected with the ground plane.

18. The electronic device of claim 11, further comprising:
- a structure connected to the side surface of the first frame structure and configured to bring the second sheet close to the first frame structure.

19. The electronic device of claim 11, wherein the first frame structure comprises an opening into which a part of the flexible sheet is fixedly inserted.

* * * * *